United States Patent
Shino

(10) Patent No.: US 7,075,151 B2
(45) Date of Patent: Jul. 11, 2006

(54) SEMICONDUCTOR MEMORY DEVICE FOR STORING DATA AS STATE OF MAJORITY CARRIERS ACCUMULATED IN CHANNEL BODY AND METHOD OF MANUFACTURING THE SAME

(75) Inventor: Tomoaki Shino, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 127 days.

(21) Appl. No.: 10/814,345

(22) Filed: Apr. 1, 2004

(65) Prior Publication Data

US 2005/0121710 A1 Jun. 9, 2005

(30) Foreign Application Priority Data

Dec. 9, 2003 (JP) ............................. 2003-410937

(51) Int. Cl.
*H01L 27/01* (2006.01)
(52) U.S. Cl. ...................... 257/347; 257/507; 257/510; 438/221
(58) Field of Classification Search ................ 257/296, 257/506, 510, 390, 347, 348, 349, 507; 438/151, 438/219, 221
See application file for complete search history.

(56) References Cited

U.S. PATENT DOCUMENTS 6,965,147 B1 * 11/2005 Shino ........................ 257/347

2004/0227248 A1 11/2004 Fukuzumi et al.

OTHER PUBLICATIONS

T. Ohsawa, et al., International Solid-State Circuits Conference, Digest of Technical Papers, p. 153, "Memory Design Using One-Transistor Gain Cell on SOI", 2002.

* cited by examiner

*Primary Examiner*—Sara Crane
(74) *Attorney, Agent, or Firm*—Oblon, Spivak, McClelland, Maier & Neustadt, P.C.

(57) ABSTRACT

A semiconductor memory device comprises a substrate; a first semiconductor layer of a first conduction type having a single crystalline structure isolated from the substrate by an insulator layer; a plurality of memory transistors, each having a gate electrode connected to a word line, a pair of impurity regions of a second conduction type serving as a drain region and a source region formed in the first semiconductor layer, and a channel body of the first conduction type formed in the first semiconductor layer between the impurity regions, and operative to store data as a state of majority carriers accumulated in the channel body; a plurality of device isolation regions formed to isolate memory transistors having gate electrodes commonly connected to the same word line from each other among the plurality of memory transistors; and a plurality of impurity region isolation regions formed to isolate adjacent drain regions from each other and adjacent source regions from each other, the impurity region isolation region having a smaller width than that of the device isolation region.

20 Claims, 62 Drawing Sheets

SEMICONDUCTOR MEMORY DEVICE FOR STORING DATA AS STATE OF MAJORITY CARRIERS ACCUMULATED IN CHANNEL BODY AND METHOD OF MANUFACTURING THE SAME

CROSS-REFERENCE TO RELATED APPLICATION

This application is based upon and claims the benefit of priority from the prior Japanese Patent Application No. 2003-410937, filed on Dec. 9, 2003; the entire contents of which are incorporated herein by reference.

BACKGROUND OF THE INVENTION

1. Field of the Invention

The present invention relates to a semiconductor memory device, for example, a semiconductor memory device for storing data as a state of majority carriers accumulated in a channel body of a transistor formed in a substrate such as an SOI substrate, and method of manufacturing the same.

2. Description of the Related Art

A semiconductor memory device that can achieve dynamic storage in a simpler cell structure has been proposed recently for the purpose of replacing conventional DRAM (JP 2002/343886A. FIGS. 1–4). A memory cell includes a transistor having a floating body (channel body) formed in an SOI substrate. The memory cell can achieve binary storage as a first data state (for example, data "1") in which a certain amount of majority carriers are accumulated in the body and a second data state (for example, data "0") in which a certain amount of majority carriers are released from the body.

Such the memory cell is called a "FBC (floating body cell)" and the semiconductor memory device using the FBC is called a "FBC memory". The FBC memory is not provided with a capacitor that is employed in a normal DRAM. Therefore, it has a simple cell array structure and a small unit cell area, and accordingly it can be highly integrated easily.

Similar to other conventional semiconductor memory devices such as DRAM, the FBC is also desired for: (1) preventing occurrences of data destruction; (2) down-sizing; (3) reducing parasitic resistances and variations thereof; and (4) elongating a data holding time.

SUMMARY OF THE INVENTION

A device aspect of the present invention is directed to a semiconductor memory device, comprising: a substrate; a first semiconductor layer of a first conduction type having a single crystalline structure isolated from the substrate by an insulator layer: a plurality of memory transistors, each having a gate electrode connected to a word line, a pair of impurity regions of a second conduction type serving as a drain region and a source region formed in the first semiconductor layer, and a channel body of the first conduction type formed in the first semiconductor layer between the impurity regions, said memory transistors being operative to store data as a state of majority carriers accumulated in the channel body; a plurality of device isolation regions formed to isolate memory transistors having gate electrodes commonly connected to the same word line from each other among the plurality of memory transistors; and a plurality of impurity region isolation regions formed to isolate adjacent drain regions from each other and adjacent source regions from each other, the impurity region isolation region having a smaller width than that of the device isolation region.

Another device aspect of the present invention is directed to a semiconductor memory device, comprising: a substrate; a first semiconductor layer of a first conduction type having a single crystalline structure isolated from the substrate by an insulator layer; a plurality of memory transistors, each having a gate electrode connected to a word line, a pair of impurity regions of a second conduction type serving as a drain region and a source region formed in the first semiconductor layer, and a channel body of the first conduction type formed In the first semiconductor layer between the impurity regions, said memory transistors being operative to store data as a state of majority carriers accumulated in the channel body; a plurality of sidewalls each formed on a side of the gate electrode; and a second semiconductor layer of the second conduction type formed in contact with and extended on the impurity region to the location of the sidewall.

A method aspect of the present invention is directed to a method of manufacturing a semiconductor memory device including a plurality of memory transistors each for storing data as a state of majority carriers accumulated in a channel body sandwiched between a drain region and a source region the method comprising: forming a plurality of device isolation regions separately from each other in a first semiconductor layer of a first conduction type having a single crystalline structure isolated from a substrate by an insulator layer, the first semiconductor layer including the drain region, the source region and the channel body formed therein; forming a gate insulator film in a region on the first semiconductor layer defined by the plurality of device isolation regions; forming a plurality of word lines containing gate electrodes separately from each other on the gate insulator film as crossing the plurality of device isolation regions to arrange the plurality of memory transistors in matrix; forming sidewalls on sides of the gate electrodes such that a distance between sidewalls located between the gate electrodes has a dimension smaller than a width of the device isolation region; forming trenches each having a smaller width than the width of the device isolation region in the first semiconductor layer by self-alignment using the sidewall as a mask to selectively remove the first semiconductor layer such that one and other region to be adjacent drain regions are isolated each other, and that one and the other region of adjacent source regions are isolated each other; and forming bit lines connected to the drain regions formed in the first semiconductor layer and source lines connected to the source regions.

Another method aspect of the present invention is directed to a method of manufacturing a semiconductor memory device including a plurality of memory transistors each for storing data as a state of majority carriers accumulated in a channel body sandwiched between a drain region and a source region, the method comprising: forming a plurality of device isolation regions separately from each other in a first semiconductor layer of a first conduction type having a single crystalline structure isolated from a substrate by an insulator layer, the first semiconductor layer including the drain region, the source region and the channel body formed therein; forming a gate insulator film in a region on the first semiconductor layer defined by the plurality of device isolation regions; forming a plurality of word lines containing gate electrodes separately from each other on the gate insulator film as crossing the plurality of device isolation regions to arrange the plurality of memory transistors in matrix; forming sidewalls on sides of the gate electrodes;

forming a second semiconductor layer on the first semiconductor layer between the gate electrodes by selective epitaxial growth after formation of the sidewalls; and forming bit lines connected via the second semiconductor layer to the drain regions formed in the first semiconductor layer and source lines connected via the second semiconductor layer to the source regions formed in the first semiconductor layer.

DETAILED DESCRIPTION OF THE EMBODIMENTS

Figure 1:
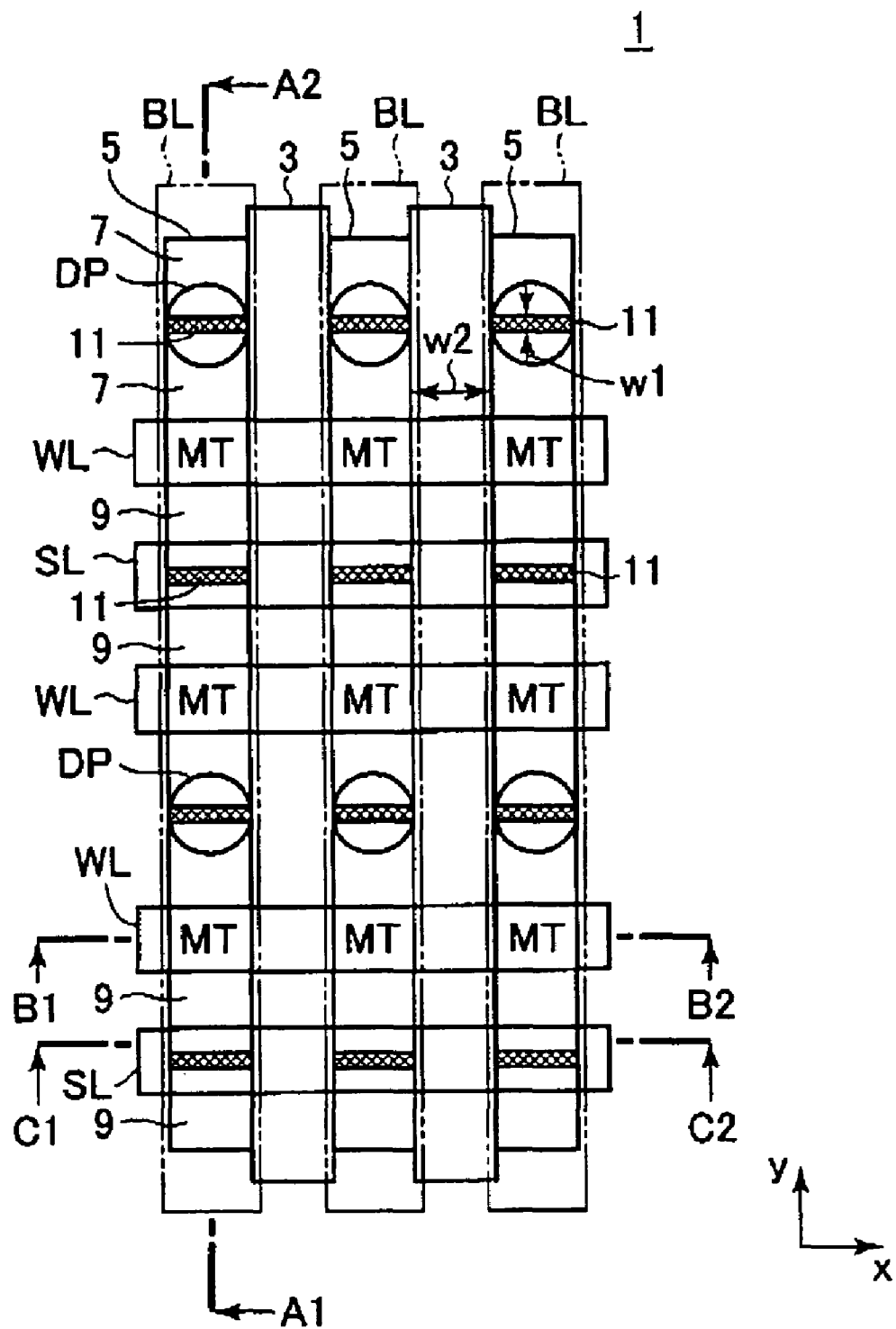
FIG. 1 is a plan view of part of a cell array in a semiconductor memory device according to a first embodiment.

The embodiments of the present invention will be described in accordance with the items as classified below. A memory transistor serving as a memory cell means the FBC.

First Embodiment
   Structure of Semiconductor Memory Device
   Operation of Semiconductor Memory Device
   Main Effects of First Embodiment
   Method of Manufacturing Semiconductor Memory Device Second Embodiment
   Structure of Semiconductor Memory Device
   Method of Manufacturing Semiconductor Memory Device Third Embodiment Fourth Embodiment
   Structure of Semiconductor Memory Device
   Method of Manufacturing Semiconductor Memory Device Fifth Embodiment
   Structure of Semiconductor Memory Device
   Method of Manufacturing Semiconductor Memory Device In the figures for showing the embodiments, the same parts as those once explained are given the same reference numerals to omit further explanations.

First Embodiment

The first embodiment has a main characteristic in comprising a plurality of impurity region isolation regions formed to isolate adjacent drain regions from each other and adjacent source regions from each other. The impurity region isolation region is designed to have a smaller width than that of a device isolation region.

Structure of Semiconductor Memory Device

FIG. 1 is a plan view of part of a cell array 1 in a semiconductor memory device according to the first embodiment. The cell array 1 has a structure including a plurality of memory transistors MT arranged in matrix. The memory transistor MT stores data as a state of majority carriers accumulated in a floating channel body. A plane structure of the cell array 1 is described in detail below.

The cell array 1 includes a plurality of device isolation regions 3 extending in the y-direction, which are arranged separately from each other. A region between the device isolation regions 3 is a device formation region 5. The device formation region 5 includes a pair of impurity regions serving as a drain region 7 and a source region 9 formed therein.

The cell array 1 includes a plurality of word lines WL, extending in the x-direction as crossing the device isolation regions 3, which are arranged separately from each other. A memory transistor MT is located at an intersection of the word line WL and the device formation region 5. Each memory transistor MT has a gate electrode connected to the corresponding word line WL. The memory transistors MT having gate electrodes commonly connected to the same word line WL are isolated from each other by the device isolation regions 3.

Drain plugs DP, and source lines SL extending in the x-direction are alternately arranged between the word lines WL. The drain plug DP is a conductive plug commonly connected to adjacent drain regions 7 and is connected to a bit line BL extending in the y-direction. The source line SL is commonly connected to adjacent source regions 9.

In the device formation region 5 beneath the drain plug DP, an impurity region isolation region 11 is formed to isolate adjacent drain regions 7 from each other. Similarly, in the device formation region 5 beneath the source line SL, an impurity region isolation region 11 is also formed to isolate adjacent source regions 9 from each other. The isolation region 11 has a width, w1, smaller than a width, w2, of the device isolation region 3 (the dimension along the word line WL). This is one of characteristics in the first embodiment.

Figure 2A:
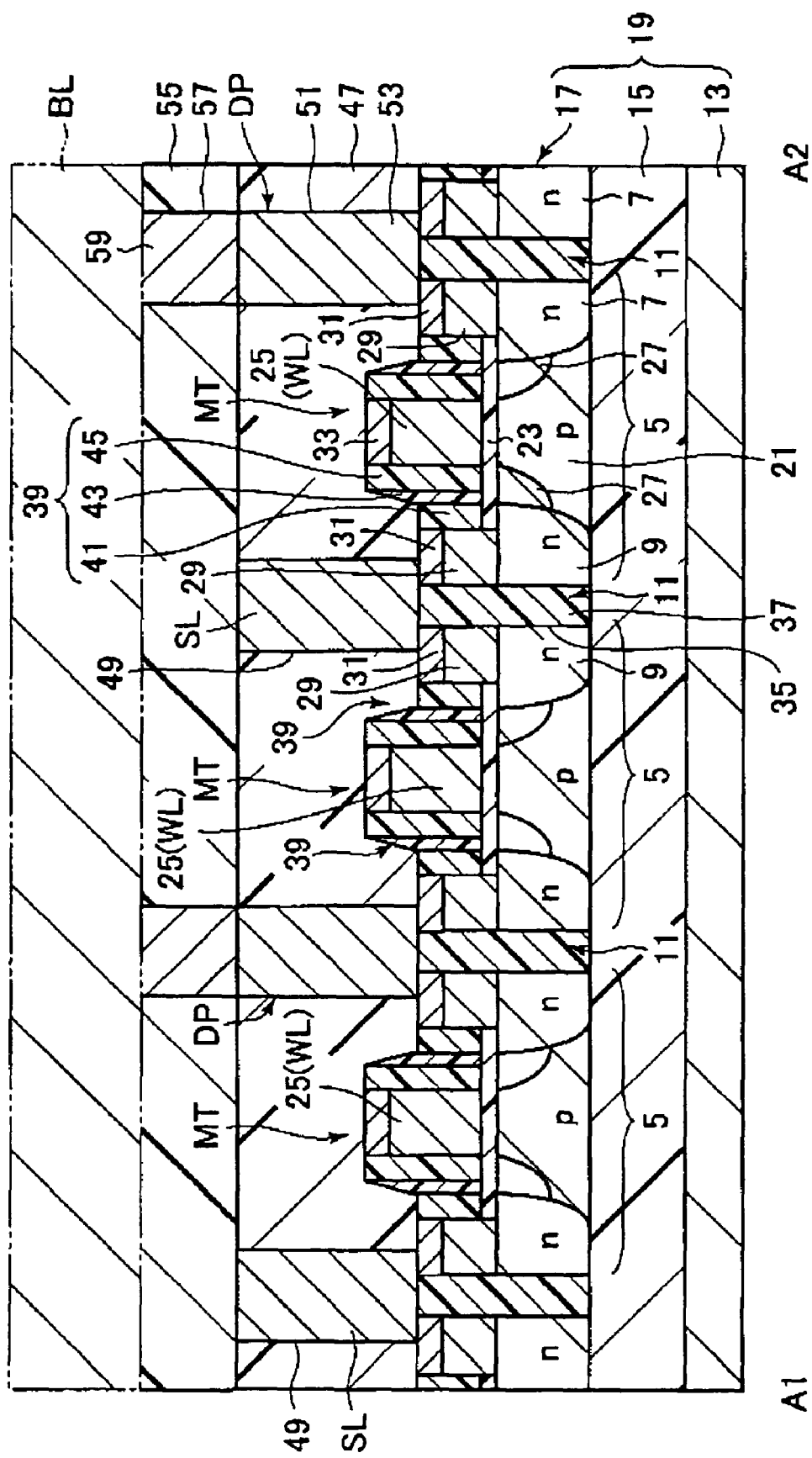
FIG. 2A is a cross-sectional view taken along A1–A2 line in FIG. 1.
Figure 2B:
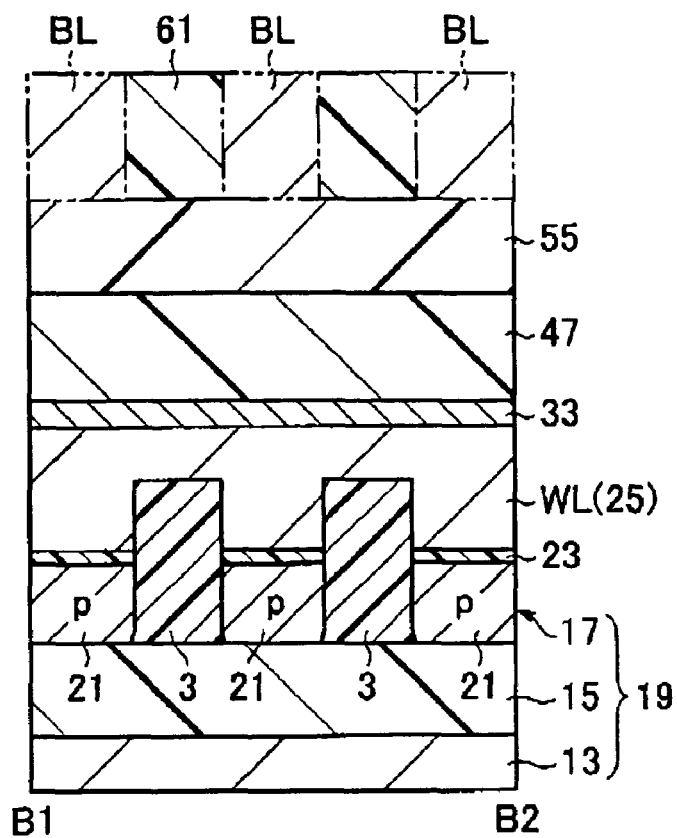
FIG. 2B is a cross-sectional view taken along B1–B2 line in FIG. 1.
Figure 2C:
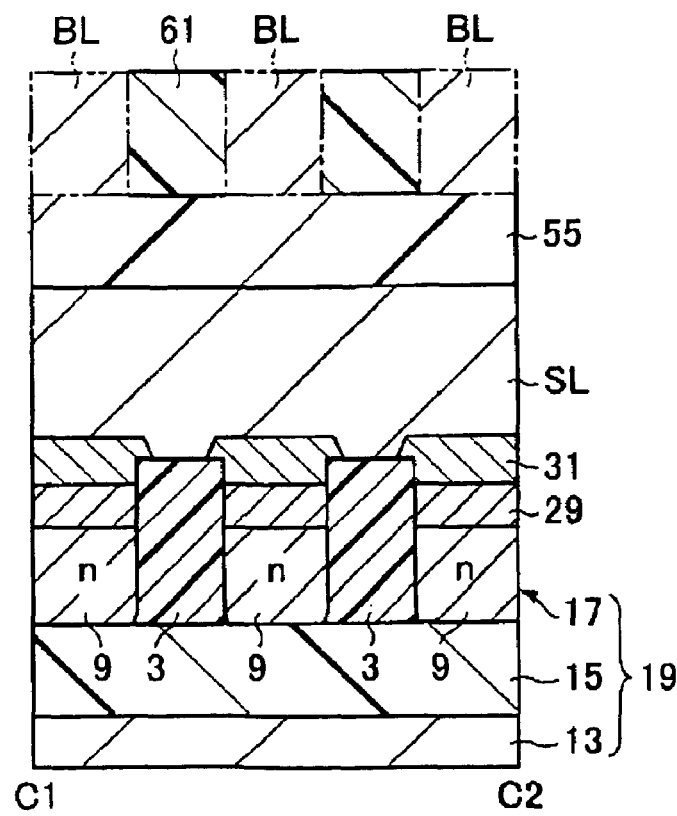
FIG. 2C is a cross-sectional view taken along C1–C2 line in FIG. 1.

A cross-sectional structure of the cell array according to the first embodiment is described next with reference to FIGS. 2A, 2B and 2C. FIG. 2A is a cross-sectional view taken along A1–A2 line in FIG. 1; FIG. 2B is a cross-sectional view taken along B1–B2 line; and FIG. 2C is a cross-sectional view taken along C1–C2 line.

The memory transistor MT is an NMOS transistor that has a floating body. The transistor MT is formed on an SOI substrate 19. It includes a silicon substrate 13 (an example of the substrate), a silicon oxide layer 15 (an example of the insulator layer), and a p-type single-crystalline silicon layer 17 (an example of the first semiconductor layer) In a stacked structure. The silicon layer 17 is isolated from the silicon substrate 13 via the silicon oxide layer 15. The silicon layer 17, defined by the device isolation region 3 and the impurity region isolation region 11, provides the device formation region 5. The device isolation region 3 has a larger height than that of the silicon layer 17 (an example of the first semiconductor layer).

The memory transistor MT has a p-type channel body 21 formed in the device formation region 5 (the silicon layer 17); a gate electrode 25 formed on the channel body 21 via a gate insulator film 23 and connected to a word line WL; and n-type regions of drain 7 and source 9 formed in the device formation region 5 (the silicon layer 17) sandwiching the channel body 21 therebetween.

The channel body 21 formed in the silicon layer 17 between the drain region 7 and the source region 9 is a floating body. The memory transistor MT stores data as a state of majority carriers accumulated in the channel body 21. In a more detailed discussion, the channel body 21 holds a certain amount of majority carriers in a first data state and holds less majority carriers in a second data state than the first data state to store data as either of both states.

The drain region 7 and the source region 9 have LDD (Lightly Doped Drain) structures. Accordingly, these regions 7 and 9 have tips formed as n-type low-concentration regions 27. An n-type selective epitaxial layer 29 (an example of the second semiconductor layer) is formed on and in contact with the drain region 7 and the source region 9. A suicide 31 is formed on the layer 29. The silicide 31 has an end extending onto the device isolation region 3. The selective epitaxial layer 29 is located at a lower height than the device isolation region 3 in FIG. 2C. In an alternative structure, the selective epitaxial layer 29 may have a higher height than the device isolation region 3, and the end of the selective epitaxial layer 29 may extend onto the device isolation region 3.

The impurity region isolation region 11 isolates adjacent drain regions 7 from each other and adjacent source regions 9 from each other. The isolation region 11 further extends upward to isolate portions of the selective epitaxial layer 29 from each other and portions of the silicide 31 from each other on the adjacent drain regions 7 (source regions 9). The impurity region isolation region 11 has a structure that includes a trench 35 reaching the silicon oxide film 15 and filled with an insulator film 37.

Specifically, the gate insulator film 23 is a gate oxide film. The gate electrode 25 is composed of a material of polysilicon. A silicide 33 is formed on the top of the gate electrode 25. A sidewall 39 is formed on each side of the gate electrode 25. The selective epitaxial layer 29 extends to the location of the sidewall 39. The sidewall 39 has a structure that includes films of silicon nitride 41, silicon oxide 43 and silicon nitride 45 sandwiched between the selective epitaxial layer 29 (an example of the second semiconductor layer) and the gate electrode 25.

An interlayer insulator film 47 is formed over the silicide layers 31 and 33 to cover the memory transistor MT. A trench 49 is formed in the Interlayer insulator film 47 on the source region 9 along the extending direction of the word line WL. The source line SL is buried in the trench 49. The source line SL is connected to both adjacent source regions 9 via the silicide 31 and the selective epitaxial layer 29.

A through-hole 51 is formed in the interlayer insulator film 47 on the drain region 7. The lower portion 53 of the drain plug DP is buried in the through-hole 51. The lower portion 53 is connected to the silicide layer 31 in the source region 7.

The interlayer insulator film 47 is covered in an interlayer insulator film 55. A through-hole 57 is formed in the interlayer insulator film 55 and is filled with the upper portion 59 of the drain plug DP, which is connected to the lower portion 53 of the drain plug DP. The drain plug DP consists of the lower portion 53 and the upper portion 59. The drain plug DP spans and commonly connects to adjacent drain regions 7 via the silicide 31 and the selective epitaxial layer 29. An interlayer insulator film 61 is formed on the interlayer insulator film 55. The bit line BL is buried in the interlayer insulator film 61 and connected to the drain plug DP.

Figure 2D:
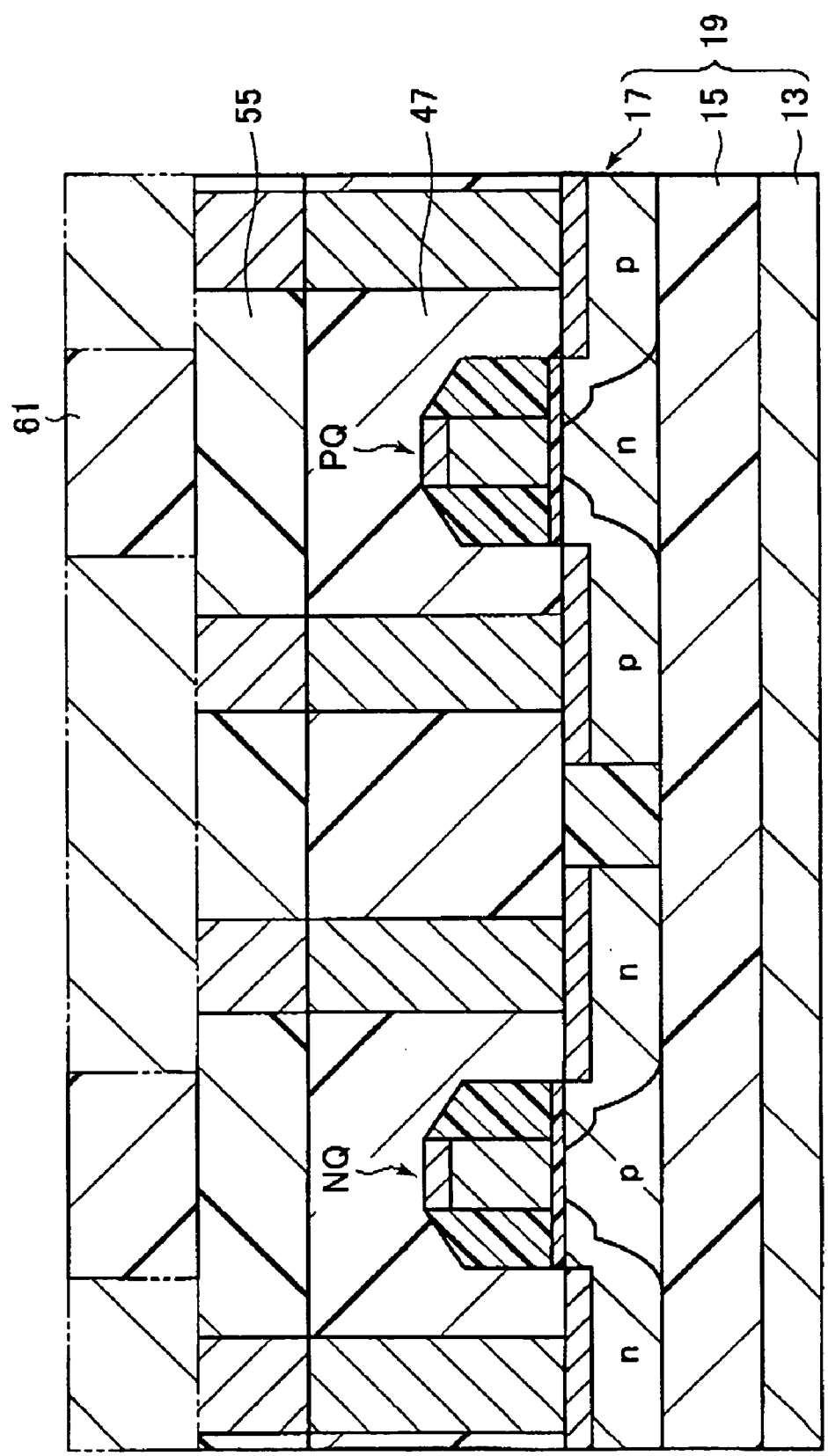
FIG. 2D is a cross-sectional view of transistors serving as elements for configuring a logic circuit to be integrated in combination with the semiconductor memory device according to the first embodiment.

A logic circuit may also be integrated on the SOI substrate 19 in combination. FIG. 2D is a cross-sectional view of a PMOS transistor PQ and an NMOS transistor NQ serving as elements for configuring the logic circuit. These logic transistors are formed in the silicon layer 17 (an example of the first semiconductor layer).

Operation of Semiconductor Memory Device

Figure 3:
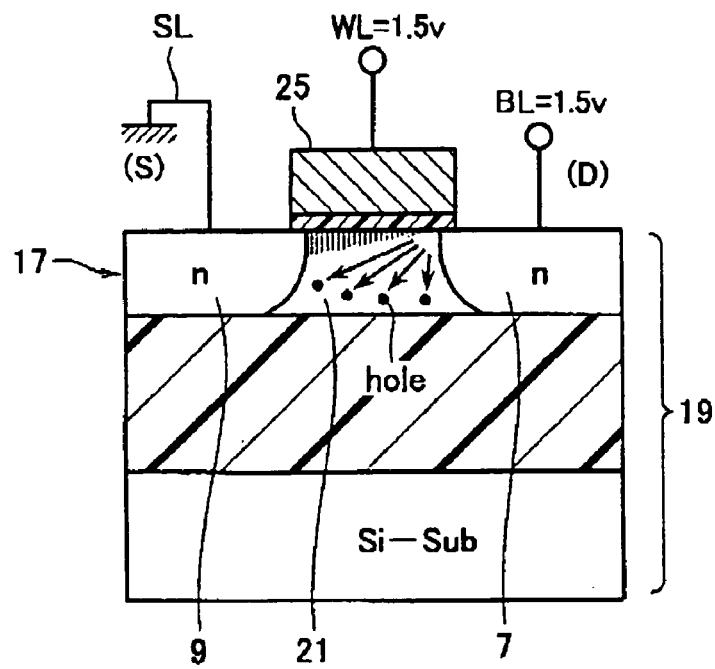
FIG. 3 is an illustrative view showing "1" write operation of a memory transistor according to the first embodiment.

Operation of the semiconductor memory device is described with reference to FIGS. 3–5, which are schematic cross-sectional views of the memory translator MT. FIG. 3 shows data "1" write operation, FIG. 4 shows data "0" write operation, and FIG. 5 shows data read operation.

As shown in FIG. 3, on write of data "1" into the memory transistor MT, a certain bias condition is given to allow a large channel current flowing in the memory transistor MT. For example, 1.5 V is applied to the word line WL and 1.5 V to the bit line BL. As a result, majority carriers (holes in the shown example) are generated due to impact ionization in the vicinity of the drain region 7 and accumulated in the channel body 21.

Figure 4:
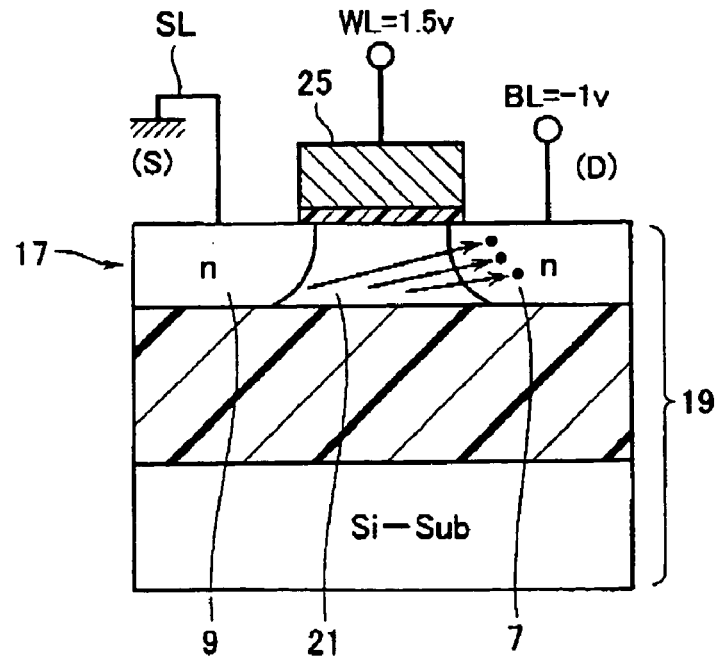
FIG. 4 is an illustrative view showing "0" write operation of the memory transistor.
Figure 5:
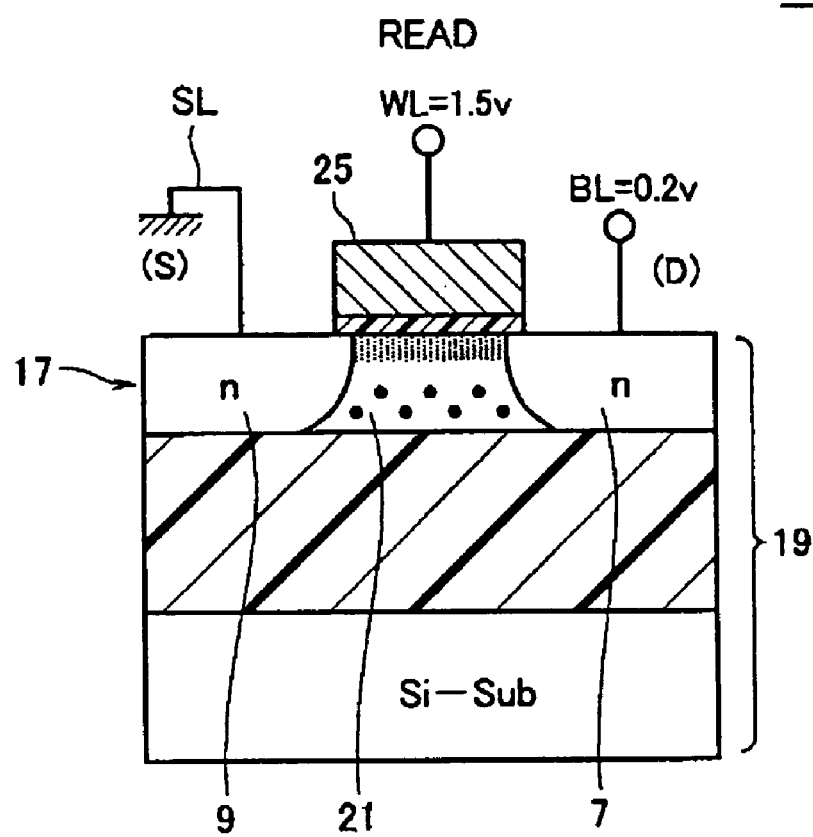
FIG. 5 is an illustrative view showing read operation of the memory transistor.

On the other hand, on write of data "0", as shown in FIG. 4, 1.5 V is applied to the word line WL and −1 V to the bit line BL, for example. As a result, majority carriers are released from the channel body 21 to the drain region 7 because a PN junction between the drain region 7 and the channel body 21 is forward biased.

A difference in state of carriers accumulated in the body 21 results in a difference in threshold of the memory transistor MT. Accordingly, as shown in FIG. 5, when 1.5 V is applied to the word line WL and 0.2 V to the bit line BL, for example, to detect the presence/absence or magnitude of a cell current, data can be read out as "0" or "1".

Figure 6:
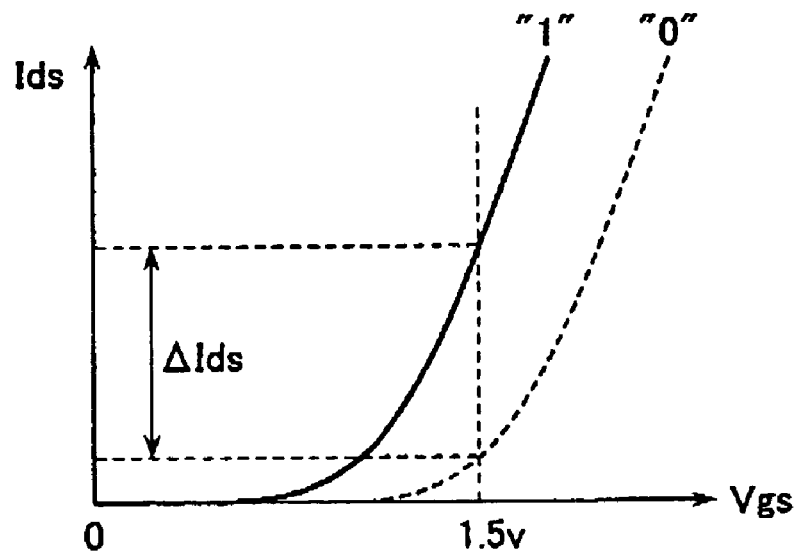
FIG. 6 is a graph showing a voltage-current characteristic of the memory transistor.

FIG. 6 shows a characteristic of Ids-Vgs (Drain current-Gate voltage) in the memory transistor in terms of data "0" and "1". The amount of majority carriers is gradually changed due to the PN junction current between the drain region 7 and the source region 9 while they are left for a long time. Therefore, it is required to perform refresh operations in certain cycles like in the conventional DRAM.

Main Effects of First Embodiment

Figure 7:
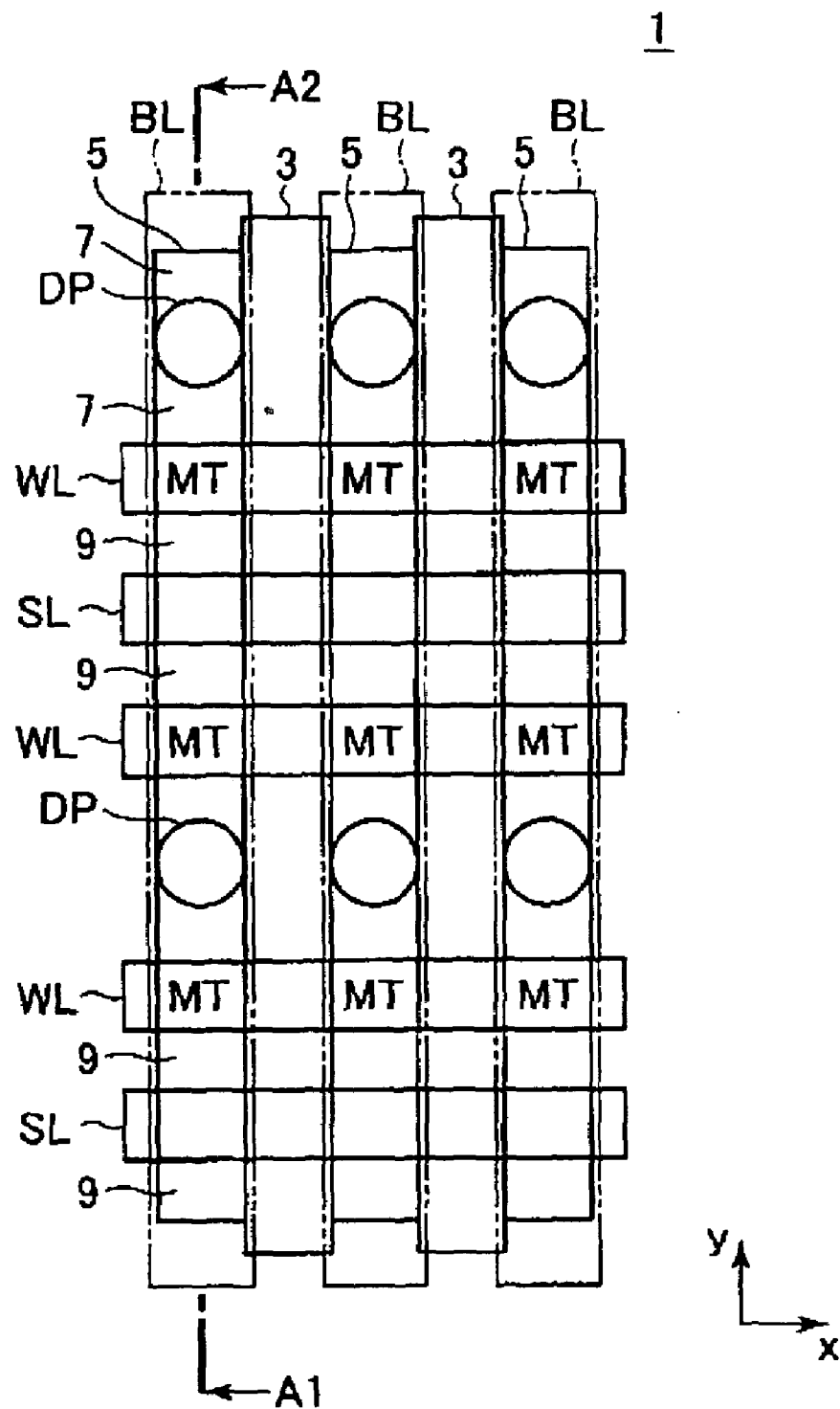
FIG. 7 is a plan view of part of a cell array according to a comparative example.
Figure 8:
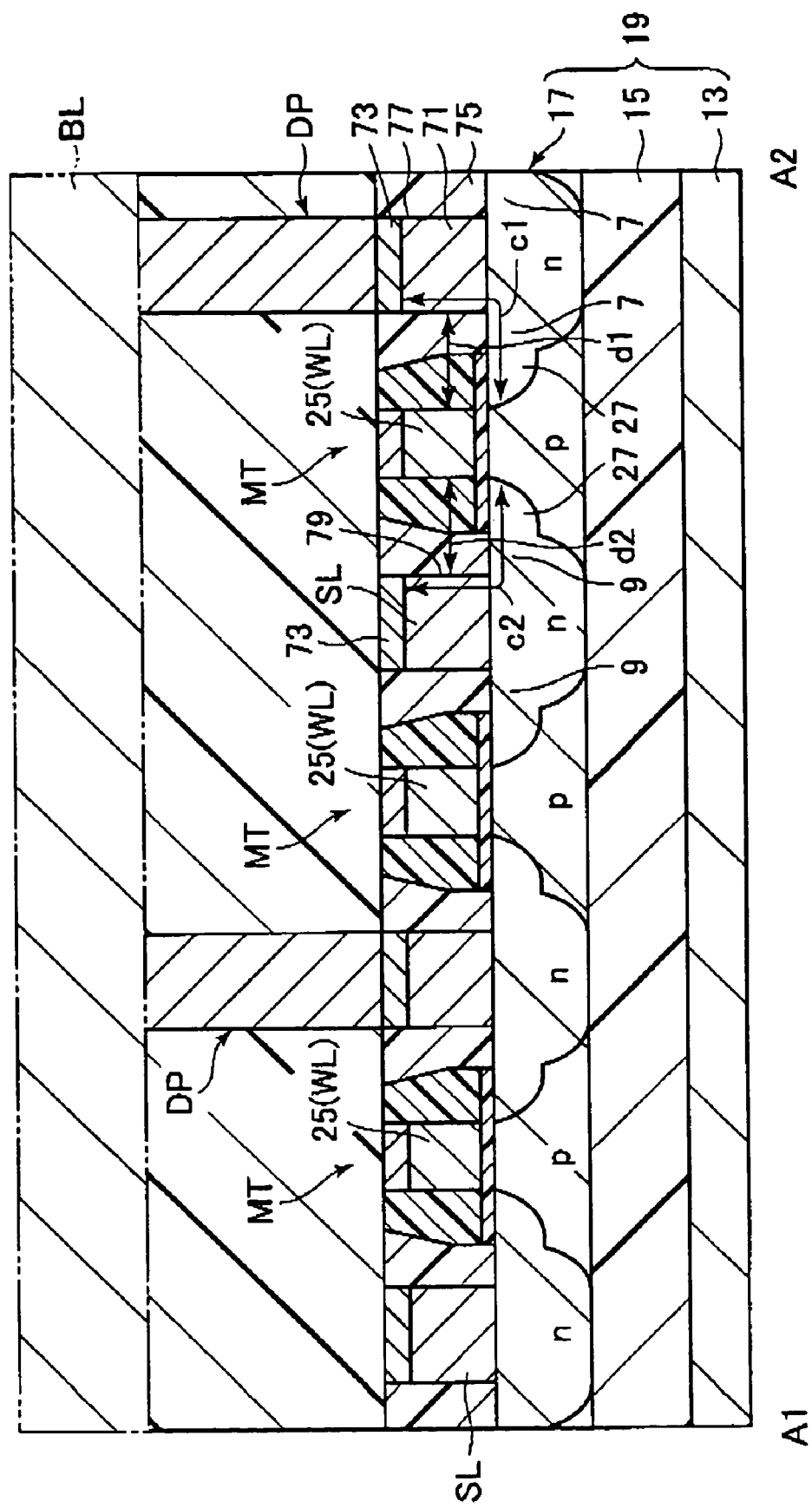
FIG. 8 is a cross-sectional view taken along A1–A2 line in FIG. 7.

The main effects of the first embodiment are explained in comparison with a comparative example. FIG. 7 is a plan view of part of a cell array according to the comparative example, which corresponds to FIG. 1. FIG. 8 is a cross-sectional view taken along A1–A2 line in FIG. 7, which corresponds to FIG. 2A. The comparative example is not provided with the selective epitaxial layer 29 and the impurity region isolation region 11 of the first embodiment.

First Effect: It is possible In the first embodiment to reduce variations in parasitic resistances associated with the memory transistor MT better than the comparative example. This reason is explained in detail. If there are large variations in parasitic resistances associated with the memory transistor MT, potentials on the drain region 7 and the source region 9 may greatly vary in the FBC memory that employs a large current flow to read/write data. This results in an increased number of memory transistors that have potentials on the regions 7 and 9 falling outside normal values on read/write of data (failed cells).

There are relatively larger variations in parasitic resistances in the comparative example. As shown in FIG. 8, the comparative example is not provided with the selective epitaxial layer 29 of the first embodiment. Accordingly, the lower portion 71 of the drain plug DP is directly connected to the drain region 7, and the source line SL to the source region 9. The lower portion 71 of the drain plug DP and the source line SL are composed of a material of polysilicon, and a suicide 73 is formed thereon.

The lower portion 71 of the drain plug DP and the source line SL are formed as follows. Photolithography and etching processes are employed to form a contact hole 77 above the drain region 7 and a trench 79 extending along the word line WL above the source region 9 in an interlayer insulator film 75 that is formed to cover the drain region 7 and the source region 9. The lower portion 71 of the drain plug DP is then buried in the contact hole 77 and the source line SL in the trench 79.

The use of photolithography to form the contact hole 77 and the trench 79 inevitably causes positional deviations thereof. The use of photolithography to form the gate electrode 25 also inevitably causes a positional deviation thereof. As a result, relatively larger variations arise in a distance, d1, between the gate electrode 25 and the lower portion 71 of the drain plug DP and in a distance, d2, between the gate electrode 25 and the source line SL.

In accordance with the variations in the distances d1 and d2, a current path c1 and a current path c2 also vary. The former is a current path extending from an interface between the lower portion 71 of the drain plug DP and the silicide 73 to the low-concentration region 27 in the drain region 7. The latter is a current path extending from an interface between the source line SL and the silicide 73 to the low-concentration region 27 in the source region 9. The current paths c1 and c2 have relatively higher resistances because they are located in the semiconductor layer, and accordingly occupy a large proportion in the parasitic resistances. Therefore, the relatively larger variations in the distances d1 and d2 result in relatively larger variations in the parasitic resistances.

To the contrary, the first embodiment shown in FIG. 2A is provided with the selective epitaxial layer 29 that is disposed on the drain region 7 and the source region 9. As described later in a manufacturing method, the layer 29 is formed through a self-aligned selective epitaxial growth using the sidewall 39. Accordingly, the layer 29 extends to the location of the sidewall 39. Therefore, current paths in the first embodiment corresponding to the current paths c1 and c2 in FIG. 8 are located immediately adjacent to the sidewall 39, and have relatively smaller variations therein. The drain plug DP and the source line SL are composed of a metal such as tungsten. Therefore, their contact resistances with the silicide occupy a small proportion in all parasitic resistances associated with the memory transistor MT. As a result, even if the positions of the drain plug DP and the source line SL vary, variations in parasitic resistances can be controlled relatively smaller.

Second Effect: In the first embodiment, the selective epitaxial layer 29 also can suppress a junction leakage current caused by the silicide 31. In a more detailed discussion, formation of the silicide directly on the drain region 7 and the source region 9, or a salicide (self-aligned silicide) structure, can reduce parasitic resistances and variations therein. In this case, however, the distance between the silicide and the drain region 7 or the distance between the silicide and the source region 9 is short. Therefore, metal atoms diffused from the silicide into the drain region 7 and the source region 9 cause an extremely increased junction leakage current. As a result, the memory transistor MT has an extremely reduced data holding time and can not serve as a memory cell.

In the first embodiment, the junction leakage current caused by the silicide can be suppressed by two reasons. One is associated with a relatively higher impurity concentration (for example, $1 \times 10^{20}/cm^3$ or more) in the selective epitaxial layer 29. It can reduce the influence of the metal atoms diffused from the silicide 31 or prevent a depletion layer adjacent to the PN junction from reaching the diffused region of the metal atoms. Another is associated with the selective epitaxial layer 29 located between the drain region 7 (source region 9) and the silicide 31. An exemplary height of the layer 29 or distance from the silicon layer 17 to the interface (between the selective epitaxial layer 29 and the silicide 31) is equal to 100 nm. This height increases a distance from the silicide 31 to the drain region 7 (source region 9) and can reduce the influence of the metal atoms diffused from the silicide 31.

Third Effect: In the first embodiment the LDD structure of the drain region 7 and the source region 9 can weaken an intensity of electric field in the vicinity of the pn junction between such the region and the channel body 21 to suppress the pn junction leakage current. Specifically, in the drain region 7 and the source region 9, a region spaced 80 nm or more from the location of the pn junction is designed to have an n-type impurity concentration of $1 \times 10^{19}/cm^3$ or less to achieve a low and slow concentration gradient. On the other hand, the selective epitaxial layer 29 (an example of the second semiconductor layer) is formed to have a thickness of 100 nm at a location spaced from the location of the pn junction by the sidewall 39. Therefore, it is possible to achieve the n-type impurity concentration of $1 \times 10^{19}/cm^3$ or more, for example, at the interface between the silicide 31 and the selective epitaxial layer 29. Also in this case, the concentration gradient near the pn junction can not be influenced. Therefore, the resistance of the selective epitaxial layer 29 can be reduced to lower the parasitic resistance. In addition, the formation of the silicide 31 on the selective epitaxial layer 29 can further lower the parasitic resistance by a certain reason, which is detailed in Fifth Effect.

Figure 9:
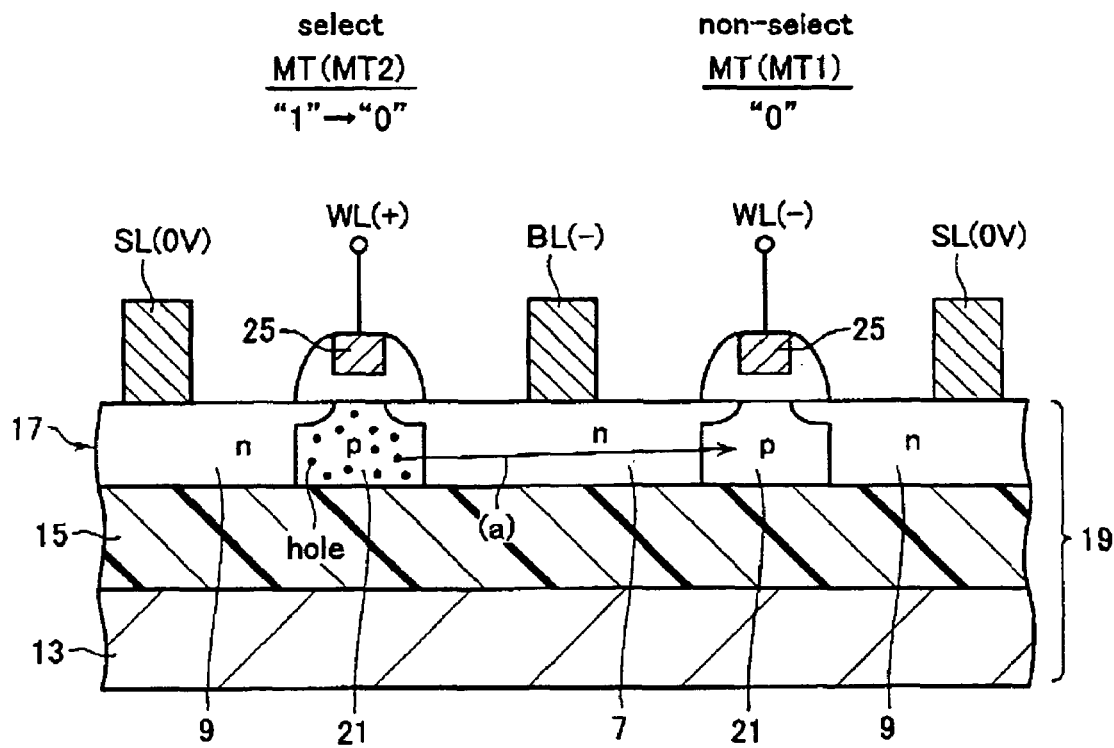
FIG. 9 is a schematic diagram showing data rewrite operation in the comparative example.

Fourth Effect: The first embodiment is capable of downsizing the memory transistor MT while preventing data destruction better than the comparative example. The data destruction in the memory transistor MT is described first. FIG. 9 is a schematic cross-sectional view showing data rewrite operation in the comparative example shown in FIG. 8. In this example, data "1" is stored in a memory transistor MT2 and data "0" in an adjacent memory transistor MT1. The "1"-stored state corresponds to the state of the channel body 21 with a number of holes accumulated therein. To the contrary, the "0"-stored state corresponds to the state of the channel body 21 with no holes present therein.

The memory transistor MT2 is selected, for example, to rewrite the data from "1" to "0". In this case a positive voltage is applied to the word line WL and a negative voltage to the bit line BL associated with the memory transistor MT2. Thus, the drain region 7 is placed at the negative voltage. Accordingly, using the drain region 7 as an n-type base, and the channel bodies 21 at both sides thereof as a p-type emitter and a p-type collector, a parasitic bipolar transistor may operate on the bottom in the silicon layer 17. Through this portion, the holes in the channel body 21 in the memory transistor MT2 flow into the channel body 21 in the adjacent non-selected memory transistor MT1 as shown with (a). As a result, the data "0" stored in the non-selected memory transistor MT1 is crashed. This is a problem (of Disturbance by the parasitic pnp bipolar transistor). In a word, when excess majority carriers accumulated in a channel body of a memory transistor flow into an adjacent memory transistor, they invite data destruction in the adjacent memory transistor.

Figure 10:
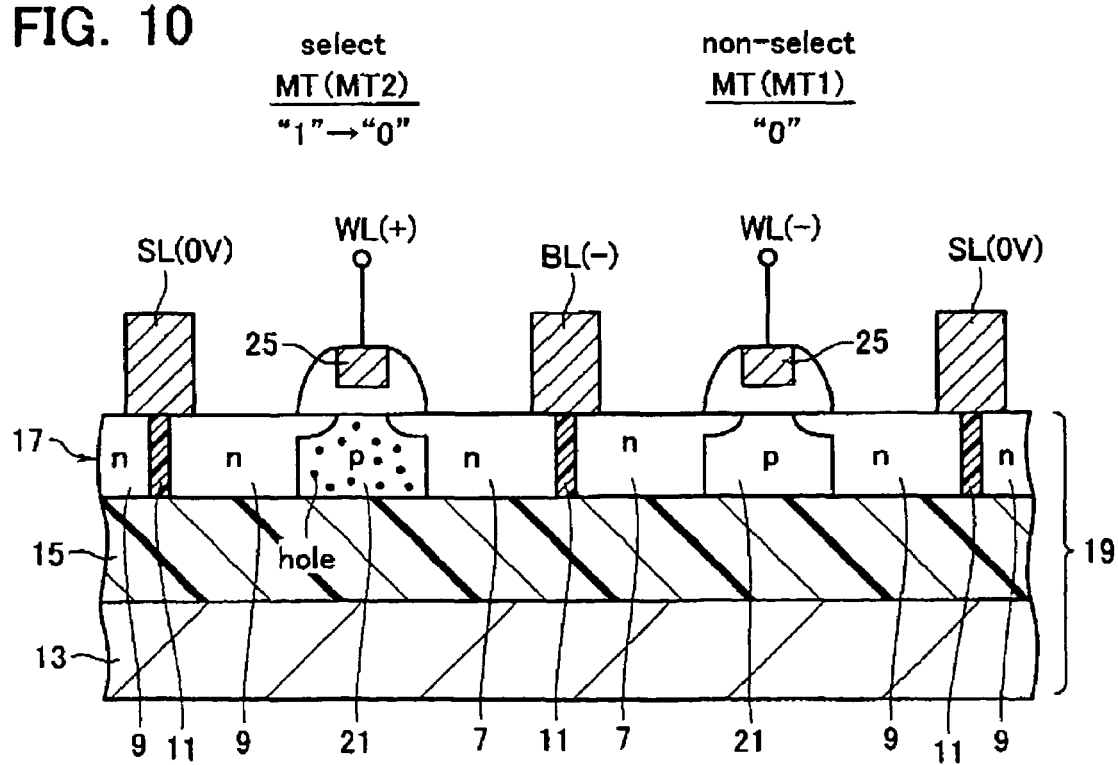
FIG. 10 is a schematic diagram showing data rewrite operation in the first embodiment.

To the contrary, the case of the first embodiment is described with reference to FIG. 10. FIG. 10 is a schematic cross-sectional view showing data rewrite operation in the first embodiment of FIG. 2A. FIG. 10 shows the same operation as that in the comparative example of FIG. 9. The first embodiment is provided with the impurity region isolation region 11 that isolates the adjacent drain regions 7 from each other. Accordingly, the above parasitic bipolar transistor can not operate. This is effective to prevent the data destruction in the adjacent memory transistor MT1.

In the first embodiment the adjacent source regions 9 are also isolated from each other by the impurity region isolation region 11. Therefore, such a parasitic bipolar transistor that employs the source region 9 as an n-type base, and the channel bodies 21 at both sides thereof as a p-type emitter and a p-type collector can not operate. This is also effective to prevent the data destruction.

The isolation of the adjacent drain regions 7 (source regions 9) from each other can prevent the parasitic bipolar transistor from operating. Accordingly, the impurity region isolation region 11 may be hollow: that is, no insulator 37 is buried in the trench 35 (and the trench 35 itself serves as the impurity region isolation region 11). The impurity region isolation region 11 may be structured to include an insulator formed on sides in the trench 35 and a conductor filled in the remaining space.

As shown in FIG. 1, in the first embodiment the impurity region isolation region 11 is designed to have a smaller width, w1, than a width, w2, of the device isolation region 3 to achieve down-sizing of the cell array 1. For example, formation of the device isolation region 3 by the STI (Shallow Trench Isolation) technology allows the width w2 of the device isolation region 3 to be made equal to the width of the trench for use in STI. If this width is a minimum process dimension, the use of a manufacturing method later described allows the width w1 of the impurity region isolation region 11 to be made smaller than the minimum process dimension. As described above, it is possible in the first embodiment to achieve down-sizing while preventing data destruction. The minimum process dimension is determined from a resolution by a resist and a wavelength of light to which the resist is exposed, and can be reduced in accordance with the progress of semiconductor process technologies.

Fifth Effect: In the first embodiment, the impurity region isolation region 11 isolates portions of the selective epitaxial layer 29 from each other and portions of the silicide 31 from each other. This is effective to prevent the parasitic bipolar transistor from operating.

Formation of the impurity region isolation region 11, however, reduces the areas of the drain region 7 and the source region 9 accordingly and increases resistances in those regions. As a result, the parasitic resistance in the memory transistor MT increases. In the first embodiment, the selective epitaxial layer 29 and the silicide 31 are formed on the drain region 7 (source region 9) to prevent the parasitic resistance from increasing as discussed below in detail.

A resistance at the interface between silicide and silicon is relatively large and contributes to the whole parasitic resistance in the memory translator MT. In the first embodiment, the selective epitaxial layer 29 is formed by self-alignment using the sidewall 39, and the silicide is formed thereon by self-alignment. This configuration increases the area of the interface between silicide and silicon and reduces the interface resistance. In addition, the n-type impurity concentration at the interface between the silicide 31 and the selective epitaxial layer 29 is designed to have a value equal to $1 \times 10^{20}/cm^3$ or more to reduce the interface resistance.

The formation of the selective epitaxial layer 29 by self-alignment using the sidewall 39 increases the cross section of the silicon layer 29 for the current path. Further, then-type impurity concentration equal to $1 \times 10^{20}/cm^3$ or more can reduce the resistivity. These two points lower the resistance in the silicon layer 29.

If no selective epitaxial layer 29 is formed and the SOI thickness is less than 50 nm, ion implantation of a high dose n-type impurity turns the whole SOI layer into amorphous. Accordingly, the silicon layer is turned through the following thermal process into not single crystalline but polysilicon, which increases the resistance up to 10-folds or higher. If the selective epitaxial layer is formed to increase the silicon film thickness, even the ion implantation of a high dose n-type impurity allows a single crystalline layer to remain at the lower portion in the silicon layer, which can be recrystallized through the following thermal process. Thus, the silicon layer 29 can be controlled to have a low resistance.

Sixth Effect: In the first embodiment, the memory transistor MT can be downsized. The conventional structure has no selective epitaxial layer. Therefore, if it is intended to weaken the intensity of electric field at the pn junction and lower the resistance at the interface between the silicide 31 and the silicon layer, the sidewall 39 is required to have an increased thickness. This is to prevent a high-concentration n-type impurity from influencing on the concentration gradient in the vicinity of the pn junction. In the first embodiment, the selective epitaxial layer is formed to have a thickness of 100 nm at a location spaced by the sidewall 39 from the location of the pn junction. Therefore, the n-type impurity concentration of $1 \times 10^{20}/cm^3$ or more at the interface between the silicide 31 and the selective epitaxial layer 29 imparts no influence on the concentration gradient in the vicinity of the pn junction. This is effective to thin the sidewall 39 and downsize the memory transistor MT.

As shown in FIG. 2A, the first embodiment is provided with the drain plug DP that spans the adjacent drain regions 7 and commonly connects to these regions, and the source line SL that spans the adjacent source regions 9 and commonly connects to these regions. Therefore, even if the adjacent drain regions 7 (source regions 9) are isolated from each other by the impurity region isolation region 11, the adjacent drain regions 7 (source regions 9) can be connected commonly by the drain plug DP (source line SL). This is effective to downsize the memory transistor MT.

Seventh Effect: In order to prevent the formation of the silicide on the side of the gate electrode 25 and the side of the selective epitaxial layer 29, the silicon nitride is preferred as the sidewall rather than the silicon oxide. On the other hand, an increased height of the selective epitaxial layer 29 increases a gate-drain parasitic capacitance and a gate-source parasitic capacitance. The silicon oxide is preferred to reduce the parasitic capacitance because the silicon oxide has a lower dielectric constant than that of the silicon nitride. Therefore, in the first embodiment, the sidewall 39 is designed to have a structure consisting of films of silicon nitride 41, silicon oxide 43 and silicon nitride 45 sandwiched between the selective epitaxial layer 29 (an example of the second semiconductor layer) and the gate electrode 25. In a word, for the purpose of preventing formation of the silicide on a side of the selective epitaxial layer 29, the silicon nitride 41 is formed on the side instead. Similarly, the silicon nitride 45 is formed on as side of the gate electrode 25. Finally, the silicon oxide 43 is formed in between these silicon nitride films.

Method of Manufacturing Semiconductor Memory Device

A method of manufacturing the semiconductor memory device according to the first embodiment is described with reference to FIGS. 11–28. These figures are cross-sectional views of the SOI substrate and other portions showing this manufacturing method in order of process steps. In these figures, an A1–A2 cross section corresponds to FIG. 2A, a B1–B2 cross section to FIG. 2B, and a C1–C2 cross section to FIG. 2C.

Figure 11:
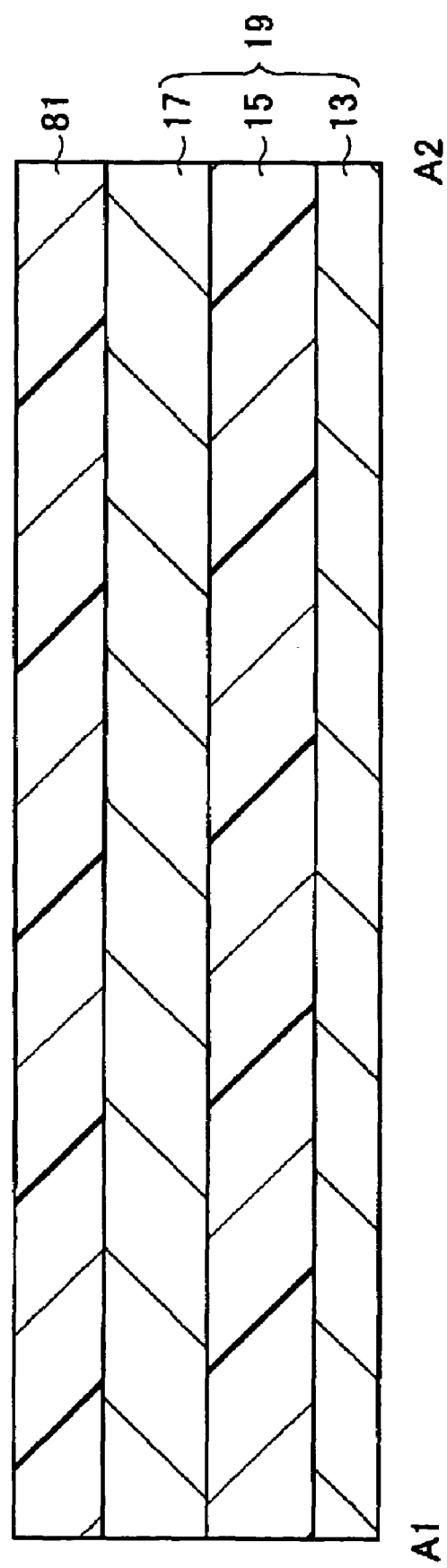
FIG. 11 is a process diagram of a first step in a method of manufacturing the semiconductor memory device according to the first embodiment (A1–A2 cross section)

A description is first given to the step of forming the device isolation regions 3 using the STI (Shallow Trench Isolation) technology. With respect to this step, an A1–A2 cross section is shown in FIG. 11, a B1–B2 cross section in FIG. 12, and a C1–C2 cross section in FIG. 13. The SOI substrate 19 is prepared. The SOI substrate 19 consists of the silicon substrate 13 serving as a support substrate, the silicon oxide layer 15 as a buried oxide film (with an exemplary thickness of 150 nm), and the p-type single crystalline silicon layer 17 (with an exemplary thickness of 150 nm) in a stacked structure.

Figure 12:
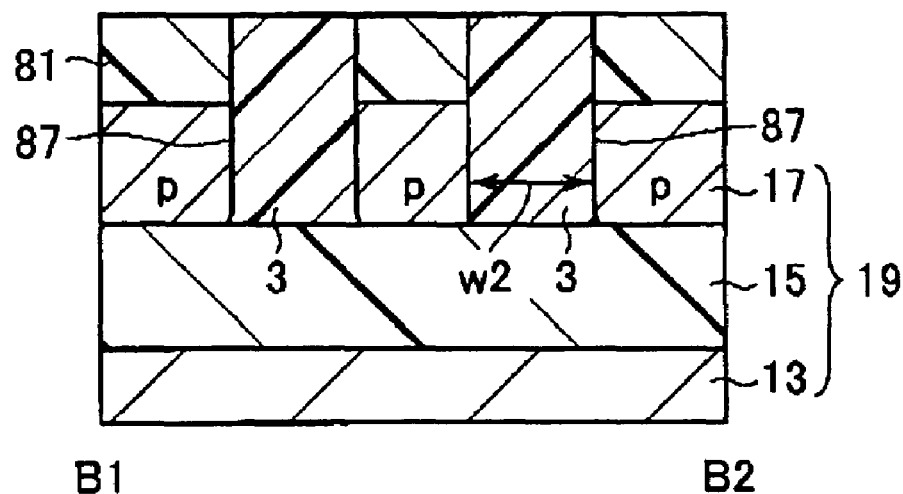
FIG. 12 is a process diagram of the first step in the method (B1–B2 cross section)
Figure 13:
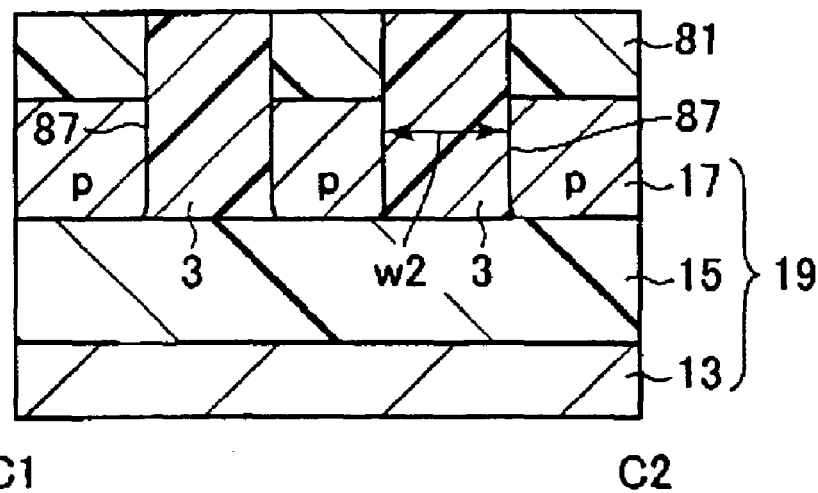
FIG. 13 is a process diagram of the first step in the method (C1–C2 cross section)
Figure 29:
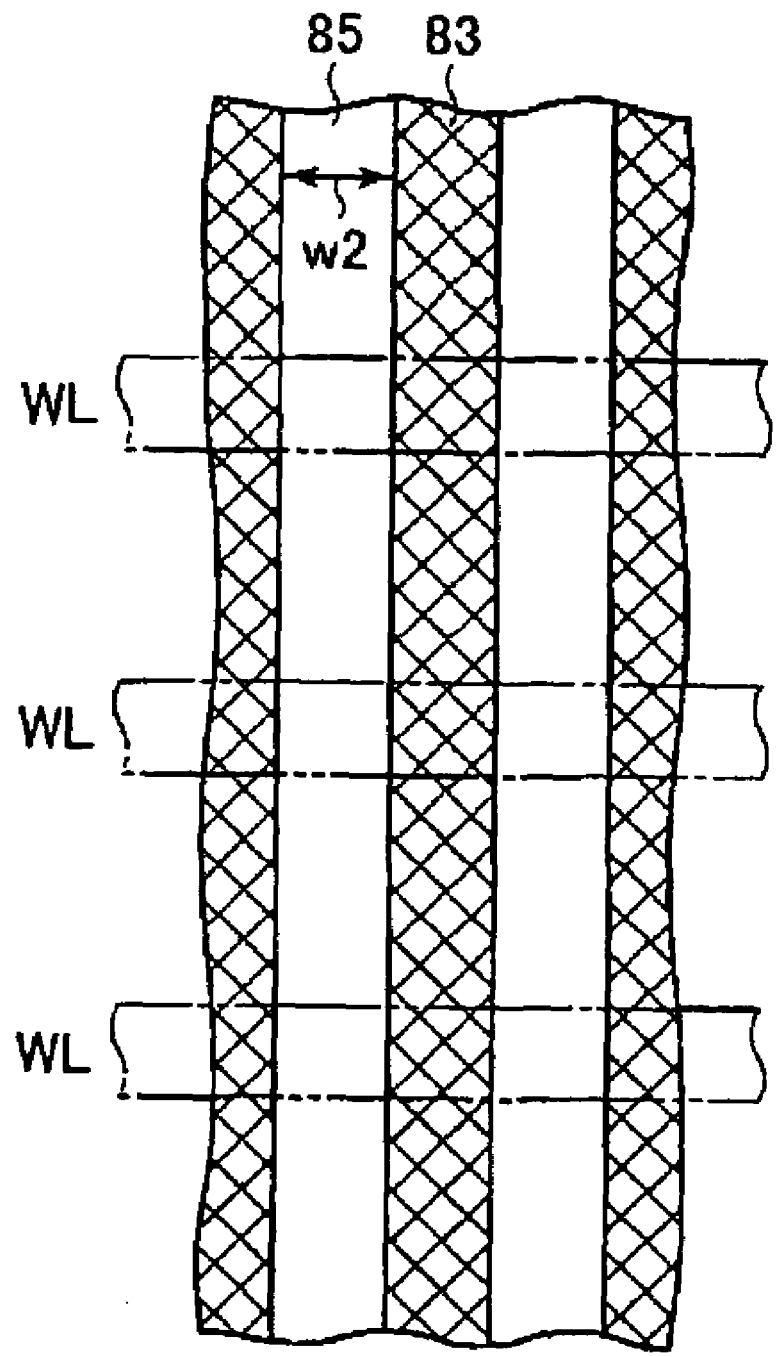
FIG. 29 is a plan view of a resist pattern for use in the first step.

A silicon nitride film 81 is deposited on the silicon layer 17, and then photolithography is applied to form a resist pattern. FIG. 29 is a plan view of the resist pattern. The resist pattern includes an opening portion 85 corresponding to the pattern of the device isolation region 3 (FIG. 1), and a resist portion 83 corresponding to the pattern of the device formation region 5 (FIG. 1). The resist pattern Is employed as a mask for reactive ion etching to selectively remove the silicon nitride film 81 and the silicon layer 17. The resist pattern is then peeled off. As a result a trench 87 is formed below the opening portion 85 (FIGS. 12 and 13). The opening portion 85 and the trench 87 have the same width as the width w2 of the device isolation region 3, which is the minimum process dimension. The minimum process dimension is exemplified as 150 nm hereinafter though it can be reduced together with other specified numerals to be used below in accordance with the progress of technologies.

A thin thermal oxide film (not shown) Is formed on sides in the trench 87 by thermal oxidation. Then, a silicon oxide film, which is turned into the device isolation region 3, is formed on the silicon nitride film 81 by CVD (Chemical Vapor Deposition) to fill the trench 87. A dry etching is applied to etch back the silicon oxide film such that the silicon nitride film 81 exposes. CMP (Chemical Mechanical Polishing) may be employed instead of etching back. When the silicon nitride film 81 is peeled off, plural device isolation regions 3 are formed separately from each other.

The device isolation region 3 has a larger height than the silicon layer 17 (an example of the first semiconductor layer). The device isolation region 3 and the silicon layer 17 in this stage have a vertical step equal to 100 nm, for example. This is equal to the eventual height of the selective epitaxial layer 29 (FIG. 2A) to be formed in a later process. This is effective on formation of the selective epitaxial layer 29 to prevent portions of the selective epitaxial layer 29 in adjacent memory transistors MT (FIG. 1) from connecting with each other, interposing the device isolation region 3 therebetween.

Figure 14:
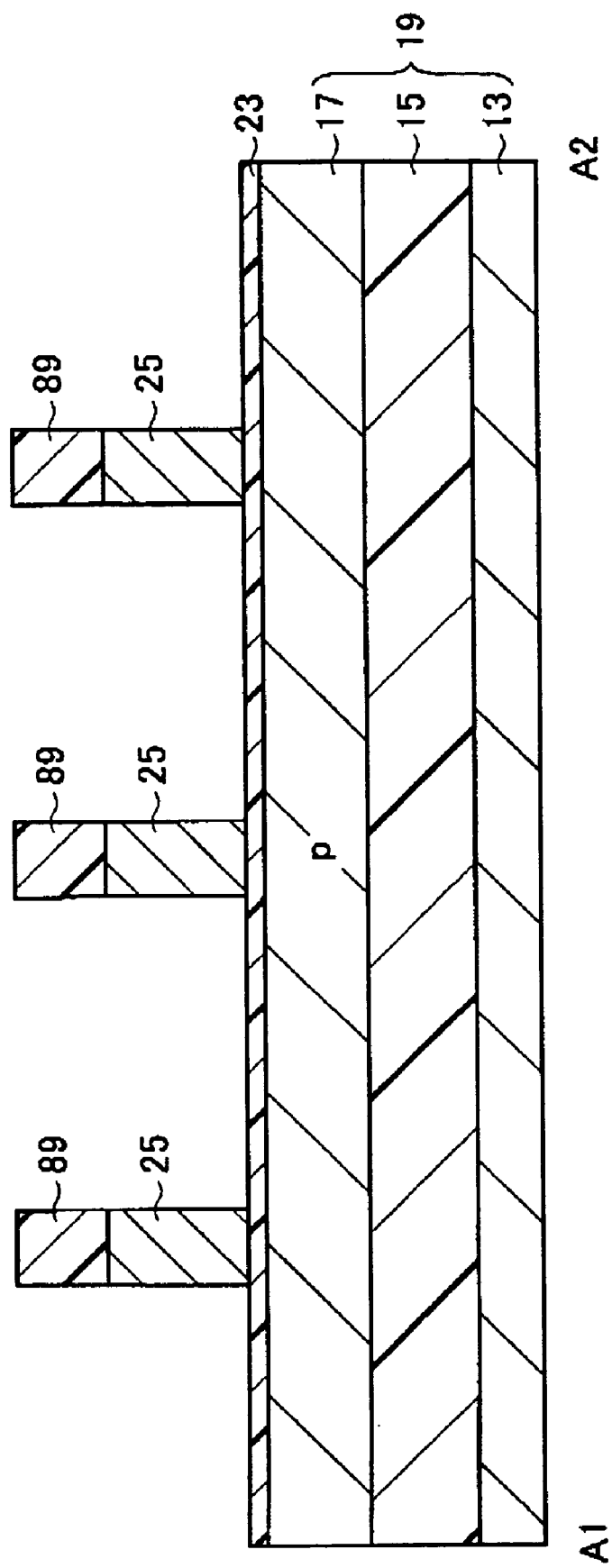
FIG. 14 is a process diagram of a second step in the method (A1–A2 cross section)
Figure 15:
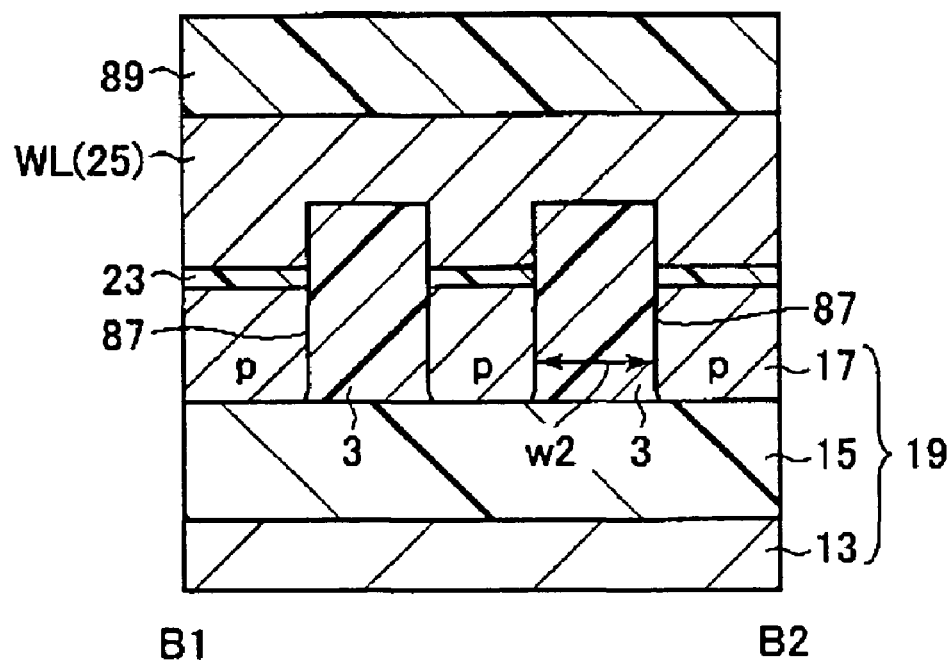
FIG. 15 is a process diagram of the second step in the method (B1–B2 cross section)
Figure 16:
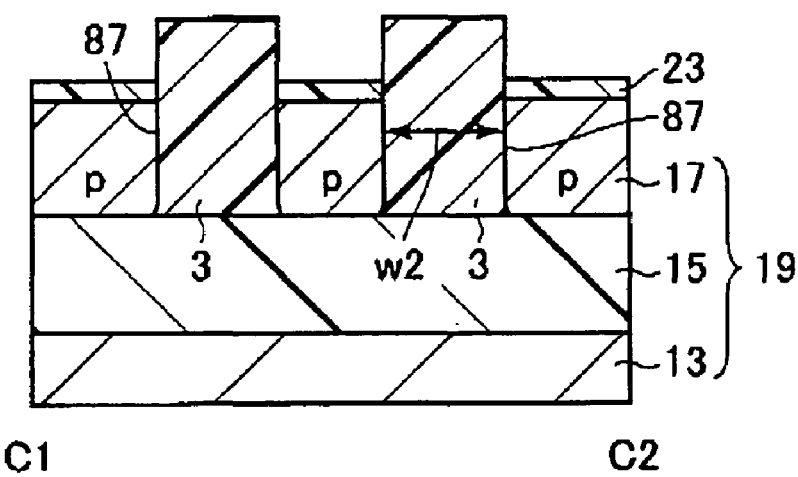
FIG. 16 is a process diagram of the second step in the method (C1–C2 cross section)

The step of forming gate electrodes is described next. As shown in FIG. 14 (A1–A2 cross section), FIG. 15 (B1–B2 cross section) and FIG. 16 (C1–C2 cross section), the silicon layer 17 is thermally oxidized. As a result, the gate insulator film 23 (gate oxide film) is formed on the silicon layer 17 in a region defined by the plural device isolation regions 3. Then, over the gate insulator film 23, a polysilicon film with a thickness of about 150 nm is formed by CVD, which is to be turned into the word line WL that contains the gate electrode 25. Further, a silicon nitride film 89 with a thickness of 100–150 nm is formed over the polysilicon film by CVD.

Photolithography is applied to form a resist pattern of the word lines WL on the silicon nitride film 89. The resist pattern Is employed as a mask for anisotropic etching of a laminate of the polysilicon film and the silicon nitride film 89. As a result, the word lines WL containing the gate electrodes 25 are formed separately from each other on the gate insulator film 23 as crossing the device isolation regions 3 (FIG. 1). The reason why the word lines WL are patterned in such the manner is to arrange the memory transistors MT in matrix. No gate electrode has been formed for the PMOS transistor PQ and the NMOS transistor NQ in FIG. 2D in the previous steps.

Figure 17:
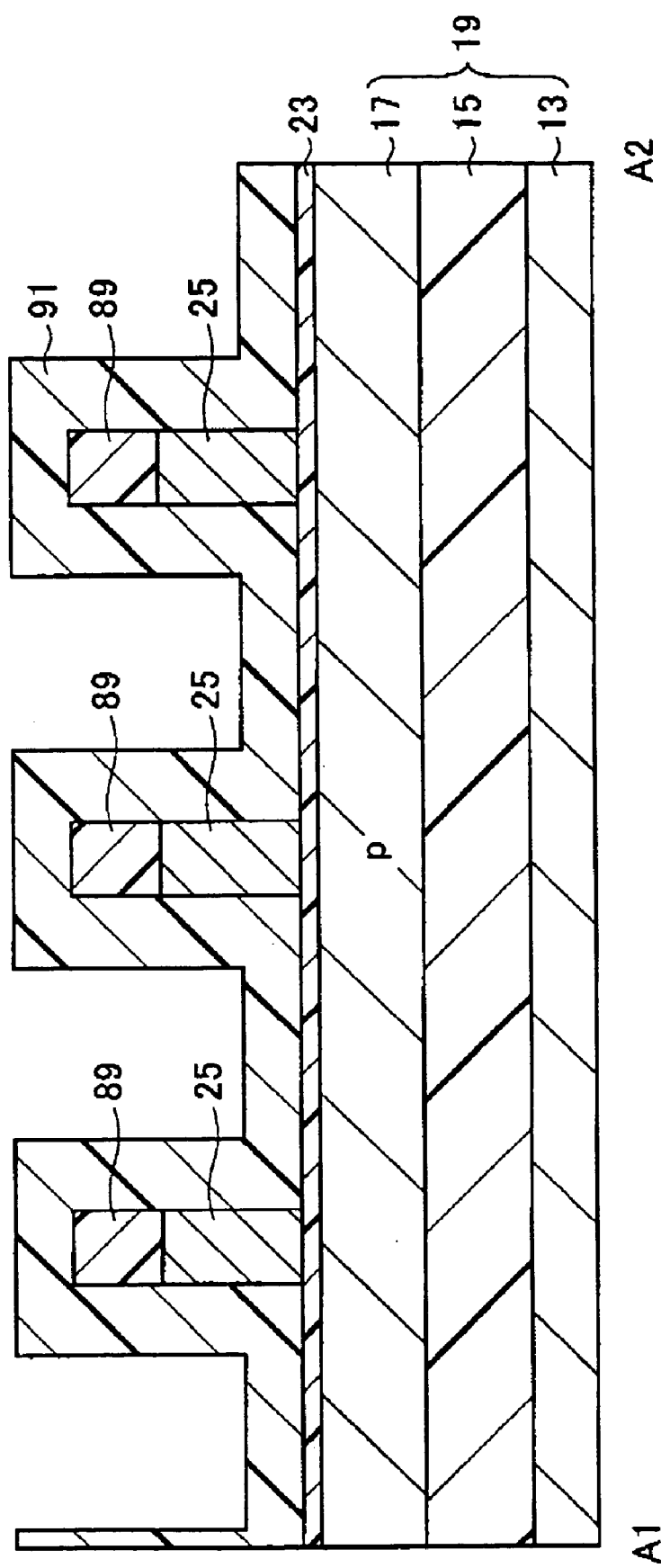
FIG. 17 is a process diagram of a third step in the method (A1–A2 cross section)

As shown in FIG. 17 (A1–A2 cross section), a silicon nitride film 91 with a thickness of about 150 nm is formed by CVD over the SOI substrate 19 to cover the gate electrode 25.

Figure 18:
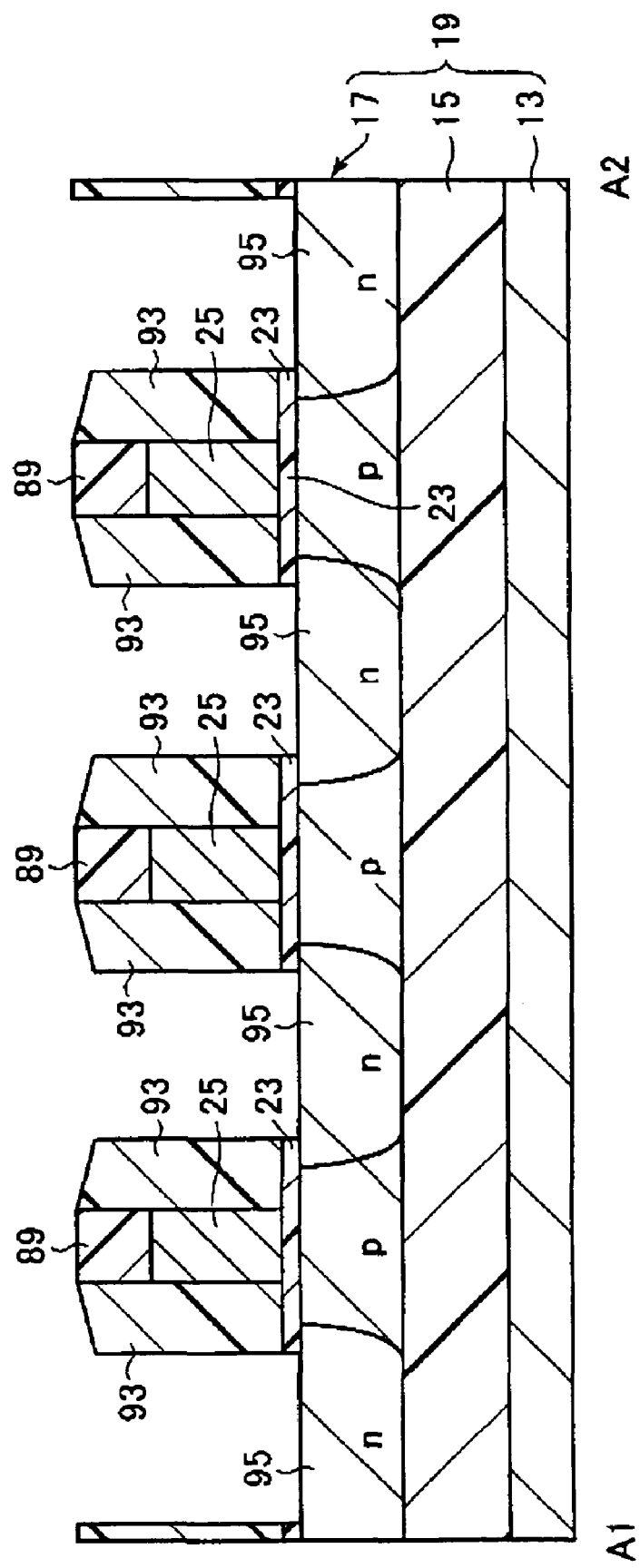
FIG. 18 is a process diagram of a fourth step in the method (A1–A2 cross section)

Then, as shown in FIG. 18 (A1–A2 cross section), the silicon nitride film 91 is subjected to an anisotropic etching to form a sidewall 93 (an example of the first sidewall) on the side of the gate electrode 25. This etching also removes the gate insulator film 23 from between the sidewalls 93 such that the silicon layer 17 exposes. Ions of an n-type impurity such as phosphorous are implanted into the silicon layer 17 to form-type impurity regions 95 therein, which are to be turned into the drain region 7 and the source region 9. The n-type impurity regions 95 extend from the surface of the silicon layer 17 down to the silicon oxide layer 15.

Figure 19A:
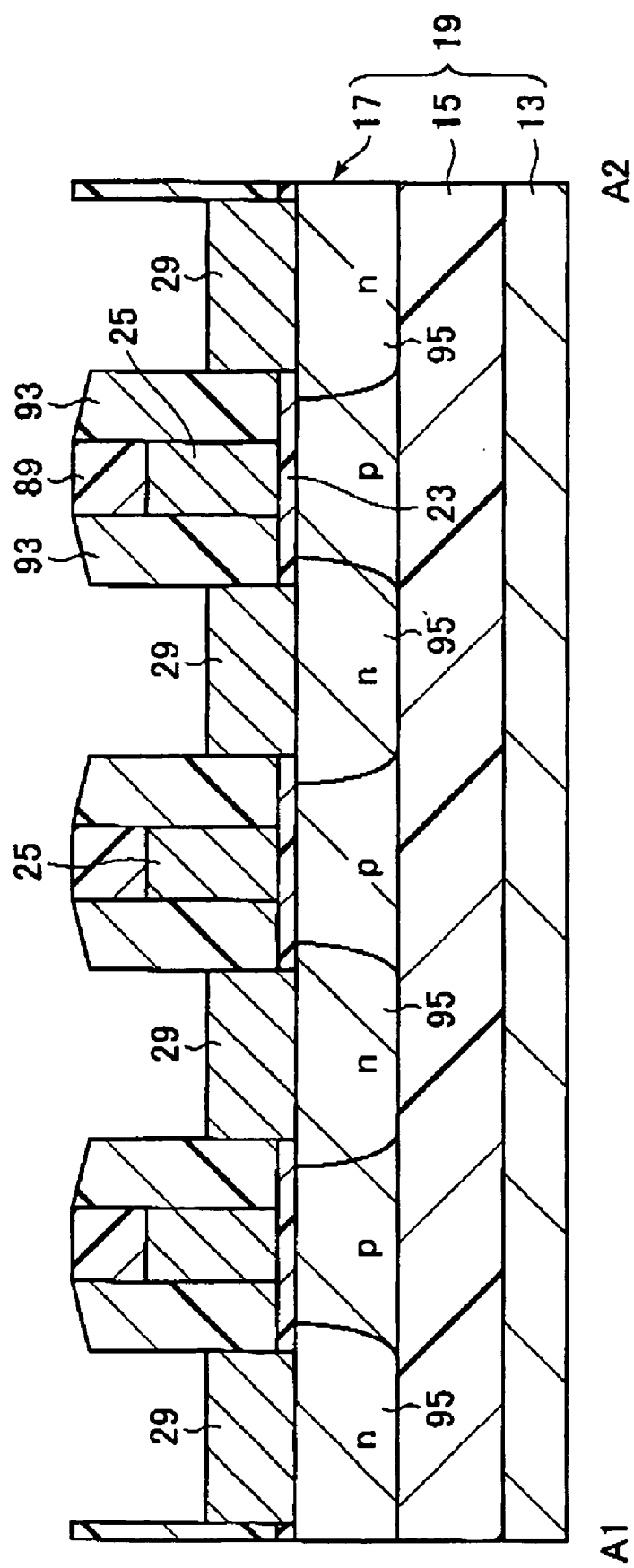
FIG. 19A is a process diagram of a fifth step in the method (A1–A2 cross section)
Figure 19B:
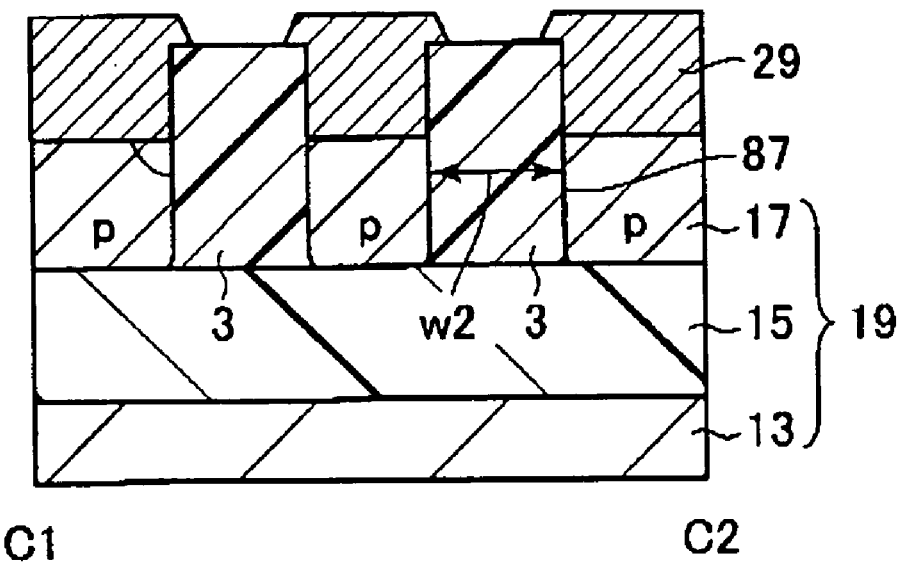
FIG. 19B is a process diagram of the fifth step in the method (C1–C2 cross section)

As shown in FIG. 19A (A1–A2 cross section) and FIG. 19B (C1–C2 cross section), after the sidewall 93 (an example of the first sidewall) is formed, a hydrofluoric acid is employed to remove the thin oxide film from the surface of the silicon layer 17. Thereafter, an n-type selective epitaxial layer 29 (an example of the second semiconductor layer) with a thickness of about 130 nm is formed by selective epitaxial growth on the silicon layer 17 (an example of the first semiconductor layer) between the gate electrodes 25. The device isolation region 3 is cut off in the process such as: the hydrofluoric acid etching provided immediately before the step of forming the gate insulator film 23; the over-etching of the sidewall 93 or the hydrofluoric acid etching provided immediately before the selective epitaxial growth. Therefore, the device isolation region 3 is formed 80 nm taller than the silicon layer 17 in this stage, for example. In a word, the selective epitaxial layer 29 has a height 50 nm taller than the device isolation region 3. The selective epitaxial layer may also grow laterally on the device isolation region by a length less than 50 nm. Accordingly, if the width of the device isolation region, w2, is equal to 150 nm, for example, portions of the selective epitaxial layer 29 in adjacent memory transistors MT (FIG. 1) are not connected with each other. Thus, the selective epitaxial layer may be formed as mounting on the device isolation region 3.

An exemplary epitaxial growth condition is given as follows. First, the surface is cleaned for 3 minutes in an $H_2$ ambient under pressure of 160 Torr at a temperature of 850° C. Next, a mixed gas of $SiH_2Cl_2$, HCl and $H_2$ is flowed for several minutes under pressure of 10 Torr at a temperature of 850° C. Flow rates of $SiH_2Cl_2$, HCl and $H_2$ are 0.4 μm, 0.1 slm and 14.5 slm, respectively.

Figure 20:
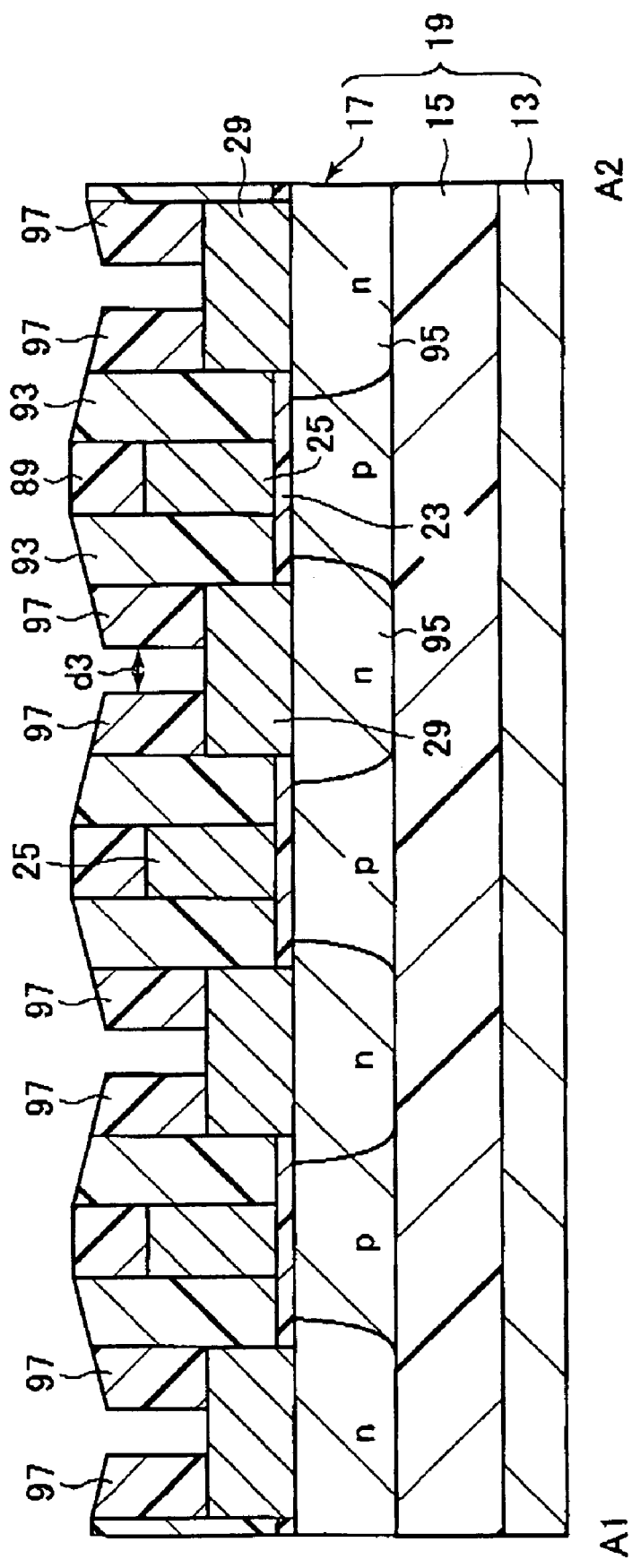
FIG. 20 is a process diagram of a sixth step in the method (A1–A2 cross section)

As shown in FIG. 20 (A1–A2 cross section), over the SOI substrate 19, a silicon nitride film is formed by CVD, which is to be turned into a sidewall 97 (an example of the second sidewall). The silicon nitride film is subjected to an anisotropic etching to form the sidewall 97 on the selective epitaxial layer 29 adjacent to the sidewall 93. The sidewalls 97 located between the gate electrodes 25 have a distance, d3 (for example, less than 100 nm), which is designed smaller than the width w2 of the device isolation region 3 in FIG. 1. On formation of the silicon nitride that is turned into the sidewall 97, the film thickness of the silicon nitride may be varied to adjust the dimension of the distance d3. The distance d3 can be downsized than the minimum process dimension because the sidewall 97 is formed using the anisotropic etching rather than the photolithography.

Figure 21:
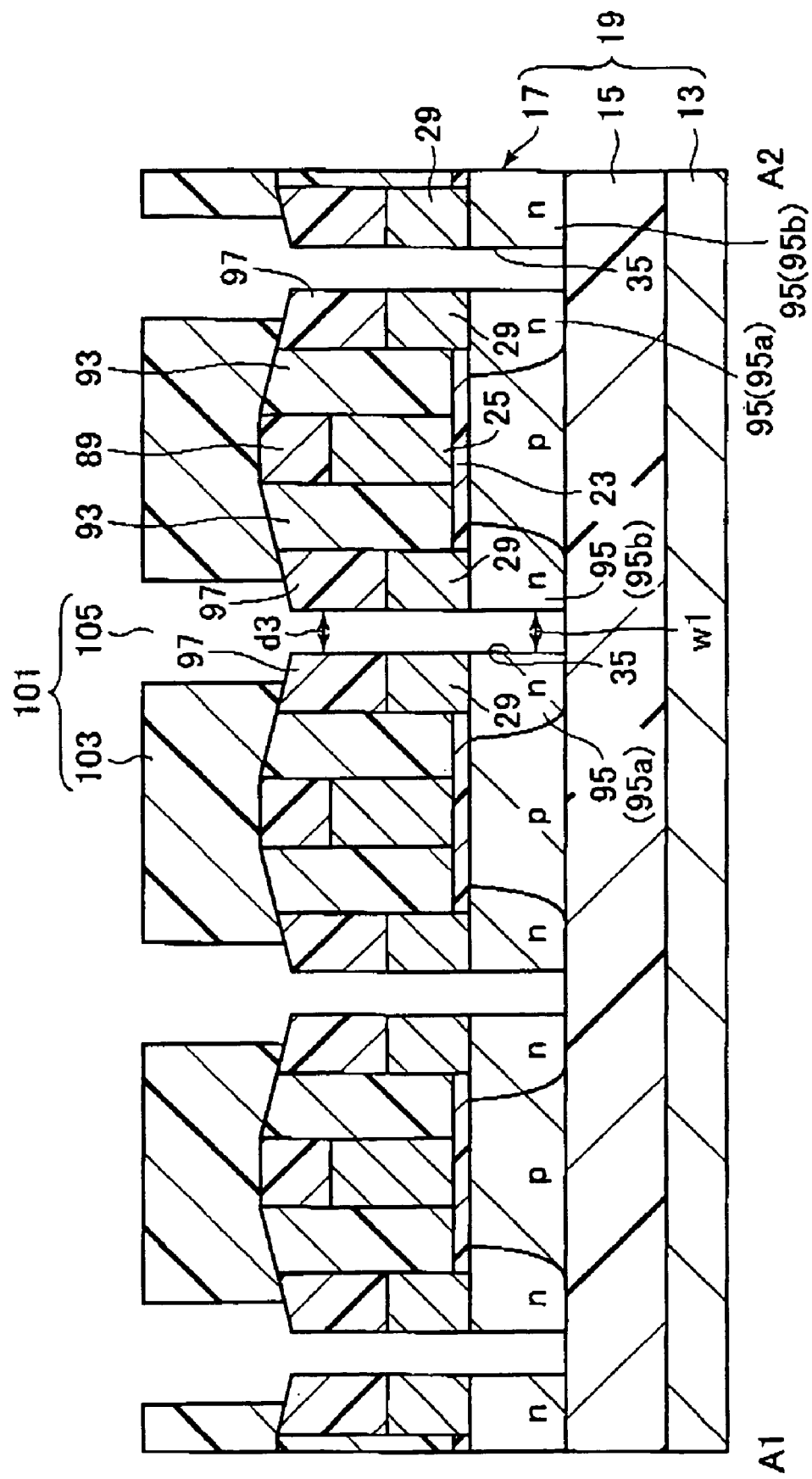
FIG. 21 is a process diagram of a seventh step in the method (A1–A2 cross section)
Figure 30:
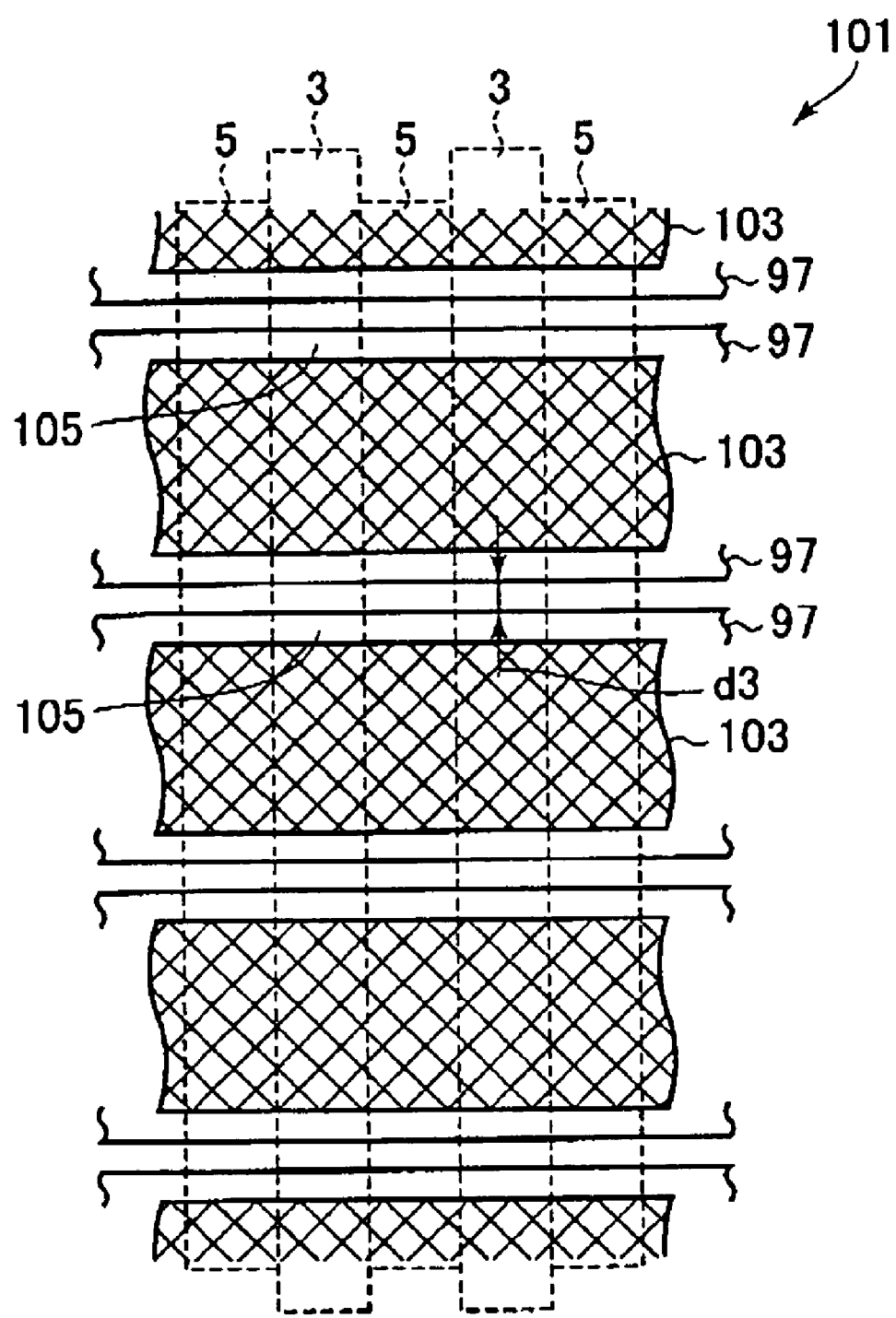
FIG. 30 is a plan view of a resist pattern in FIG. 21.

As shown in FIG. 21 (A1–A2 cross section), a resist pattern 101 is formed over the SOI substrate 19. FIG. 30 is a plan view of the pattern 101. The resist pattern 101 includes resist portions 103 and opening portions 105. The opening portion 105 is located above between the sidewalls 97. In the region for forming the logic circuit shown in FIG. 2D, the resist pattern 101 is entirely composed of the resist portion 103.

The resist pattern 101 and the sidewall 97 are employed as a mask for anisotropic etching to selectively remove the selective epitaxial layer 29 (an example of the second semiconductor layer) and the silicon layer 17 (an example of the first semiconductor layer). As a result, self-aligned trenches 35 are formed in the selective epitaxial layer 29 and the silicon layer 17 to isolate one region 95a and the other region 95b each to be adjacent drain regions, and isolate one region 95a and the other region 95b each other to be adjacent source regions. As the sidewall 97 is employed as the mask, the width w1 of the trench 35 (or the width w1 of the impurity region isolation region 11) is same as the distance d3 between the sidewalls 97. Therefore, the width w1 of the trench 35 is smaller than the width w2 of the device isolation region 3 (FIG. 1).

Figure 22:
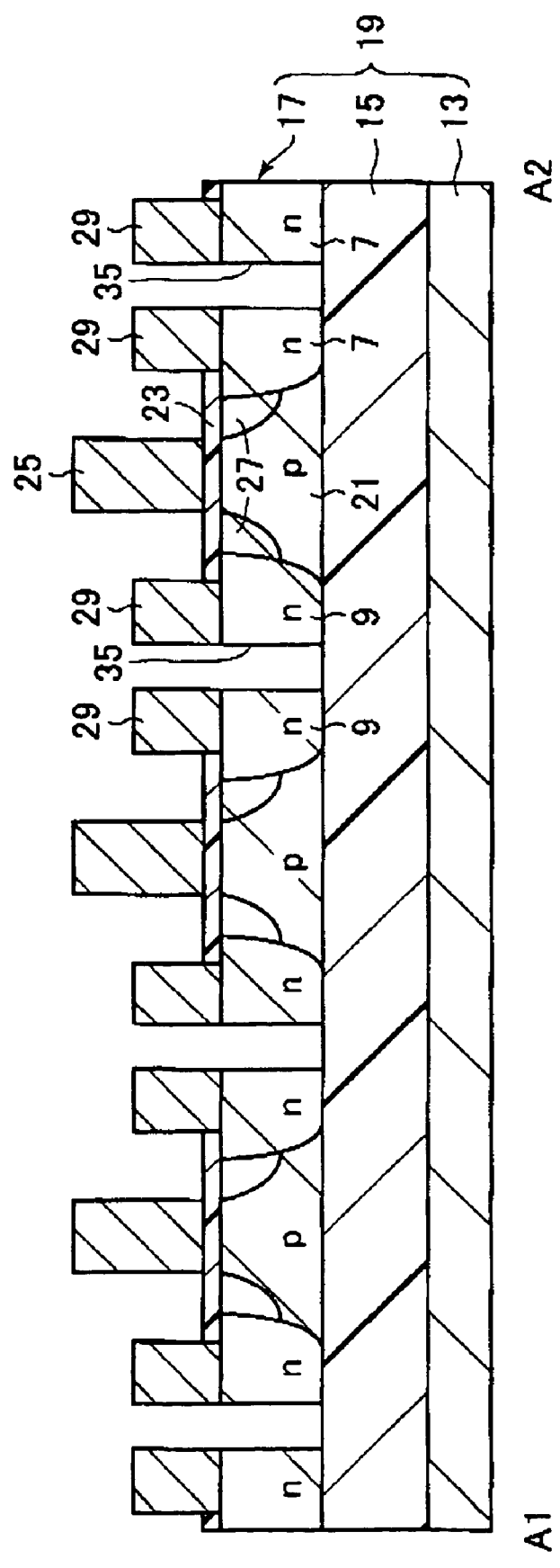
FIG. 22 is a process diagram of an eighth step in the method (A1–A2 cross section)

After the resist pattern 101 is removed, a hot phosphoric acid process is applied to peel off the silicon nitride film 89 and the sidewalls 93 and 97 as shown in FIG. 22 (A1–A2 cross section). Thereafter, ions of an n-type impurity such as phosphorous are implanted into the silicon layer 17 to form the n-type low-concentration region 27 followed by a RTA (Rapid Thermal Anneal) process at about 900° C. to complete the drain region 7 and the source region 9. The silicon layer 17 sandwiched between the drain region 7 and the source region 9 turns into the p-type channel body 21.

In the first embodiment, after the formation of the trench 35 serving as the impurity region isolation region, the drain region 7 and the source region 9 are completed. Alternatively, these regions 7 and 9 may be completed before the formation of the trench 35. For example, in FIG. 14, the silicon nitride film 89 is employed as a mask for implanting ions of an n-type impurity into the silicon layer 17 to form a low-concentration n-type impurity region in the silicon layer 17. Then, n-type impurity regions 95 are formed In the process step of FIG. 18 to complete the drain region 7 and the source region 9.

Figure 23:
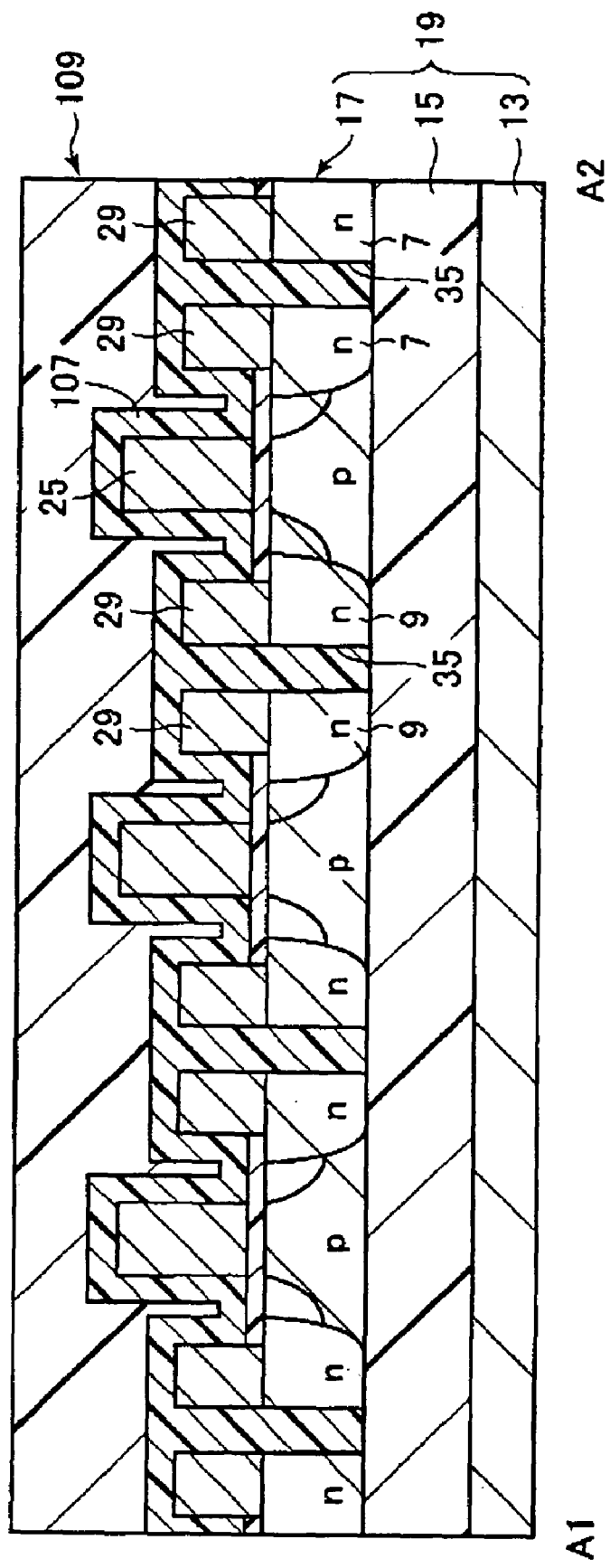
FIG. 23 is a process diagram of a ninth step in the method (A1–A2 cross section)
Figure 24:
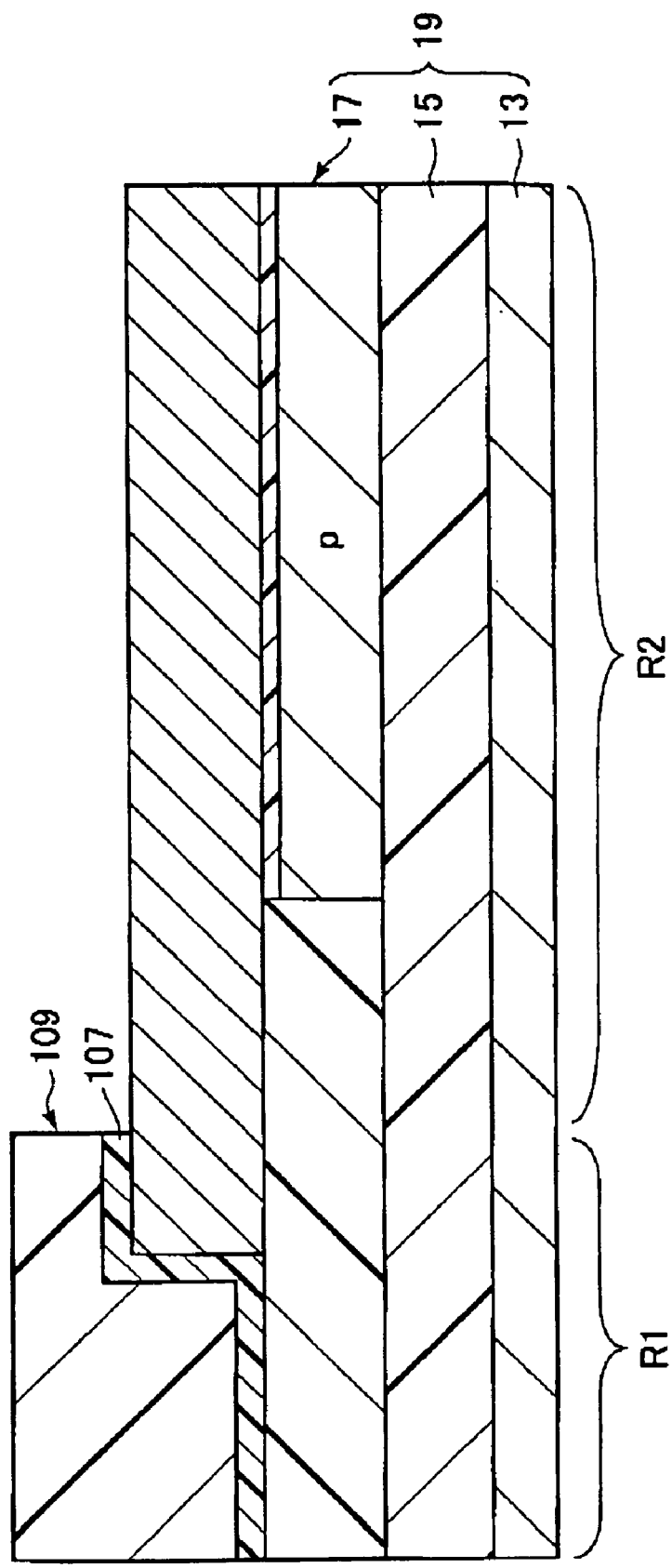
FIG. 24 is a process diagram of the ninth step in the method (boundary cross section)

The next step is described with reference to FIGS. 23 and 24. FIG. 23 is an A1–A2 cross section. FIG. 24 is a cross-sectional view at a boundary between a region R1 for forming the semiconductor memory device and a region R2 for forming the logic circuit. In order to fill the trench 35 with a silicon nitride film 107, it is formed by CVD with a thickness of about 30 nm over the SOI substrate 19 (when the width w1 of the trench is equal to 60 nm). A resist is formed over the film 107. This resist is then exposed to light and developed to form a resist pattern 109. The resist pattern 109 includes a resist portion that covers the region R1 for forming the semiconductor memory device and an opening portion corresponding to the region R2 for forming the logic circuit. This pattern 109 is employed as a mask for anisotropic etching of the silicon nitride film 107. As a result, the silicon nitride film 107 is removed from the region R2. The resist pattern 109 is peeled off.

Figure 25:
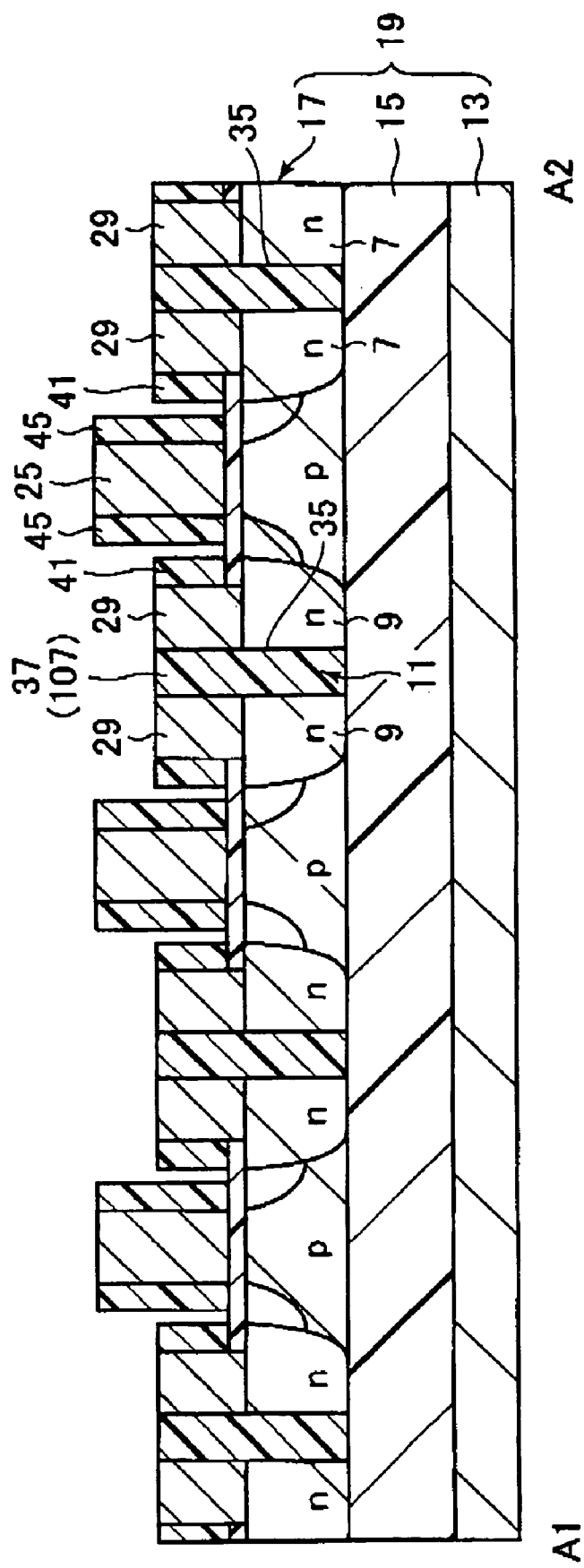
FIG. 25 is a process diagram of a tenth step in the method (A1–A2 cross section)
Figure 26:
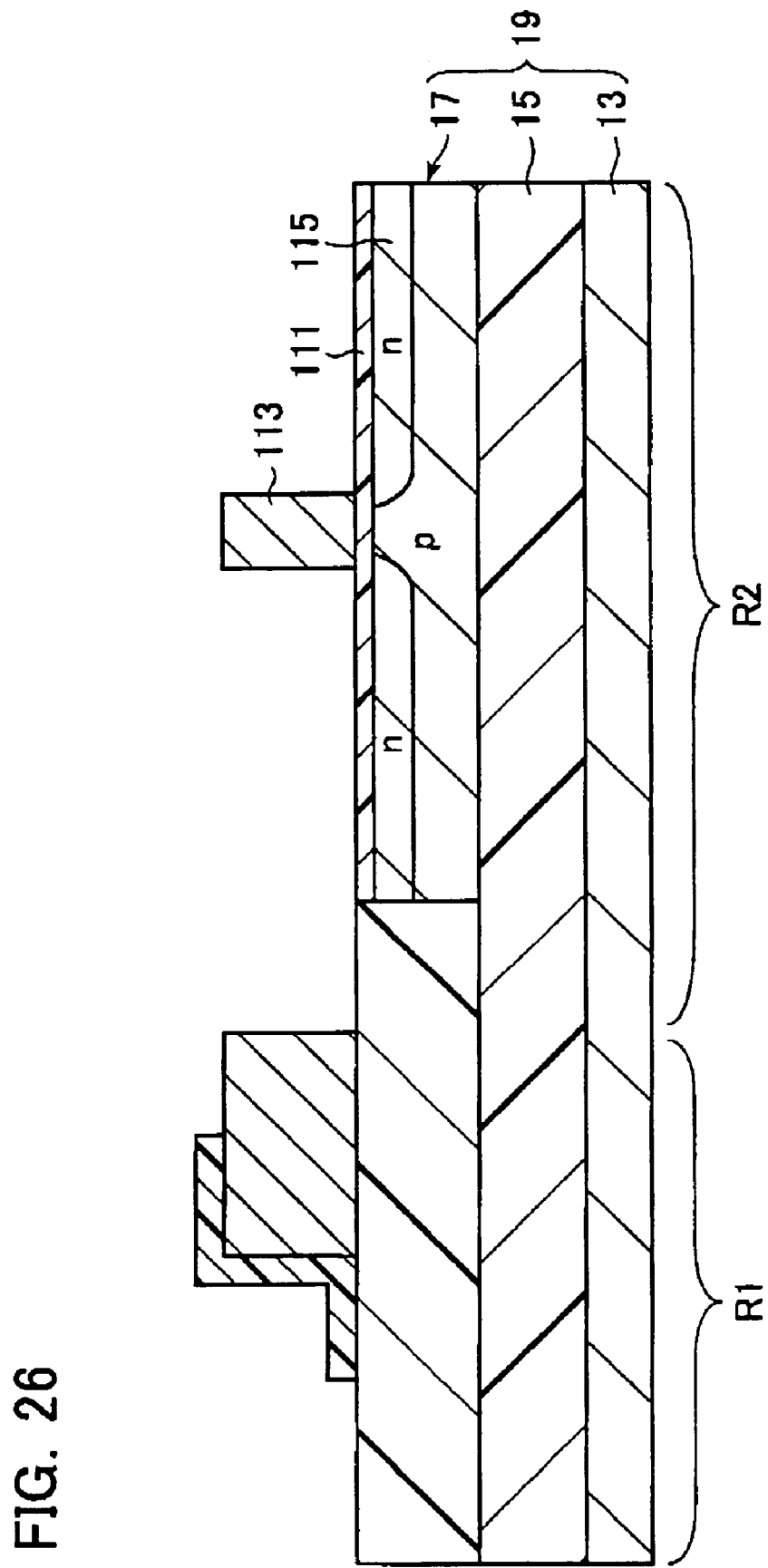
FIG. 26 is a process diagram of the tenth step in the method (boundary cross section)

As shown in FIG. 25 (A1–A2 cross-section) and FIG. 26 (cross section at the boundary between the regions R1 and R2), of a transistor contained in the logic circuit, a gate insulator film 111, a gate electrode 113 and an extension 115 are formed. A dummy pattern is formed in the region R1 for forming the semiconductor memory of FIG. 26.

A resist pattern for opening the region R1 and covering the region R2 is formed on the SOI substrate 19. The resist pattern is employed as a mask for anisotropic etching of the silicon nitride film 107 shown in FIG. 23. As a result, the silicon nitride film 45 remains on the side of the gate electrode 25, and the silicon nitride film 41 on the side of the selective epitaxial layer 29. A gap is formed between the silicon nitride film 41 and the silicon nitride film 45. This an isotropic etching allows the silicon nitride film 107 (or the insulator film 37) to stay in the trench 35. The impurity region isolation region 11 consists of the trench 35 and the insulator film 37.

Figure 27:
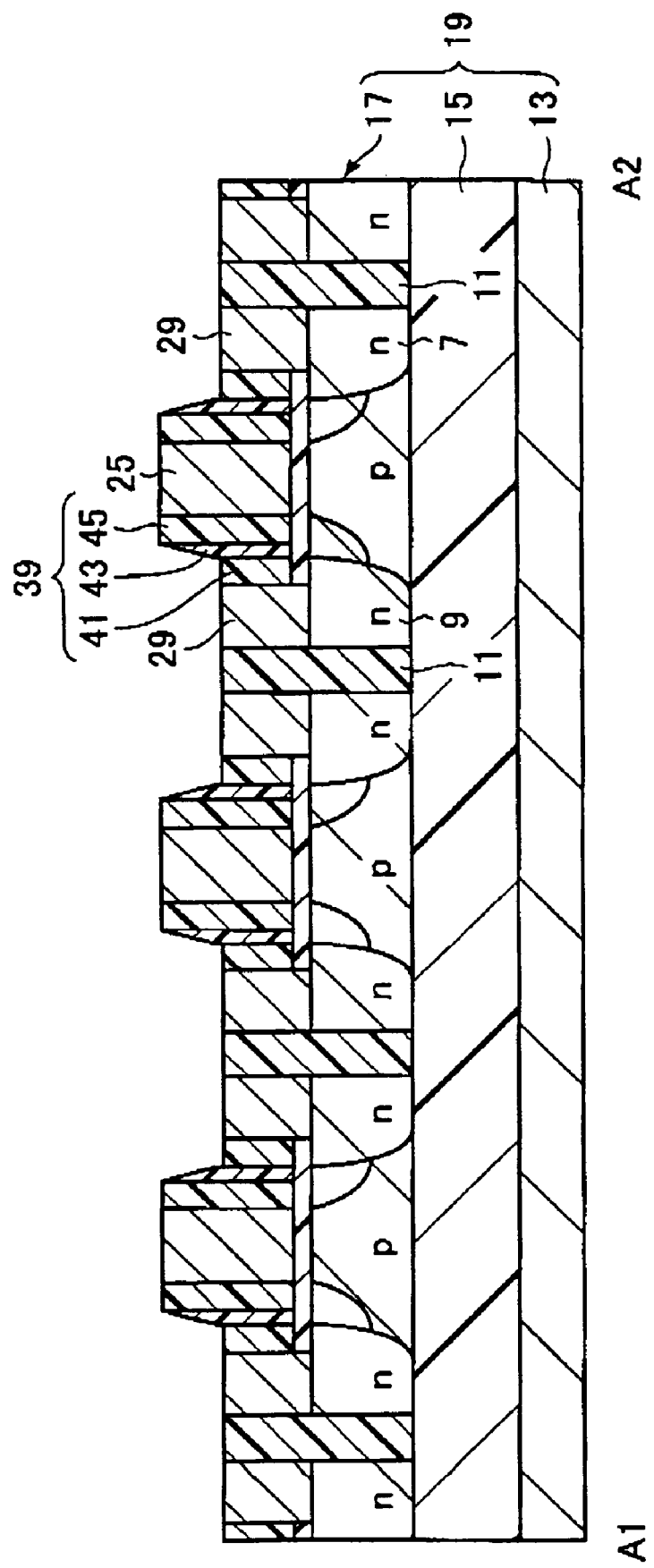
FIG. 27 is a process diagram of an eleventh step in the method (A1–A2 cross section)
Figure 28:
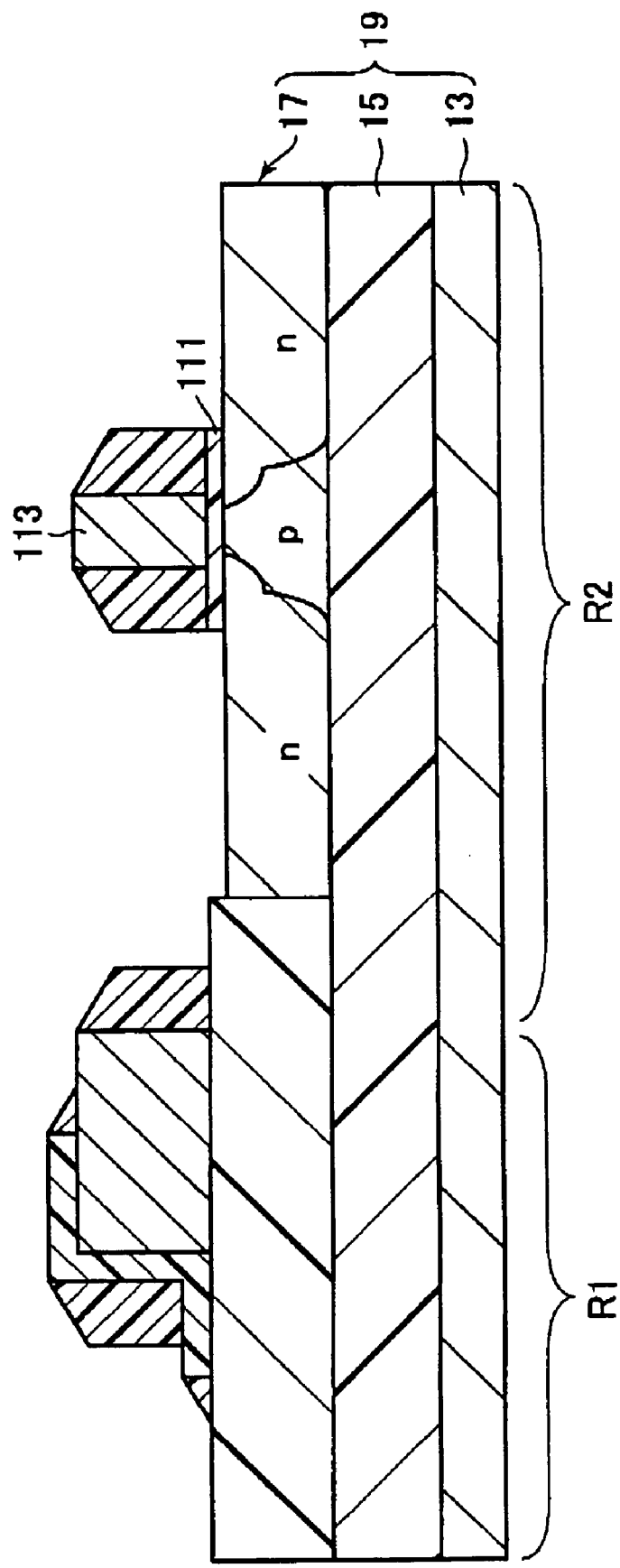
FIG. 28 is a process diagram of the eleventh step in the method (boundary cross section)

As shown in FIG. 27 (A1–A2 cross section) and FIG. 28 (cross section at the boundary between the regions R1 and R2), a silicon oxide film 43 is formed by CVD over the SOI substrate 19, and the film 43 is then etched back. This leads to completion of the sidewall 39 consisting of films of the silicon nitride 41, the silicon oxide 43 and the silicon nitride 45. The sidewall 39 may consist of either the silicon oxide or the silicon nitride only.

Then, ions of a high-concentration n-type impurity are implanted into the gate electrode 25 and the selective epitaxial layer 29 at a dose of from $10^{15}$ cm$^{-2}$ to $10^{14}$ cm$^{-2}$, followed by RTA to activate the impurity. On the other hand, a conventional method is employed to form transistors in the region R2 for forming the logic circuit.

As shown in FIG. 2A, after the use of the hydrofluoric acid to remove the thin oxide film from the surface of the selective epitaxial layer 29, a high-melting-point metal is layered over the SOI substrate 19 (for example, cobalt is layered by spattering). Through thermal processing, the suicide 31 is formed on the selective epitaxial layer 29, and the suicide 33 on the gate electrode 25 by self-alignment. Formation of cobalt-silicide 31, 33 requires a thickness of silicon almost same as that of the silicide 31, 33. Formation of the silicide 31 with a thickness of 30 nm consumes the selective epitaxial layer 29 by a thickness of 30 nm. In a resultant structure, the 30-nm-thick silicide 31 is formed on the 100-nm-thick selective epitaxial layer 29. If the selective epitaxial layer is not formed as mounting on the device isolation region 3 to some extent, the upper corner of the epitaxial layer exposes outward when a hydrofluoric acid etching is performed immediately before the spattering. In this case, silicide is formed at a lower location, and a junction leakage increases. To avoid this problem, the selective epitaxial layer is formed as mounting on the device isolation region 3. The formation of the layer mounting on the device isolation region is effective to ensure the connection even if the lower portion 53 of the drain plug DP is displaced.

The interlayer insulator film 47 is formed over the SOI substrate 19. The lower portion 53 of the drain plug DP to be connected to the drain region 7 is buried in the film 47, and the source line SL to be connected to the source region 9 is also buried therein. The interlayer insulator film 55 is formed on the interlayer insulator film 47. The upper portion 59 of the drain plug DP to be connected to the lower portion 53 is buried in the film 55. Finally, the bit line BL to be connected to the drain plug DP is formed on the interlayer insulator film 55.

Second Embodiment

Structure of Semiconductor Memory Device

Figure 31:
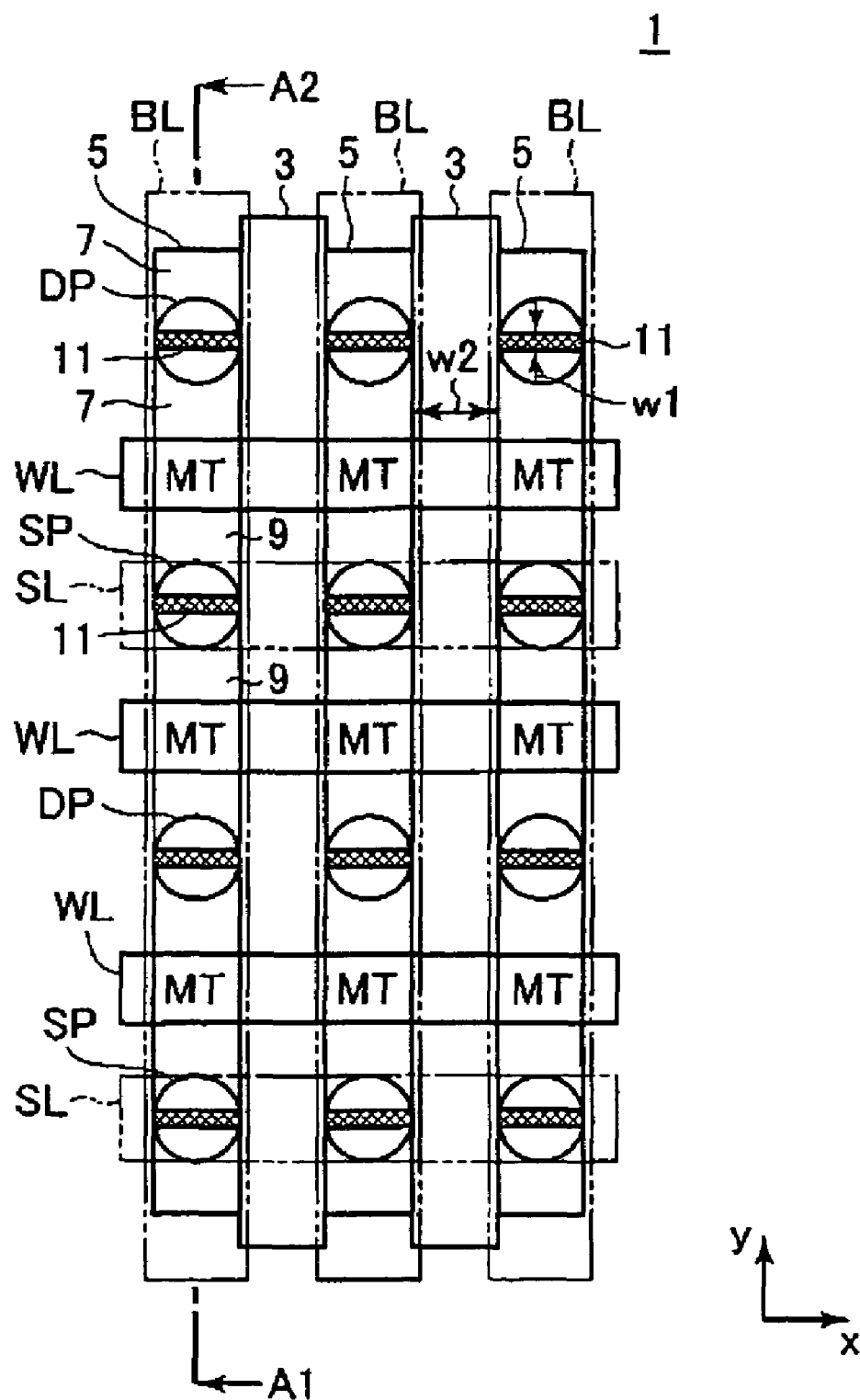
FIG. 31 is a plan view of part of a cell array in a semiconductor memory device according to a second embodiment.
Figure 32:
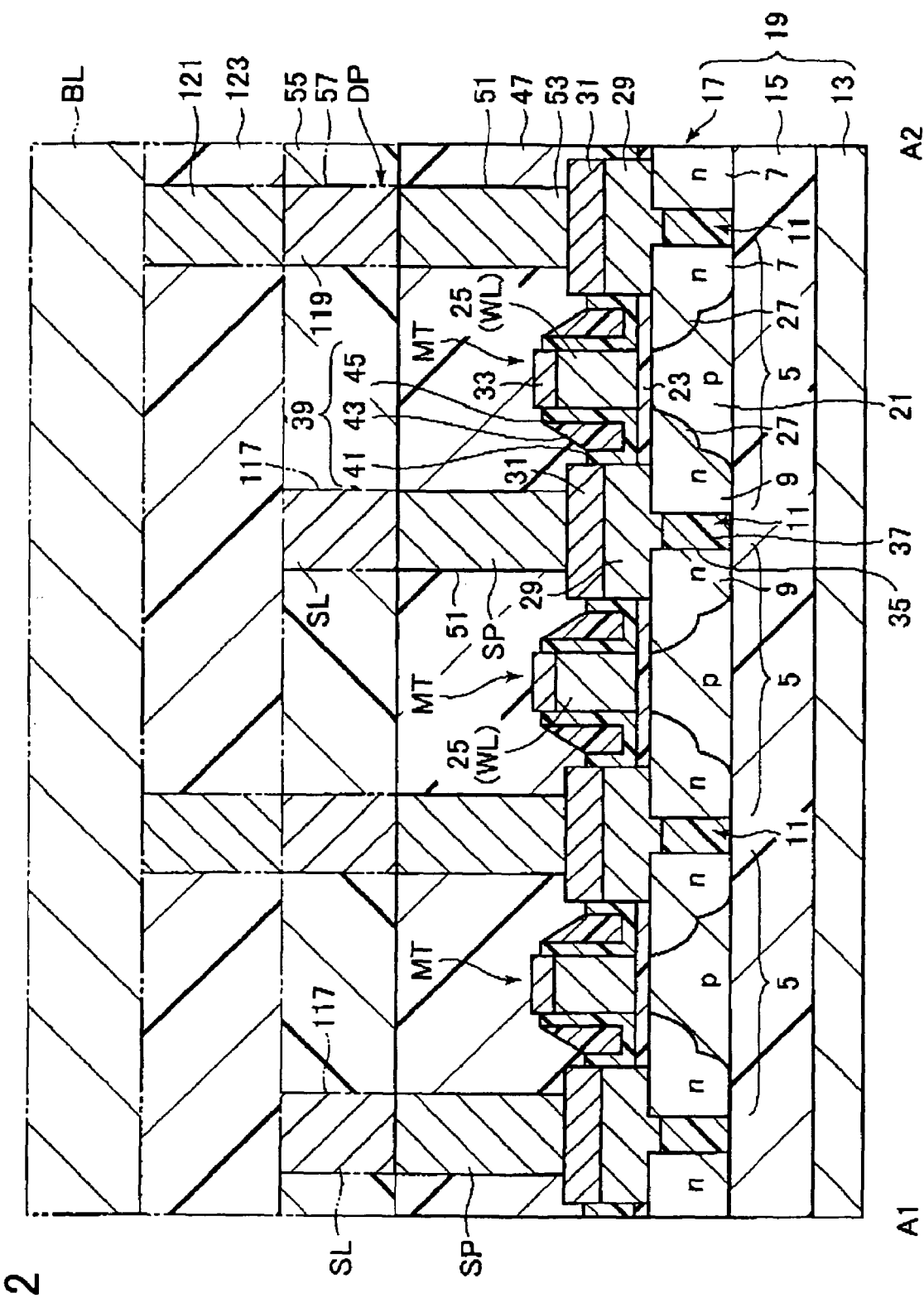
FIG. 32 is a cross-sectional view taken along A1–A2 line in FIG. 31.

FIG. 31 is a plan view of part of the cell array 1 in a semiconductor memory device according to a second embodiment, which corresponds to FIG. 1 in the first embodiment. FIG. 32 is a cross-sectional view taken along A1–A2 line in FIG. 31. The second embodiment differs in structure from the first embodiment mainly in the following points.

The impurity region isolation region 11 is formed in the silicon layer 17 from the bottom to the vicinity of the surface. Accordingly, the impurity region isolation region 11 is not formed in the selective epitaxial layer 29 (an example of the second semiconductor layer) and the suicide 31. Thus, on adjacent drain regions 7 (source regions 9), portions of the selective epitaxial layer 29 are continuous and portions of the silicide 31 are continuous.

In the second embodiment, as the portions of the selective epitaxial layer 29 are continuous and the portions of the silicide 31 are continuous, the area of these portions can be increased. The interface resistance between silicide 31 and the selective epitaxial layer 29 or silicon is relatively large. Though, if they have a large contact area therebetween as in the second embodiment, the parasitic resistance can be reduced.

In the second embodiment, the impurity region isolation region 11 is formed in the silicon layer 17 from the bottom to the vicinity of the surface. Therefore, this impurity region isolation region 11 has the same structure as the STI, which can electrically separate the channel bodies 21 in adjacent memory transistors MT from each other. This is effective to prevent the parasitic bipolar transistor described in the first embodiment from operating, and accordingly avoid data destruction in the memory transistors MT.

The source line SL in the second embodiment is connected to the source region 9 via a source plug SP. In a more detailed discussion, the source plug SP is buried into the through-hole 51 in the interlayer insulator film 47. This plug SP is in contact with the silicide 31 on the source region 9. The source line SL is buried into a trench 117 in the interlayer insulator film 55 and in contact with the source plug SP.

As the source line SL is formed in a one-level higher layer, the bit line BL is also formed in a one-level higher layer. Accordingly, an intermediate portion 119 is buried in the interlayer insulator film 55 and in contact with the lower portion 53 of the drain plug DP. On the interlayer insulator film 55, an interlayer insulator film 123 is formed to bury the upper portion 121 of the drain plug DP therein, which is contacted with the intermediate portion 119. The bit line BL is formed on the interlayer insulator film 123 and in contact with the upper portion 121.

Method of Manufacturing Semiconductor Memory Device

A method of manufacturing the semiconductor memory device according to the second embodiment is described with reference to FIGS. 33–41. These figures are cross-sectional views (A1–A2 cross sections) of the SOI substrate and other portions showing this manufacturing method in order of process steps. First, the device isolation regions 3 are formed as in the first embodiment (FIGS. 12 and 13).

Figure 33:
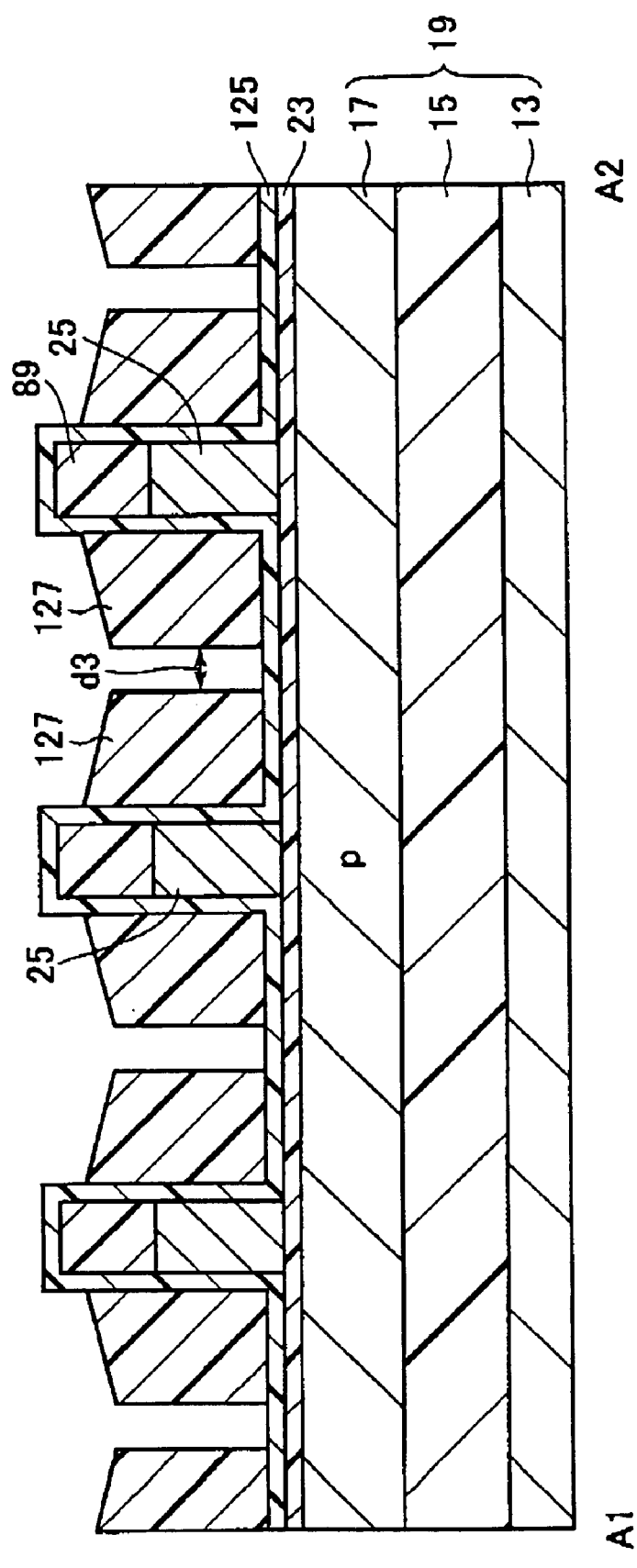
FIG. 33 is a process diagram of a first stop in a method of manufacturing the semiconductor memory device according to the second embodiment.

After the step of FIG. 14 described in the first embodiment, as shown in FIG. 33, CVD is applied to form an about 15-nm-thick silicon nitride film 125 and a 200-nm-thick TEOS (Tetraethyl orthosilicate) film in order over the SOI substrate 19. The TEOS film is to be turned into a sidewall 127 (an example of the first sidewall). Through an anisotropic etching of the TEOS film, the sidewall 127 is formed on each side of the gate electrode 25. In this case, the distance d3 between the sidewalls 127 located between the gate electrodes 25 can be controlled smaller than the width w2 of the device isolation region 3 (FIG. 31). The distance between the sidewalls 127 is equal to 100 nm or less, for example.

Figure 34:
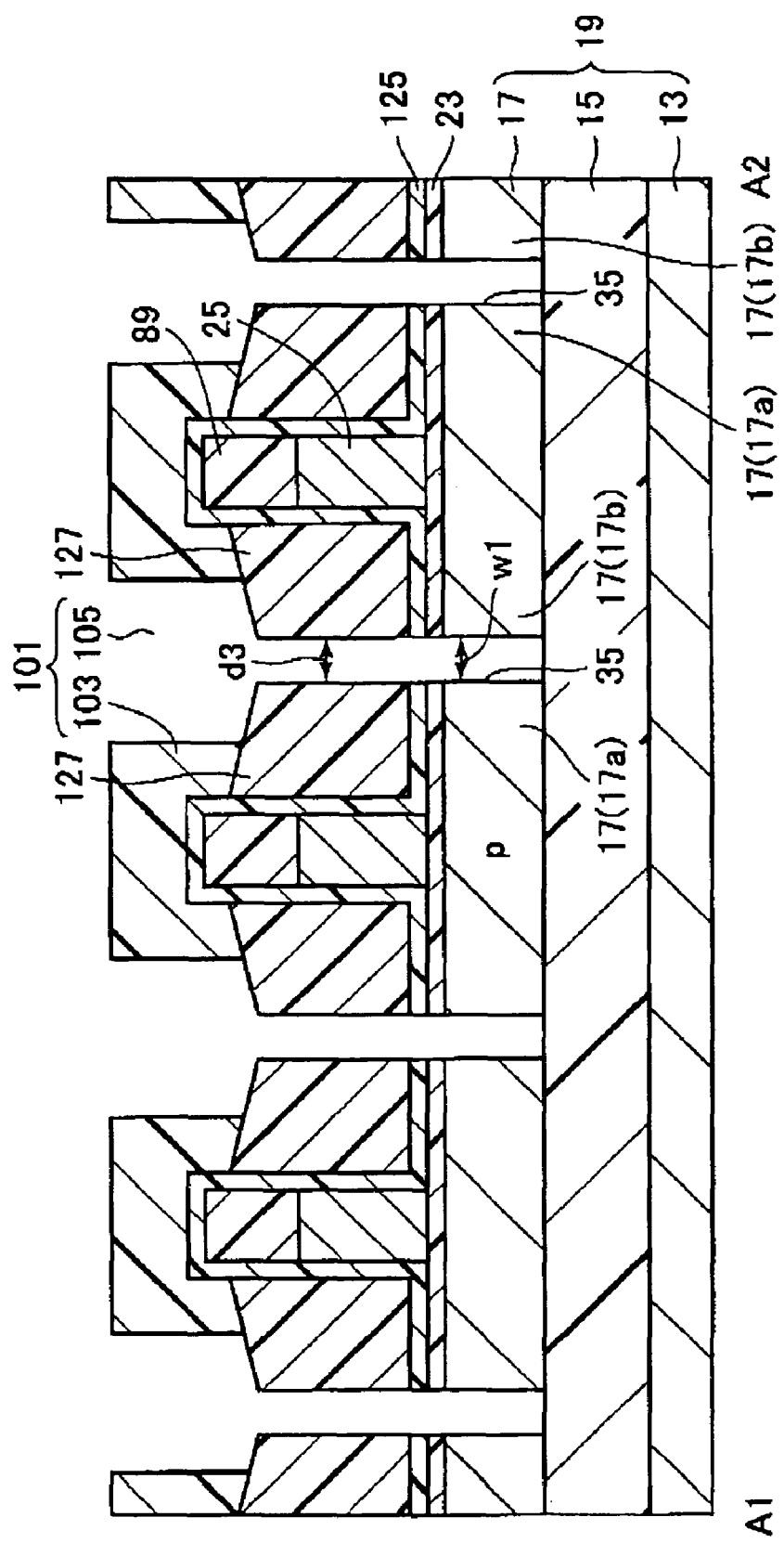
FIG. 34 is a process diagram of a second step in the method.

As shown in FIG. 34, the resist pattern 101 of FIG. 21 is formed on the SOI substrate 19. The resist pattern 101 and the sidewall 127 are employed as a mask for etching the silicon nitride film 125 and the gate insulator film 23 between the sidewalls 127 such that the surface of the silicon layer 17 exposes. The resist pattern 101 and the sidewall 127 are also employed as a mask for anisotropic etching to selectively remove the silicon layer 17 (an example of the first semiconductor layer). Thus, self-aligned trenches 35 are formed in the silicon layer 17 to isolate one region 17a and the other region 17b each other to be adjacent drain regions, and one region 17a and the other region 17b each other to be adjacent source regions.

Figure 35:
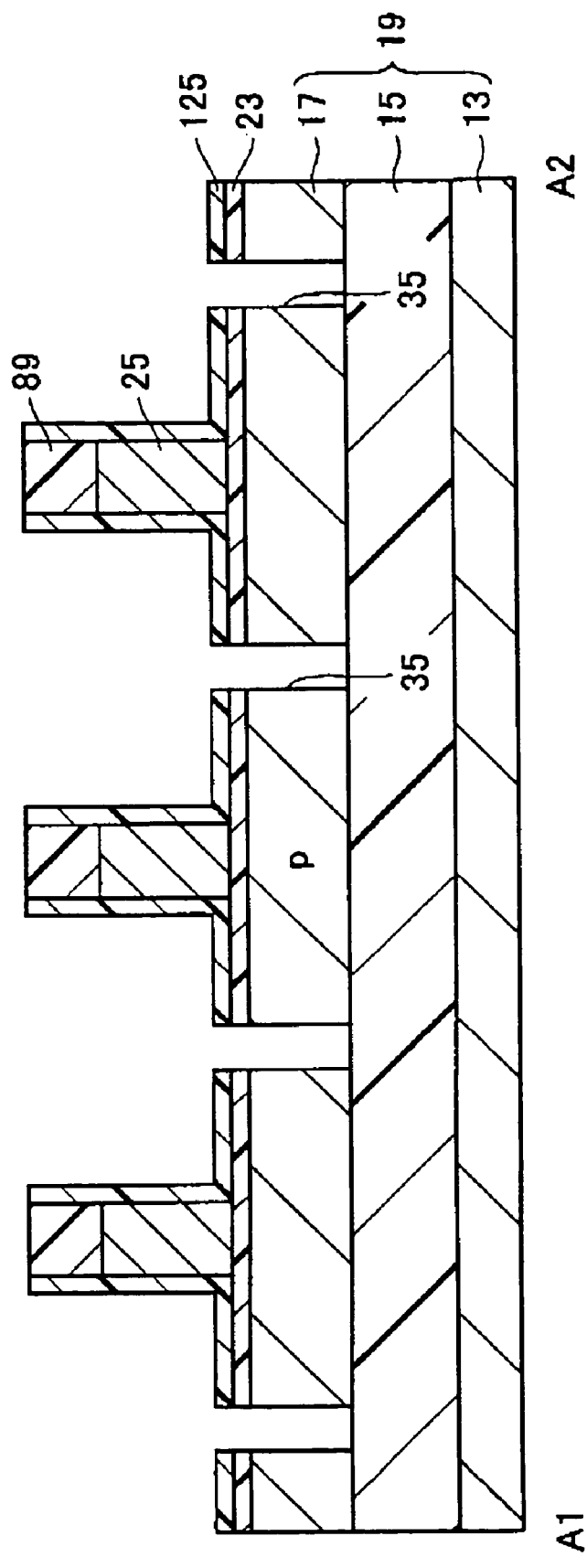
FIG. 35 is a process diagram of a third step in the method.

The width w1 of the trench 35 (or the width w1 of the impurity region isolation region 11) is same as the distance d3 between the sidewalls 127. Accordingly, the width w1 of the trench 35 is smaller than the width w2 of the device isolation region 3 (FIG. 31). After the resist pattern 101 is removed, the sidewalls 127 are removed through a vaporous hydrofluoric acid process as shown in FIG. 35.

Figure 36:
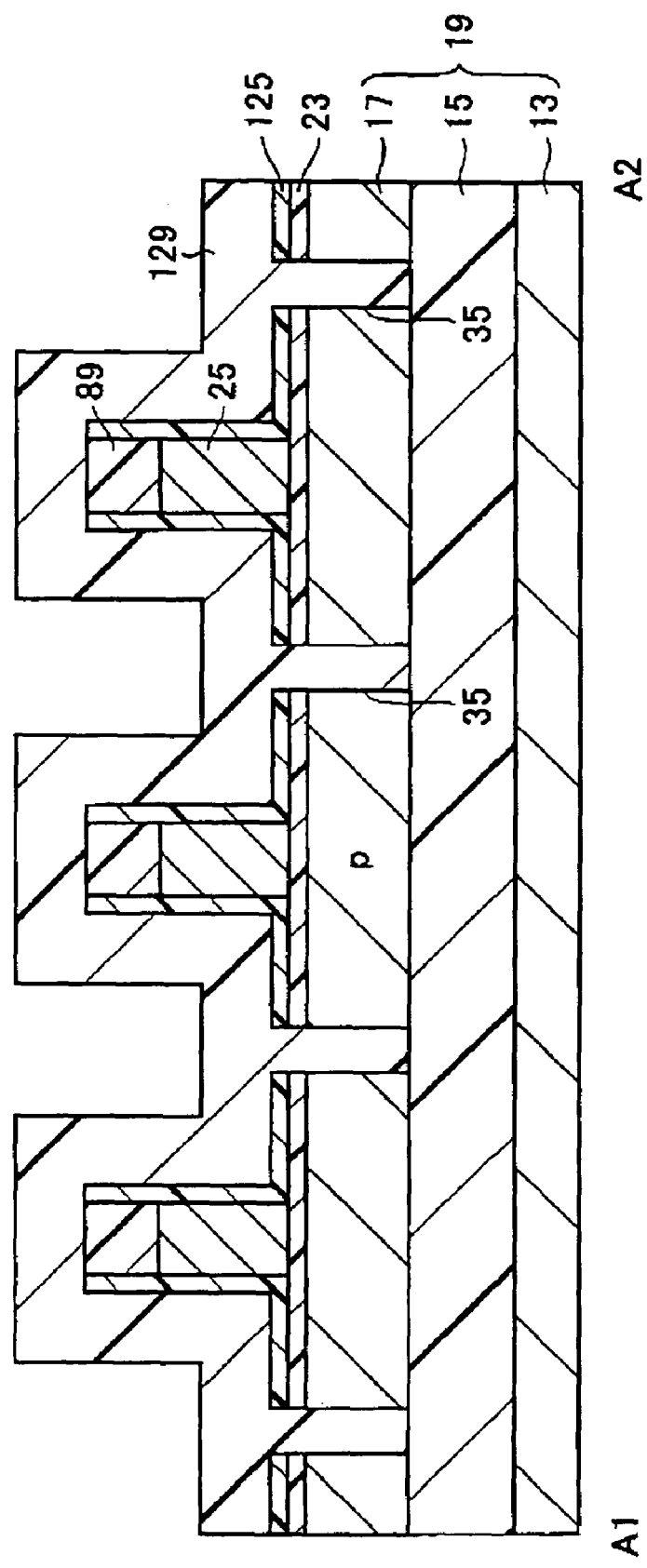
FIG. 36 is a process diagram of a fourth step in the method.
Figure 37:
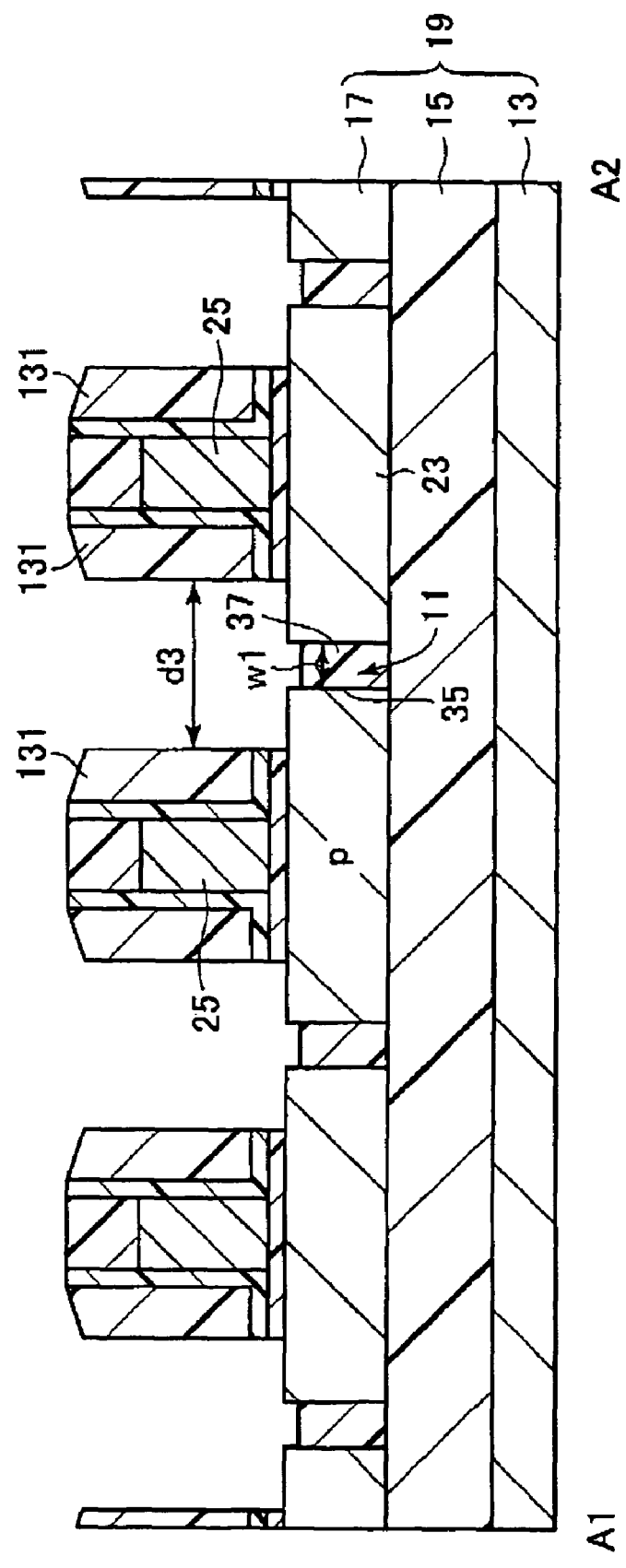
FIG. 37 is a process diagram of a fifth step in the method.

As shown in FIG. 36, CVD is applied to form a silicon nitride film 129 with a thickness of about 150 nm over the SOI substrate 19 to fill the trenches 35 with the film. The silicon nitride film 129 is then subjected to an anisotropic etching to form a sidewall 131 (an example of the second sidewall) on each side of the gate electrode 25 as shown in FIG. 37. The distance d3 between the sidewalls 131 located between the gate electrodes 25 is designed larger than the width w1 of the trench 35. The etching forms the impurity region isolation region 11 that includes the insulator film 37 (silicon nitride film 129) buried in the trench 35.

Figure 38:
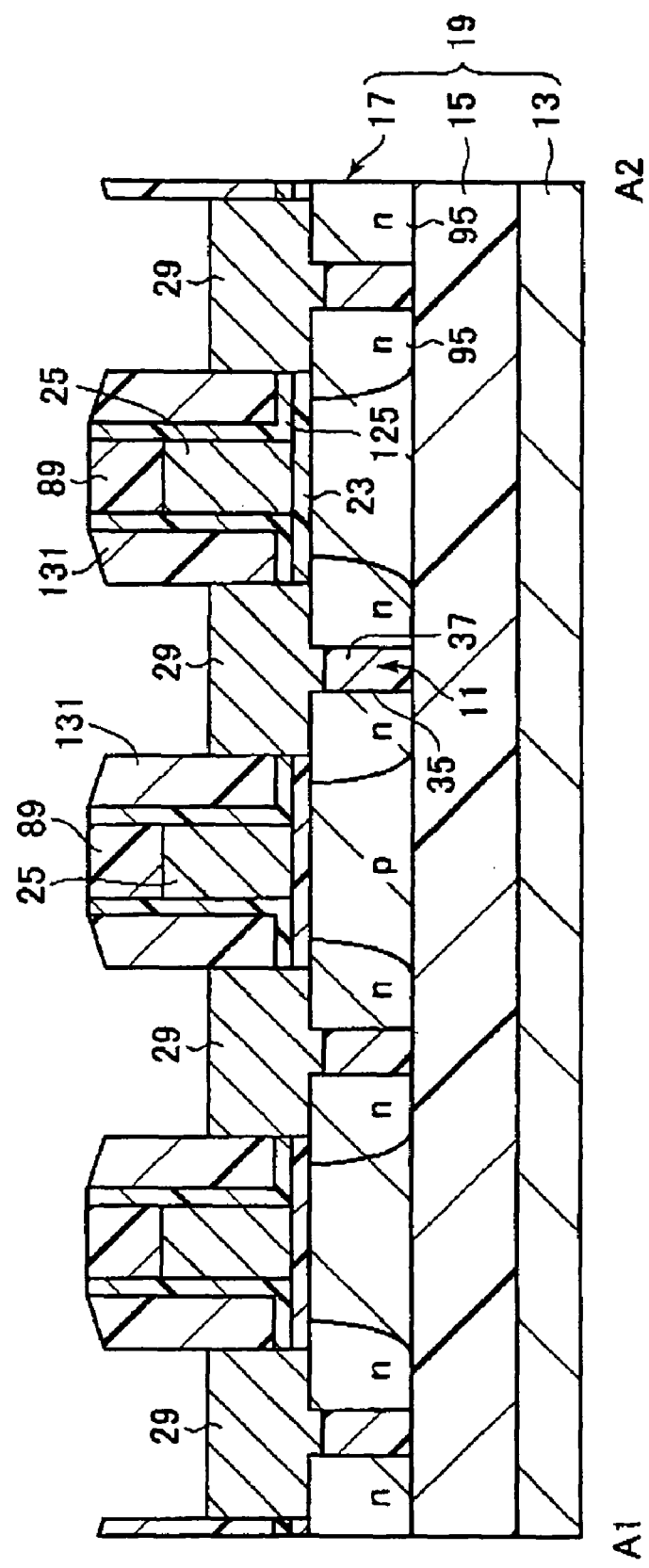
FIG. 38 is a process diagram of a sixth step in the method.

As shown in FIG. 38, ions of an n-type impurity are implanted into the silicon layer 17 to form a low-concentration n-type impurity region 95, which is turned into drain and source regions. After the sidewalls 131 are formed, a process of selective epitaxial growth is applied to form the selective epitaxial layer 29 on the silicon layer 17 between the gate electrodes 25 similar to the first embodiment (FIG. 19A). This epitaxial growth is performed after the insulator film 37 composed of silicon nitride is buried in the trench 35. The epitaxial layer growing from the silicon layer 17 using it as a seed easily extends laterally on the silicon nitride film rather than the silicon oxide film. Accordingly, portions of the selective epitaxial layer 29 growing from portions of the silicon layer 17 separated by the impurity region isolation region 11 can be made continuous.

Figure 39:
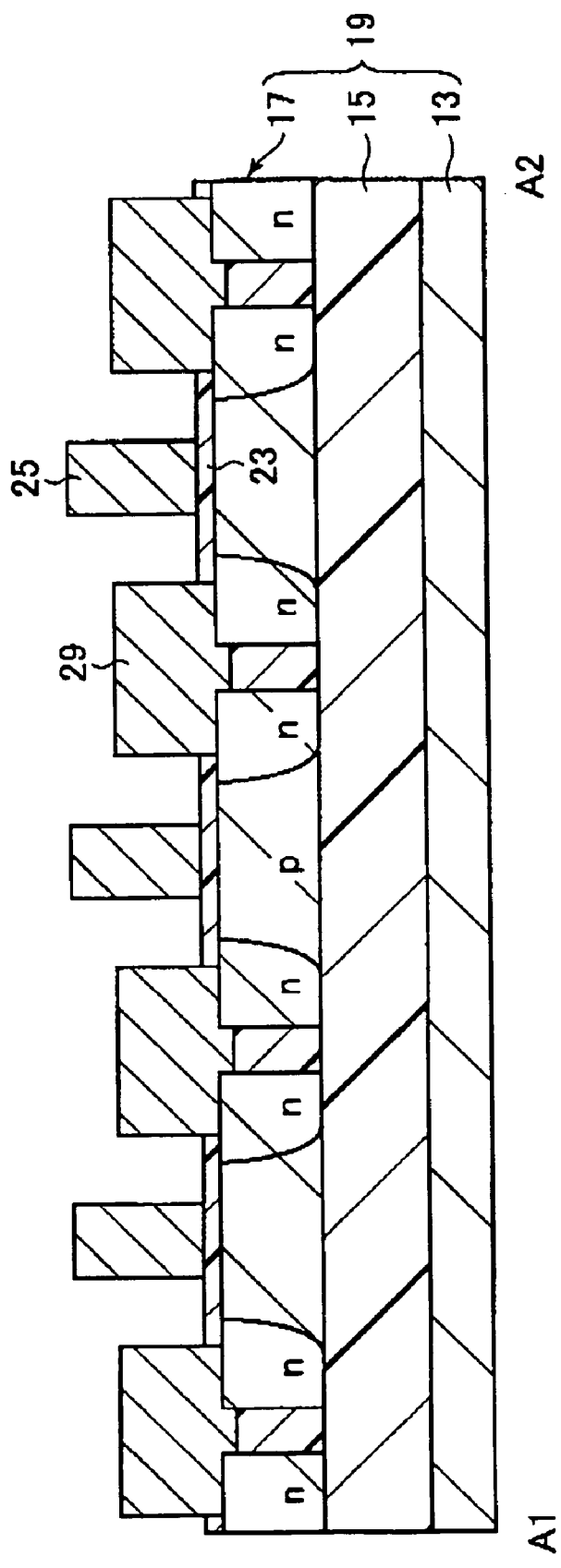
FIG. 39 is a process diagram of a seventh step in the method.
Figure 40:
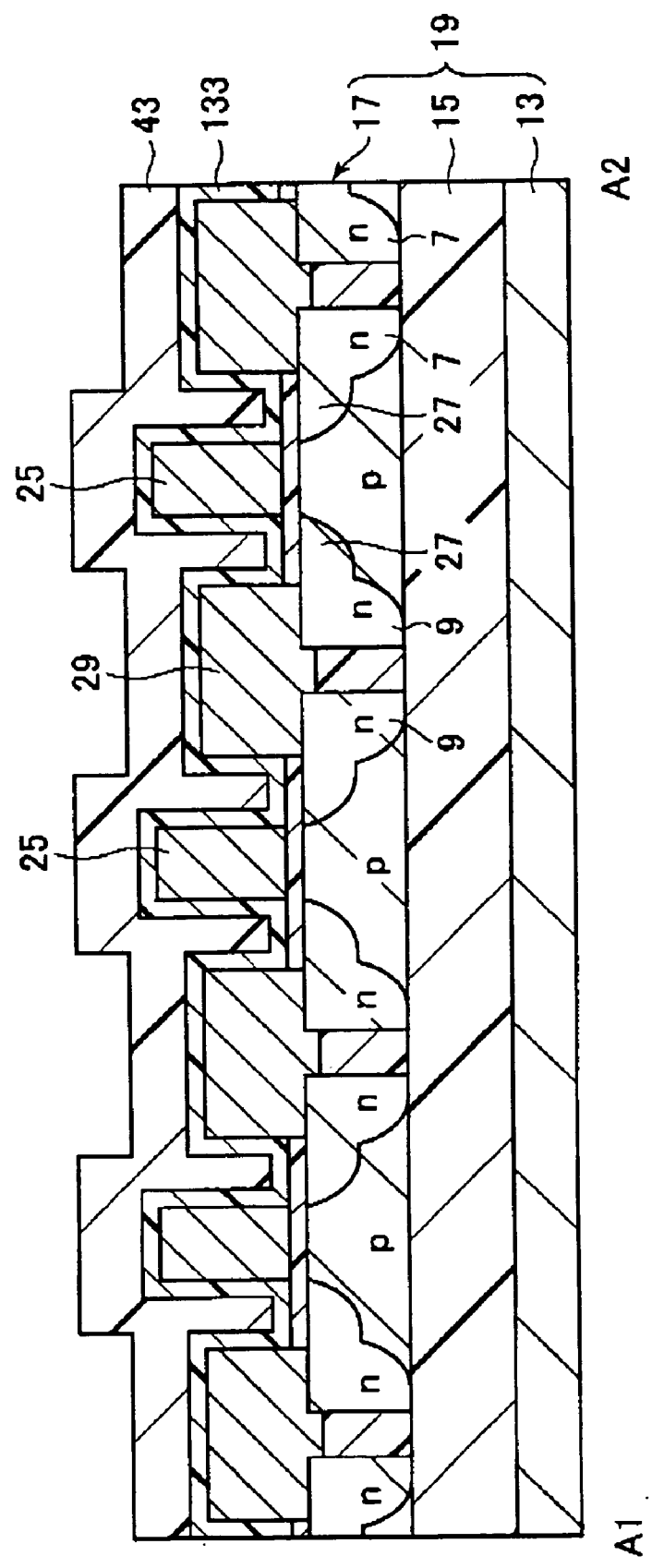
FIG. 40 is a process diagram of an eighth step in the method.

A hot phosphoric acid process is then applied to peal off the silicon nitride films 89, 125 and the sidewalls 131 (FIG. 39). Thereafter, then-type low-concentration impurity region 27 is formed in the silicon layer 17 to complete the drain region 7 and the source region 9 as shown in FIG. 40. The step of forming the regions 7 and 9 is same as that of FIG. 22 in the first embodiment. A silicon nitride film 133 with a thickness of about 30 nm is formed by CVD over the SOI substrate 19, leaving a gap between the gate electrode 25 and the selective epitaxial layer 29. The silicon oxide film 43 is formed by CVD over the SOI substrate 19 so as to fill the gap with the film.

Figure 41:
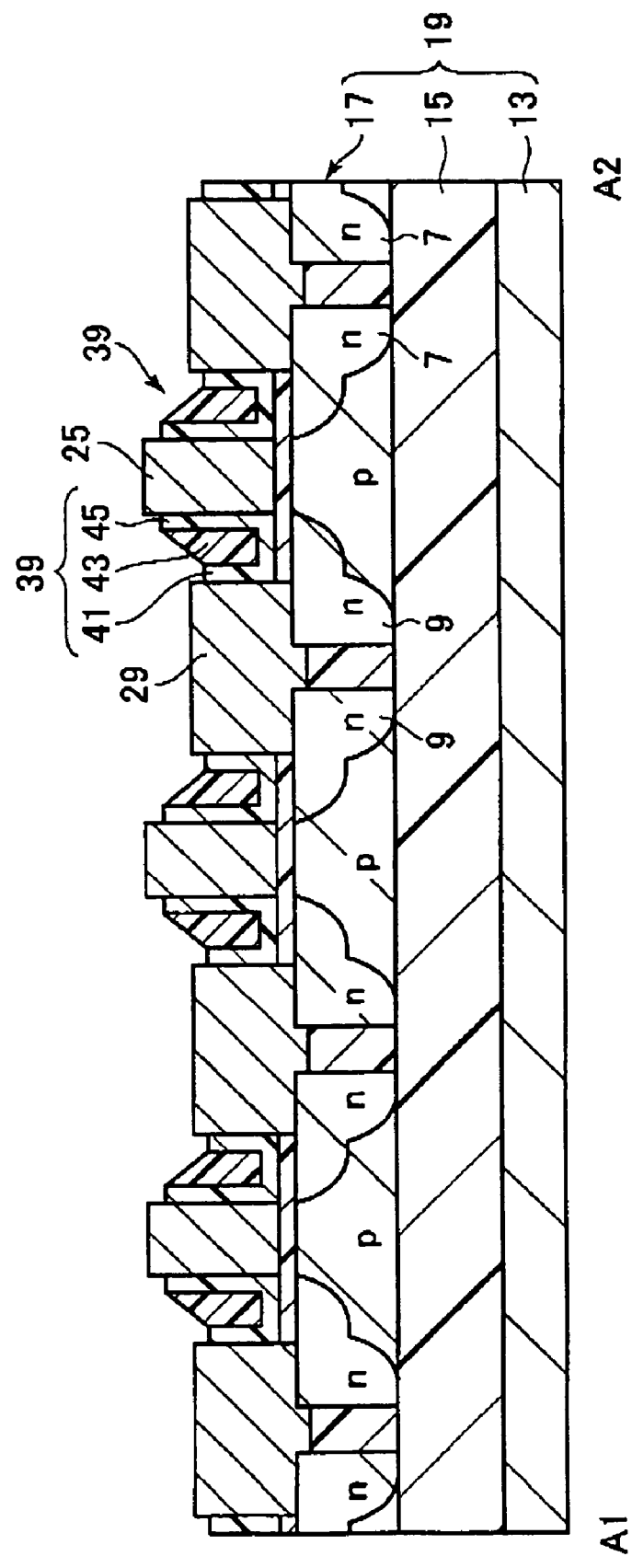
FIG. 41 is a process diagram of a ninth step in the method.

As shown in FIG. 41, the silicon oxide film 43 and the silicon nitride film 133 in FIG. 40 are etched back to form the sidewalls 39 on the sides of the gate electrodes 25. The silicon nitride film 133 (FIG. 40) includes the silicon oxide film 41 located on the side of the selective epitaxial layer 29 and the silicon oxide film 45 located on the side of the gate electrode 25.

Similar to the step of FIG. 27 in the first embodiment, ions of a high-concentration n-type impurity are implanted into the gate electrode 25 and the selective epitaxial layer 29, followed by RTA to activate the impurity. Subsequent steps are same as those in the first embodiment.

Third Embodiment

A third embodiment is directed to a method of manufacturing a structure that connects the portions of the selective opitaxial layer 29 with each other and connects the portions of the silicide 31 with each other. These portions are located on the isolated adjacent dram regions 7 (source regions 9) as shown in FIG. 32 similar to the second embodiment. The third embodiment differs from the second embodiment mainly in simultaneous execution of patterning of the gate electrode 25 and formation of the trench 35 serving as the impurity region isolation region 11.

The manufacturing method according to the third embodiment is described with reference to FIGS. 42–46. These figures are cross-sectional views (A1–A2 cross sections) of the SOI substrate and other portions showing this manufacturing method in order of process steps. First, the device isolation regions 3 are formed as in the first embodiment (FIGS. 12 and 13). Then, the resist pattern 81 is peeled off.

Figure 42:
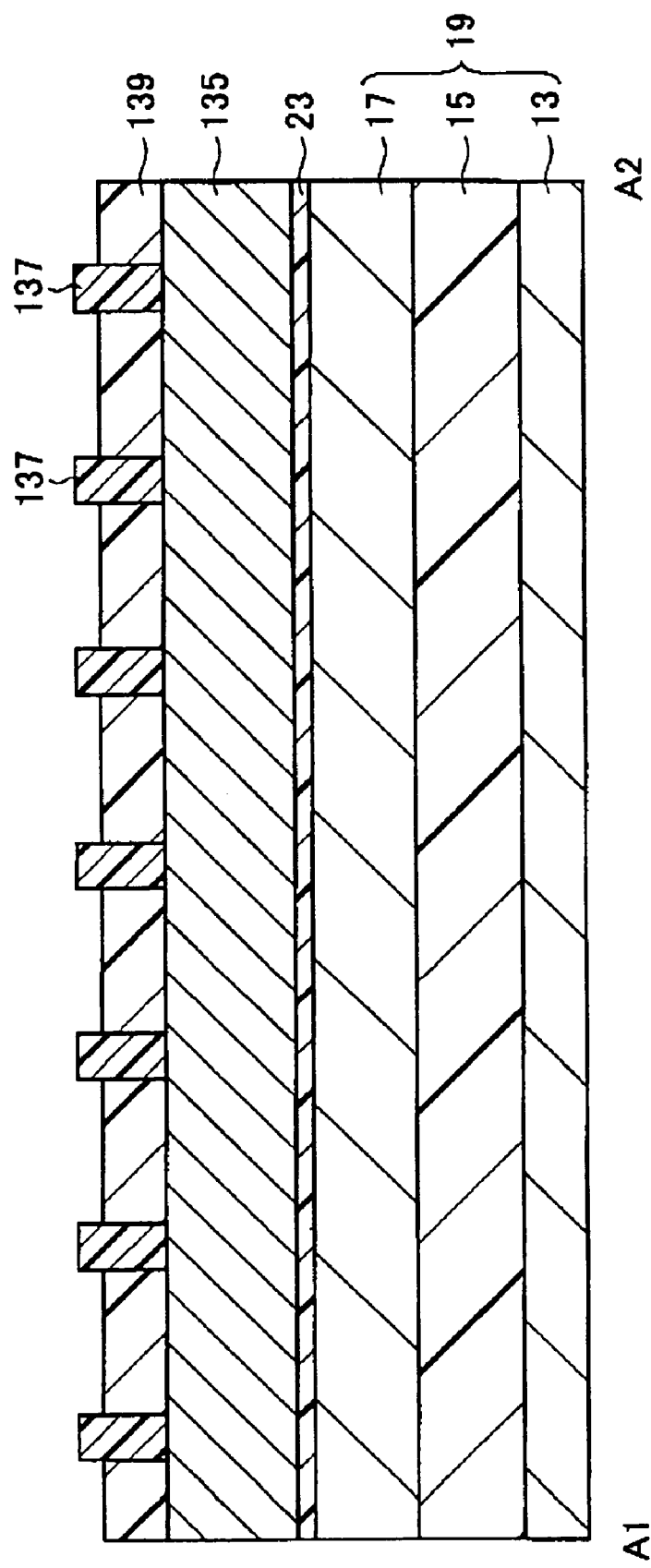
FIG. 42 is a process diagram of a first step in a method of manufacturing the semiconductor memory device according to a third embodiment.

As shown In FIG. 42, the gate insulator film 23 is formed by thermal oxidation on the silicon layer 17. Then, CVD is applied to form a polysilicon film 135 (an example of the third semiconductor layer), which is to be turned into the gate electrodes, and a silicon nitride film 137. Thereafter, photolithography and anisotropic etching processes are employed for patterning the silicon nitride film 137. The silicon nitride film 137 stays on the regions for forming trenches and gate electrodes. A silicon oxide film 139 is formed over the SOI substrate 19, and then the film 139 is etched back such that the silicon nitride film 137 exposes.

Figure 43:
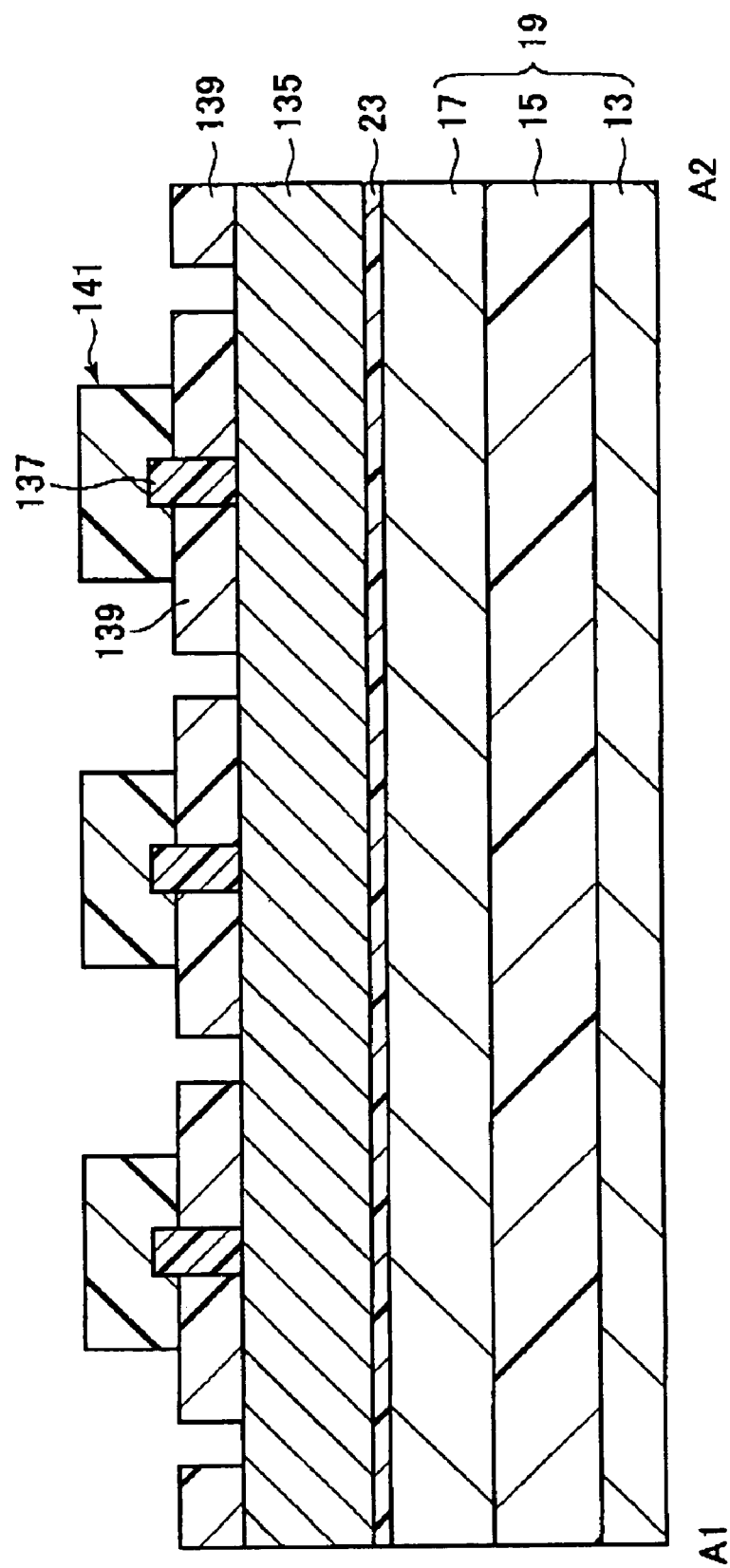
FIG. 43 is a process diagram of a second step in the method.

As shown in FIG. 43, a resist pattern 141 is formed to cover the silicon nitride film 137 located on the region for forming the gate electrode. The pattern 141 is employed as a mask for removing the silicon nitride film 137 located on the region for forming the trench.

Figure 44:
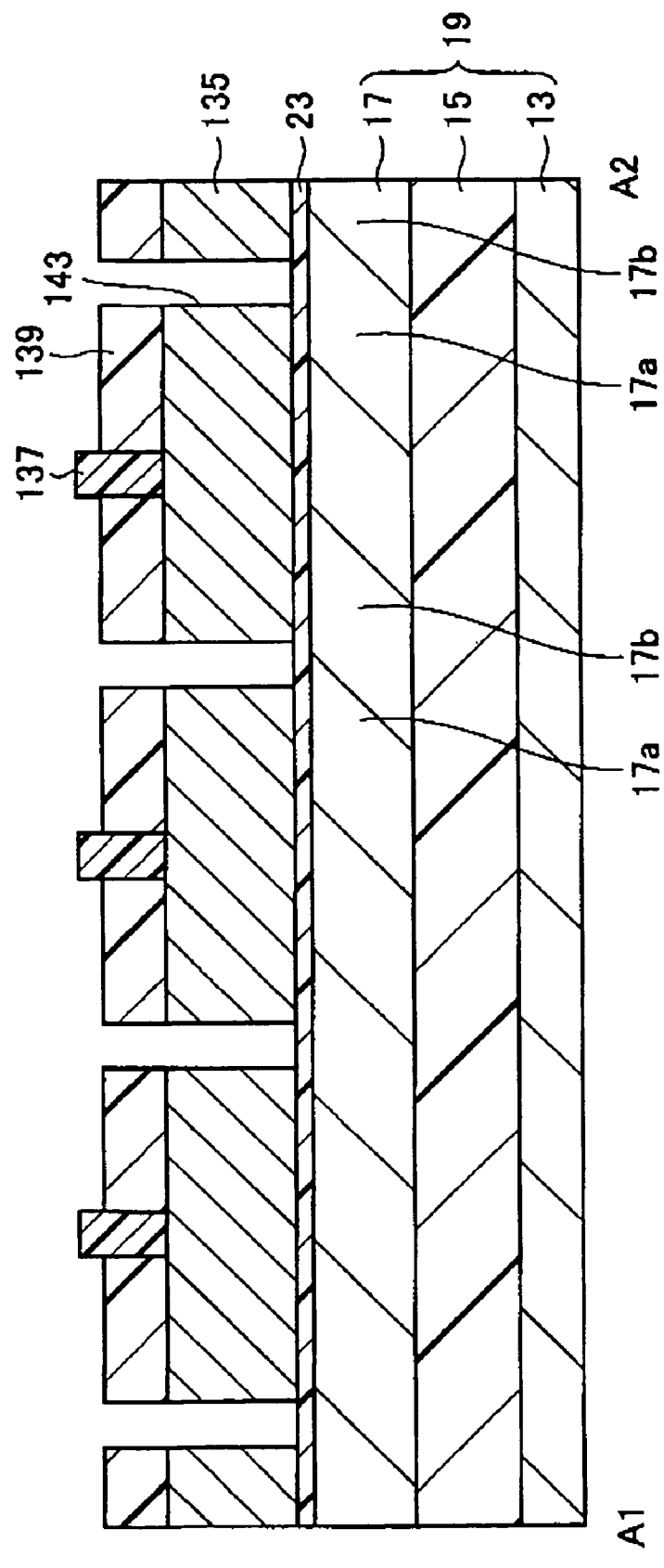
FIG. 44 is a process diagram of a third step in the method.

Subsequently, the pattern 141 and the silicon oxide film 139 are employed as a mask for selectively removing the polysilicon film 135 as shown in FIG. 44 to form a trench 143 (an example of the first trench) in the polysilicon film 135. The trench 143 has a width smaller than the width w2 of the device isolation region 3 (FIG. 31). The trench 143 is formed on a boundary between one region 17a and the other region 17b in adjacent drain regions, and on a boundary between one region 17a and the other region 17b in adjacent source regions, respectively.

Figure 45:
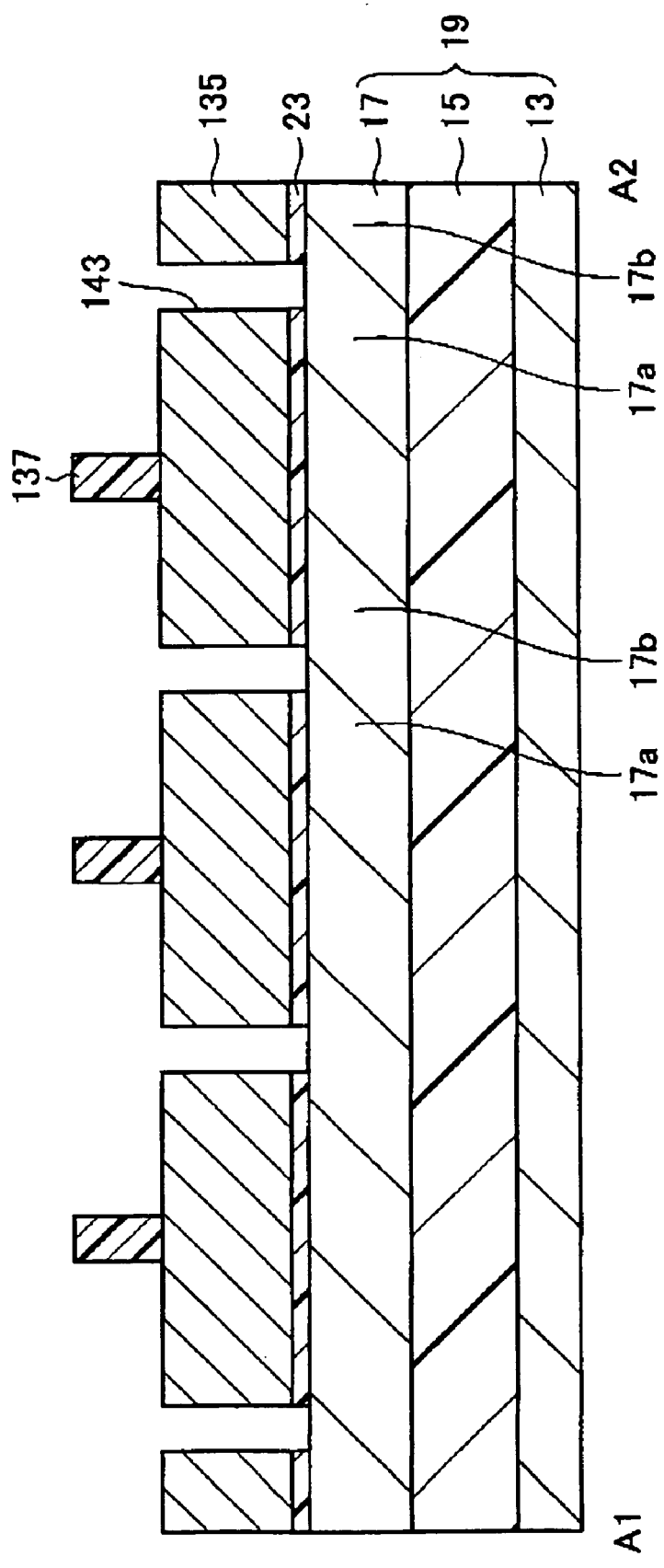
FIG. 45 is a process diagram of a fourth step in the method.
Figure 46:
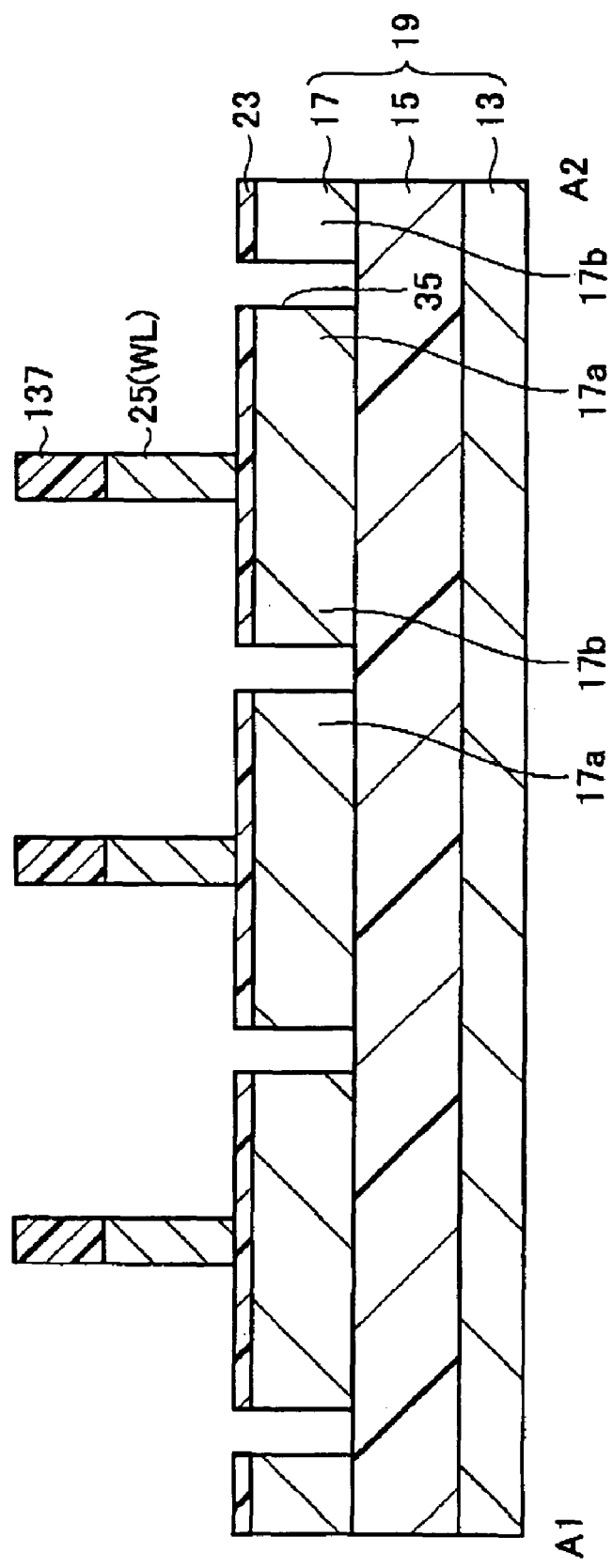
FIG. 46 is a process diagram of a fifth step in the method.

After the resist pattern 141 is peeled off, as shown in FIG. 45, an anisotropic etching is applied to remove the silicon oxide film 139 and the gate insulator film 23 located on the bottom of the trench 143. Then, the silicon nitride film 137 (an example of the mask pattern for gate electrodes) is employed for anisotropic etching to selectively remove the polysilicon film 135, which includes the trench 143, and the silicon layer 17.

Thus, (1) the self-aligned trench 35 is formed in the silicon layer 17 so as to have a smaller width than that of the device isolation region. The trench isolates one region 17a and the other region 17b each other to be adjacent drain regions, and one region 17a and the other region 17b each other to be adjacent source regions. Simultaneously, (2) the polysilicon film 135 is patterned to form a plurality of word lines WL containing the gate electrodes 25 separately from each other on the gate insulator film 23. Subsequent steps are same as those shown in FIG. 36 and following figures in the second embodiment.

Fourth Embodiment

Structure of Semiconductor Memory Device

Figure 47:
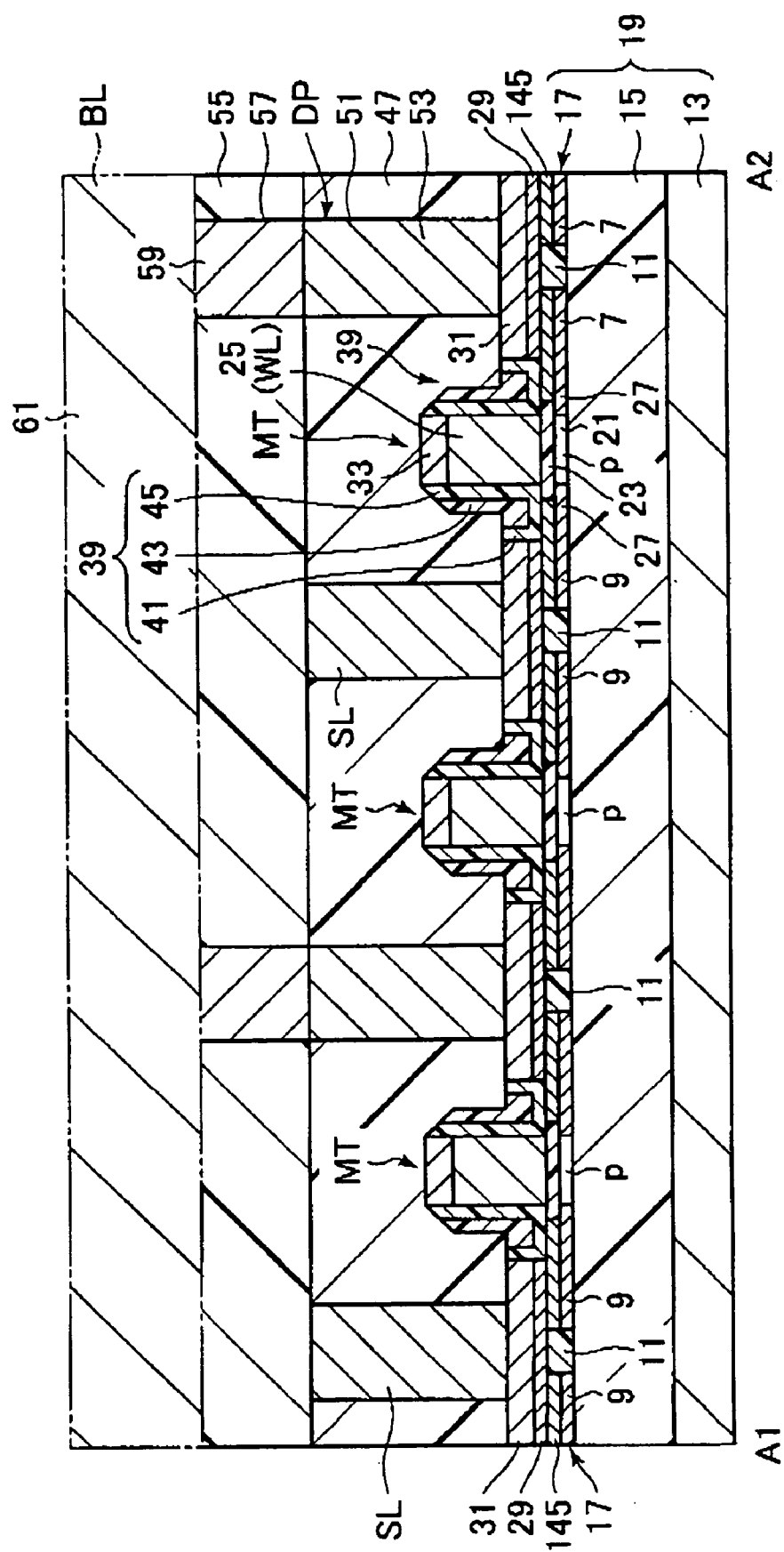
FIG. 47 is across-sectional view of a semiconductor memory device according to a fourth embodiment (A1–A2 cross section)

FIG. 47 is across-sectional view of a semiconductor memory device according to a fourth embodiment (A1–A2 cross section). The fourth embodiment has a main characteristic in an n-type selective epitaxial layer 145 (an example of the semiconductor intermediate layer) that is located between the drain region 7 (source region 9) and the selective epitaxial layer 29 to connect them with each other.

A thinned channel body yields the following effects (1) and (2). (1) A junction capacitance between the channel body and the drain region (source region) can be reduced to enlarge a signal difference between data "0" and data "1". This is effective to prevent erroneous data read. (2) A leakage current between the channel body and the drain region (source region) can be reduced to elongate a data holding time. Thus, the thinned channel body can improve the performance of the memory.

The thinned silicon layer 17, however, increases the resistance of the low-concentration region (LDD) 27 in the drain region 7 and the source region 9. In addition, as detailed in Fifth Effect of the first embodiment, the ion implantation of the high-concentration n-type impurity increases the resistance in the high-concentration region because it is turned into amorphous. The fourth embodiment is provided with the selective epitaxial layer 145, and accordingly the low-concentration region 27 consists of two layers: the silicon layer 17 (20 nm, for example); and the selective epitaxial layer 145 (40 nm, for example). Thus, the low-concentration region 27 has a larger thickness than that of the channel body 21 (silicon layer 17). Accordingly, the resistance in the low-concentration region 27 can be lowered while reducing the thickness of the silicon layer 17. In addition, as the high-concentration region has a thickness more than 50 nm, the resistance thereof also can be lowered.

The fourth embodiment has another characteristic in structure, which is described below. Portions of the selective epitaxial layer 145 on adjacent drain regions 7 (source regions 9) are isolated from each other by the impurity region isolation region 11. Closer to the channel body 21, an end of the drain region 7 (source region 9), then an end of the selective epitaxial layer 145, and finally an end of the selective epitaxial layer 29 are aligned in order. The end of the selective epitaxial layer 145 is located beneath the sidewall 39. The layers for forming the source line SL and the bit line BL in the fourth embodiment are same as those in the first embodiment shown in FIG. 2A.

Method of Manufacturing Semiconductor Memory Device

A manufacturing method according to the fourth embodiment is described with reference to FIGS. 48–53. These figures are cross-sectional views (A1–A2 cross sections) of the SOI substrate and other portions showing this manufacturing method in order of process steps. First, the SOI substrate 19 is prepared such that the silicon layer 17 has a thickness of 20 nm and the silicon oxide layer 15 has a thickness of 150 nm. The device isolation region 3 (FIGS. 12 and 13) and the gate electrodes 25 are formed in a same manner as in the first embodiment. In the fourth embodiment the device isolation region 3 is designed taller than a laminate of the silicon layer 17 (an example of the first semiconductor layer), the selective epitaxial layer 145 (an example of the semiconductor intermediate layer) and the selective epitaxial layer 29 (an example of the second semiconductor layer).

Figure 48:
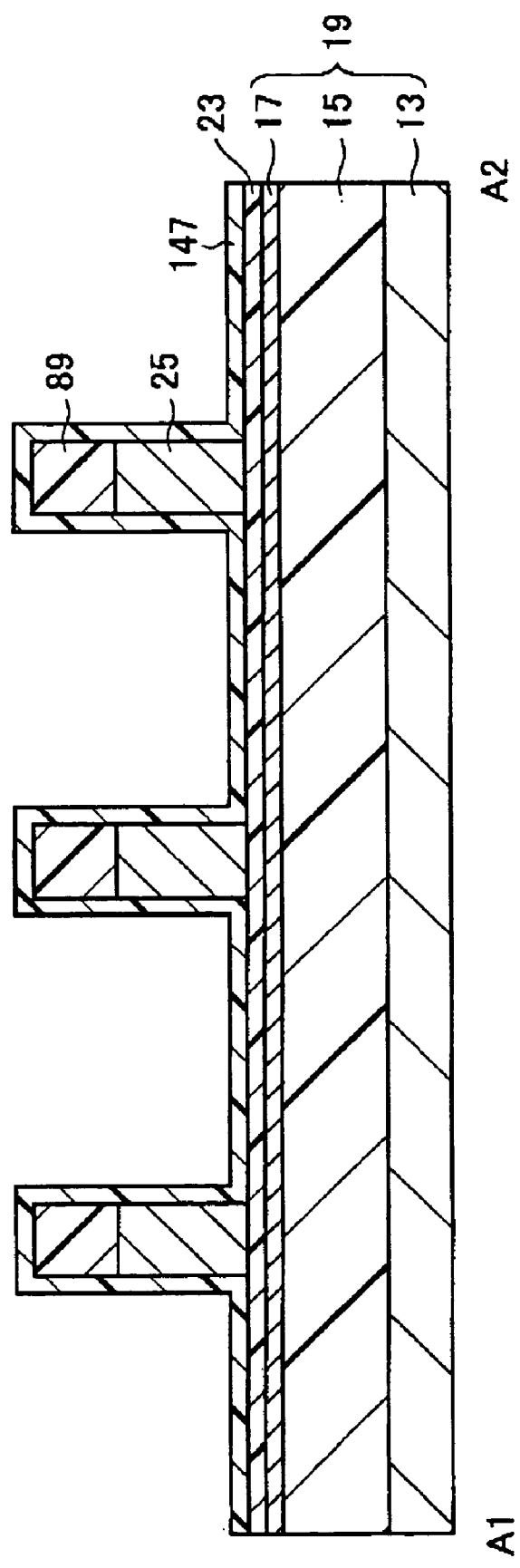
FIG. 48 is a process diagram of a first step in a method of manufacturing the semiconductor memory device according to the fourth embodiment.
Figure 49:
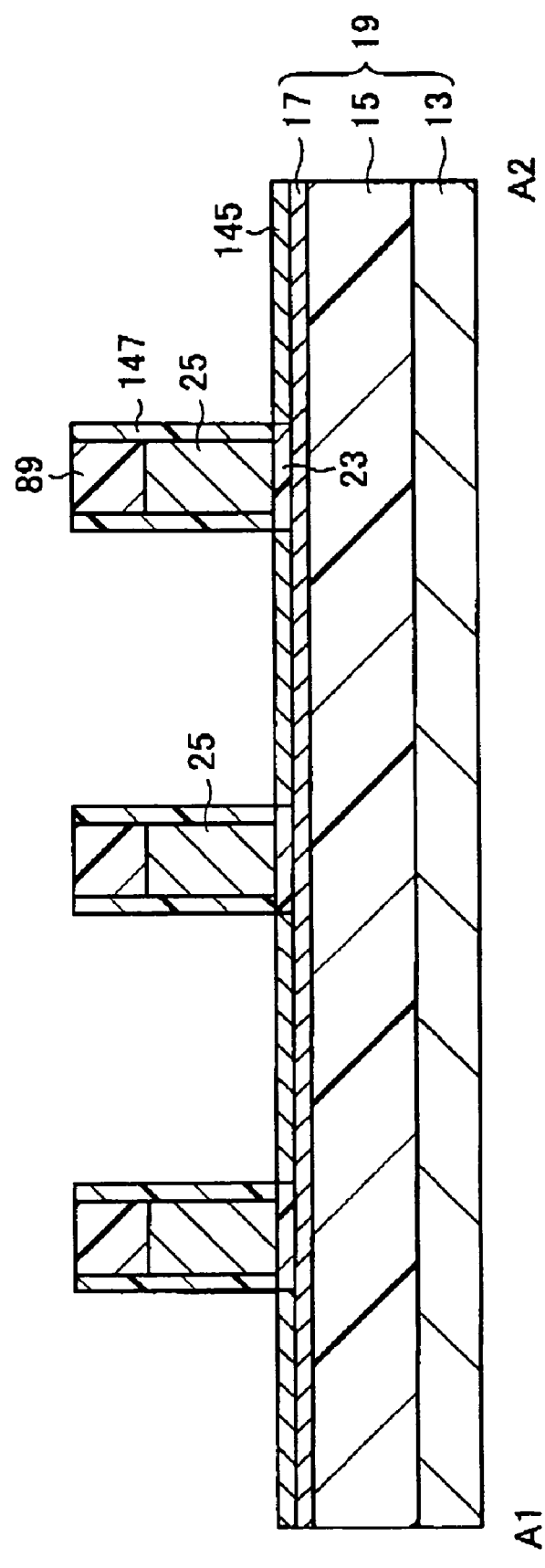
FIG. 49 is a process diagram of a second step in the method.

As shown in FIG. 48, CVD is applied to form a silicon nitride film 147 with a thickness of 10 nm over the SOI substrate 19 to cover the gate electrodes 25. The silicon nitride film 147 and the gate insulator film 23 are then subjected to an anisotropic etching such that the silicon layer 17 between the gate electrodes 25 exposes. Then, as shown in FIG. 49, selective epitaxial growth is applied to form the selective epitaxial layer 145 with a thickness of 40 nm on the silicon layer 17 between the gate electrodes 25. The condition for formation of the layer 145 is similar to that for the selective epitaxial layer 29 described in FIG. 19A.

Figure 50:
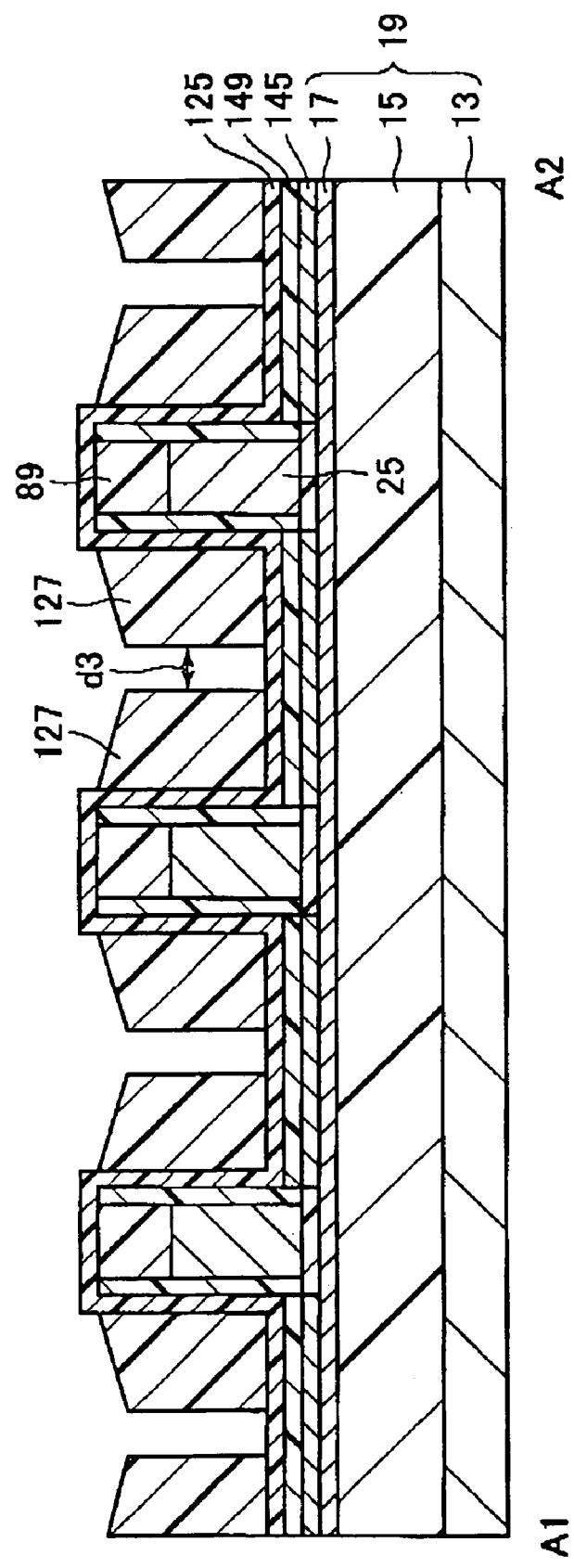
FIG. 50 is a process diagram of a third step in the method.

As shown in FIG. 50, the surface of the selective epitaxial layer 145 is thermally oxidized to form a silicon oxide film 149 with a thickness of 20 nm. As similarly shown in FIG. 33, the silicon nitride film 125 and the sidewall 127 (an example of the first sidewall) are formed. A thickness of the silicon nitride film 125 is equal to 20 nm, and a distance d3 between the sidewalls 127 is equal to 80 nm.

Figure 51:
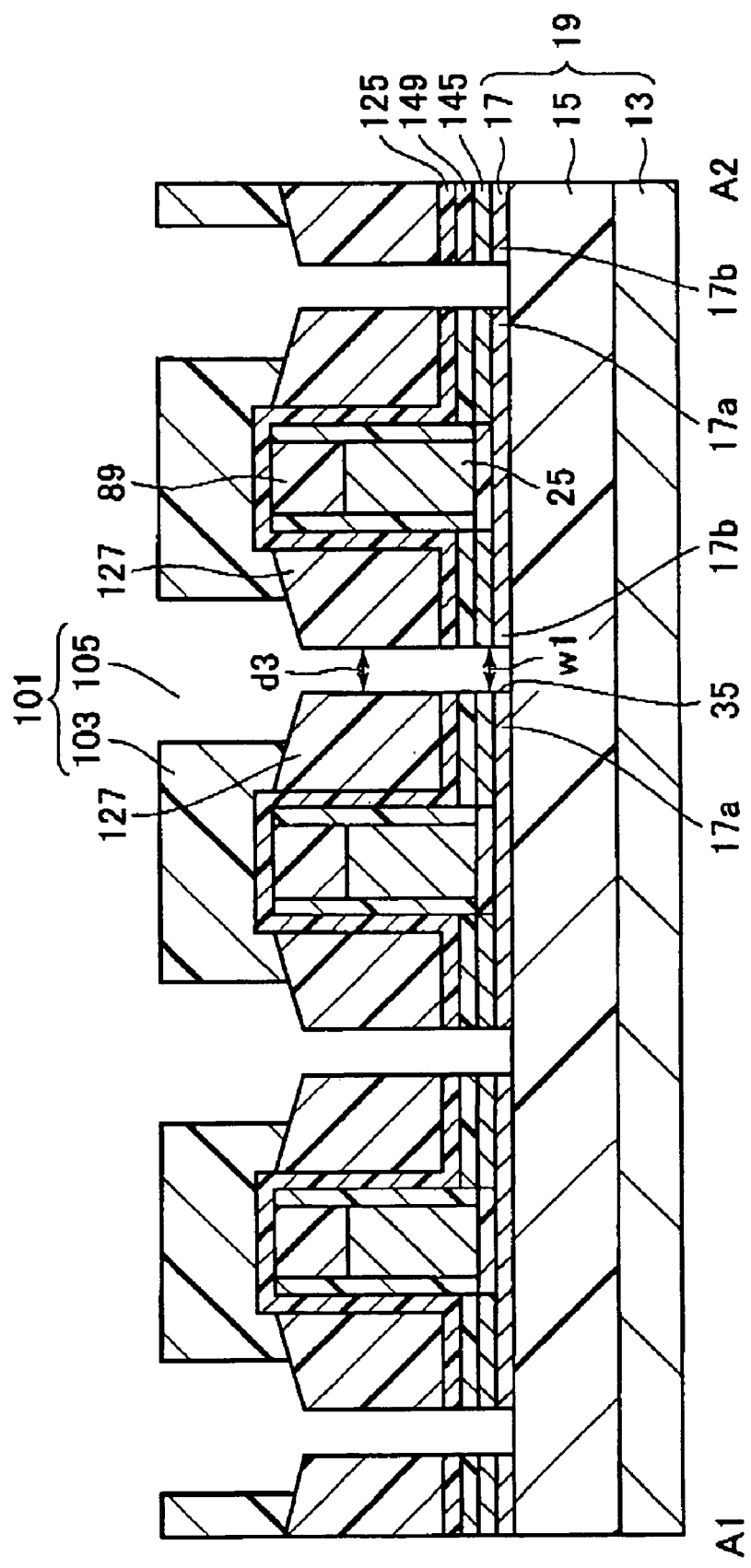
FIG. 51 is a process diagram of a fourth step in the method.

As shown in FIG. 51, the resist pattern 101 and the sidewall 127 of FIG. 34 are employed as a mask for etching the silicon nitride film 125 and the silicon oxide film 149 between the sidewalls 127 such that the surface of the selective epitaxial layer 145 exposes. The resist pattern 101 and the sidewall 127 are also employed as a mask for anisotropic etching the selective epitaxial layer 145 (an example of the semiconductor Intermediate layer) and the silicon layer 17 (an example of the first semiconductor layer) to form the trenches 35 previously described in FIG. 34. As the distance d3 is equal to 80 nm, the width of the trench 35 (the width w1 of the impurity region isolation region) is also equal to 80 nm. Then, the resist pattern 101 and the sidewall 127 are removed as similarly shown in FIG. 35.

Figure 52:
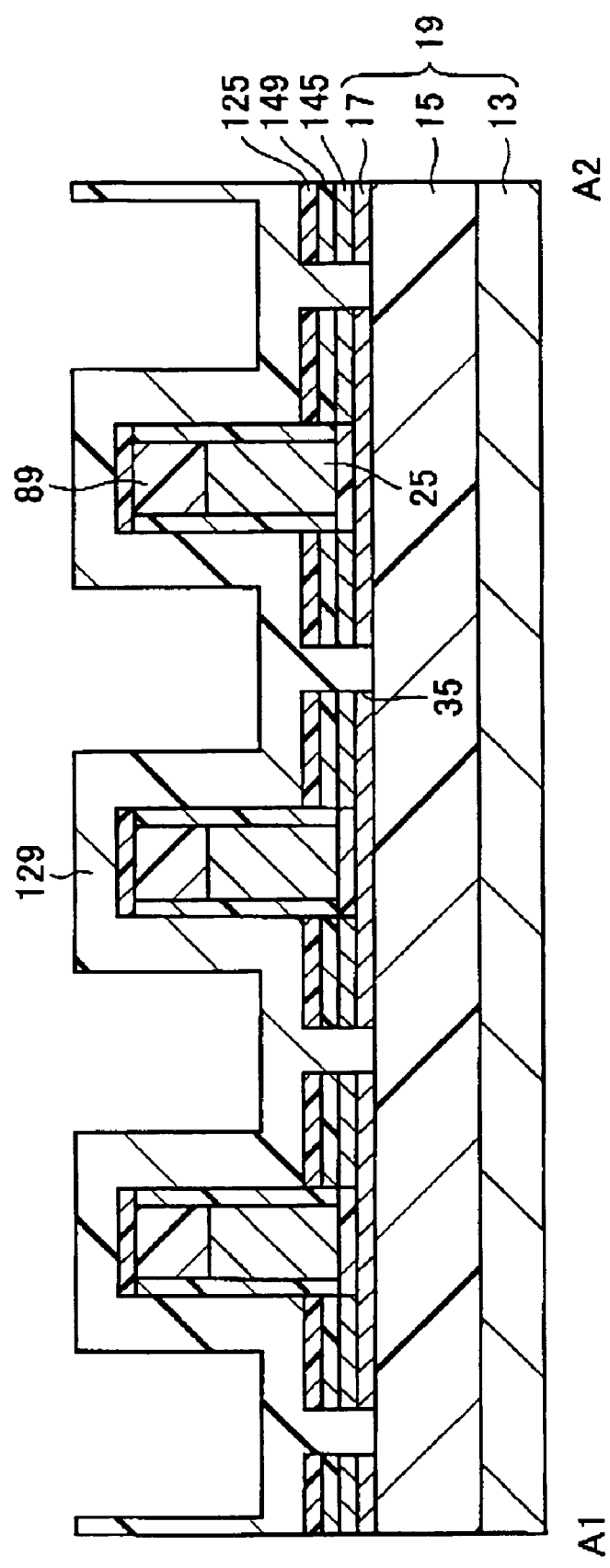
FIG. 52 is a process diagram of a fifth step in the method.
Figure 53:
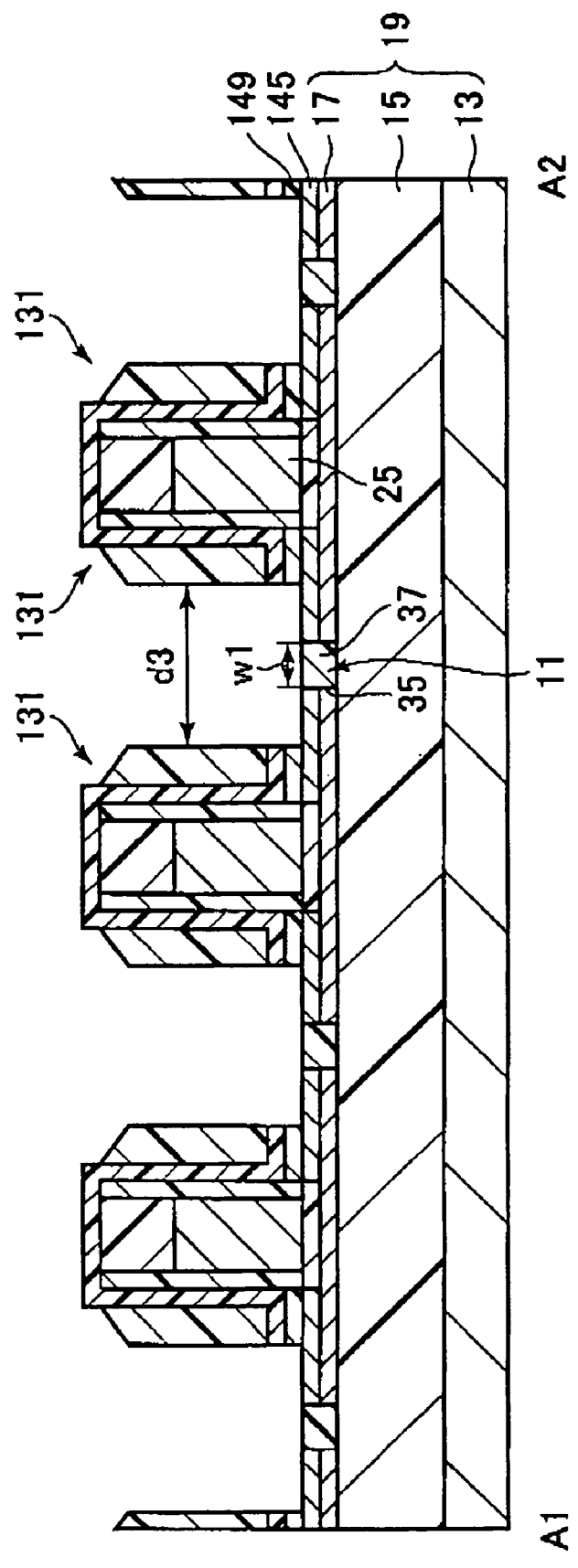
FIG. 53 is a process diagram of a sixth step in the method.

Subsequently, the steps of FIGS. 52 and 53 are performed. The step of FIG. 52 corresponds to FIG. 36, and the step of FIG. 53 to FIG. 37. In the fourth embodiment, however, the silicon nitride film 129 has a thickness of 60 nm. Subsequent steps are same as those shown in FIG. 38 and following figures.

Fifth Embodiment

Structure of Semiconductor Memory Device

Figure 54:
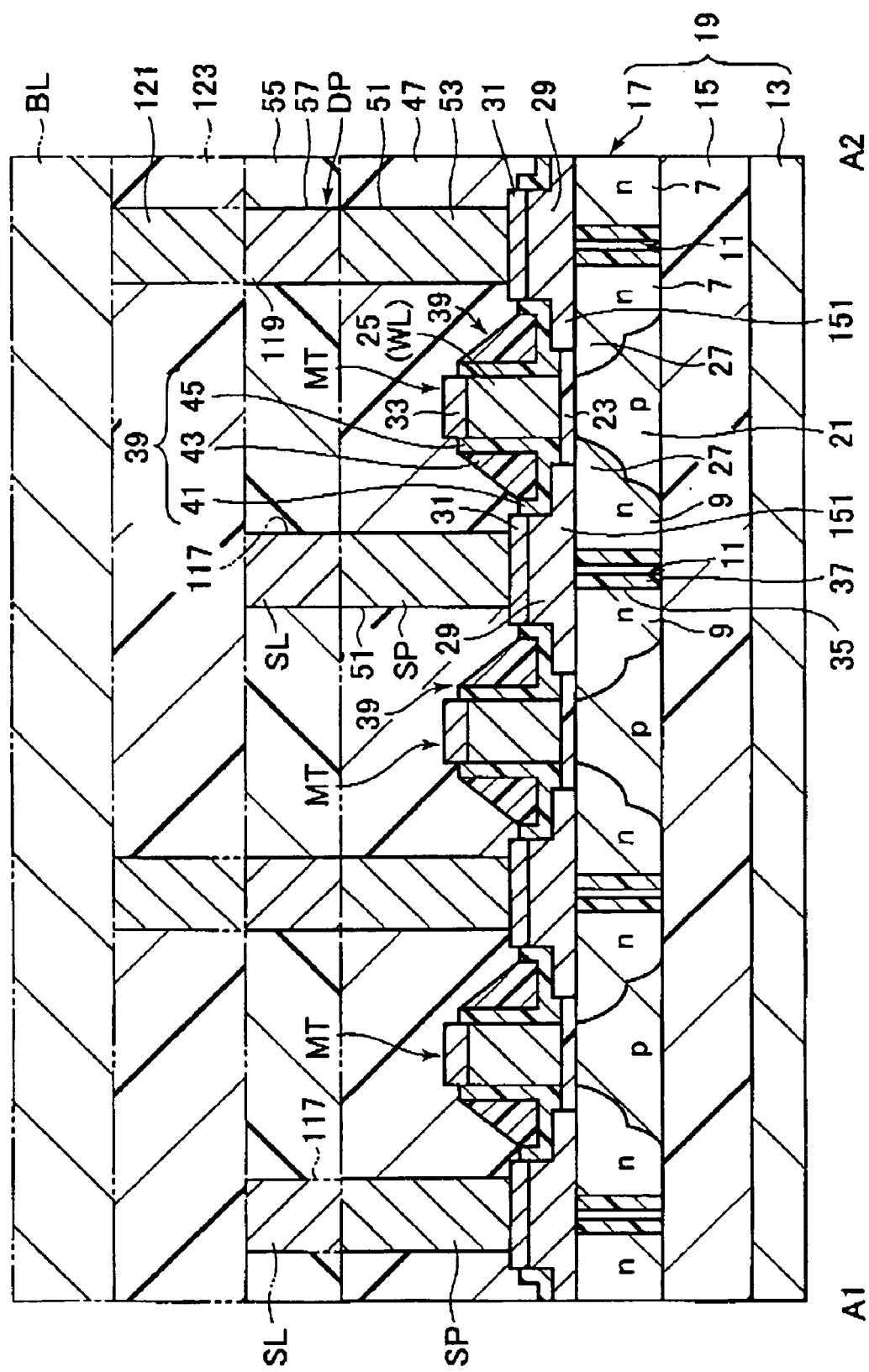
FIG. 54 is across-sectional view of a semiconductor memory device according to a fifth embodiment (A1–A2 cross section)

A structure of a semiconductor memory device according to a fifth embodiment is described with reference to FIG. 54. FIG. 54 is a cross-sectional view of the semiconductor memory device according to the fifth embodiment (A1–A2 cross section). This embodiment has a main characteristic in the selective epitaxial layer 29 (an example of the second semiconductor layer), which has an end 151 extending to beneath the sidewall 39. The number of interfaces in this embodiment is less by one compared to the second embodiment that is provided with two epitaxial layers as shown in FIG. 32. This is effective to improve the crystallinity and reduce the junction leakage current as well as the interface resistance.

In a structure of the impurity region isolation region 11 of the fifth embodiment, the insulator film 37 is formed on the side in the trench 35, and accordingly the trench 35 is not filled with the insulator film 37 fully. This structure is not intended but inevitably resulted from a manufacturing method according to the fifth embodiment to be described later. The impurity region isolation region 11 works even if the trench 35 is not filled with the insulator film 37. Other structures in the fifth embodiment are same as those in the second embodiment shown in FIG. 32.

Method of Manufacturing Semiconductor Memory Device

Similar to the fifth embodiment, the fourth embodiment shown In FIG. 47 also achieves such the structure, in which the end of the selective epitaxial layer 145 is located beneath the sidewall 39. In a word, the selective epitaxial layer in the fourth embodiment has a two-layered structure consisting of the layers 145 and 29. To achieve this structure, the fourth embodiment is required to perform the selective epitaxial step twice. To the contrary, the fifth embodiment is only required to perform the selective epitaxial step once, resulting In reduced production costs. The manufacturing method according to the fifth embodiment is described in detail below.

The manufacturing method according to the fifth embodiment is described with reference to FIGS. 55–64. These figures are cross-sectional views of the SOI substrate and other portions showing this manufacturing method in order of process steps. The manufacturing method according to the second embodiment is employed first to form the structure shown in FIG. 35.

Figure 55:
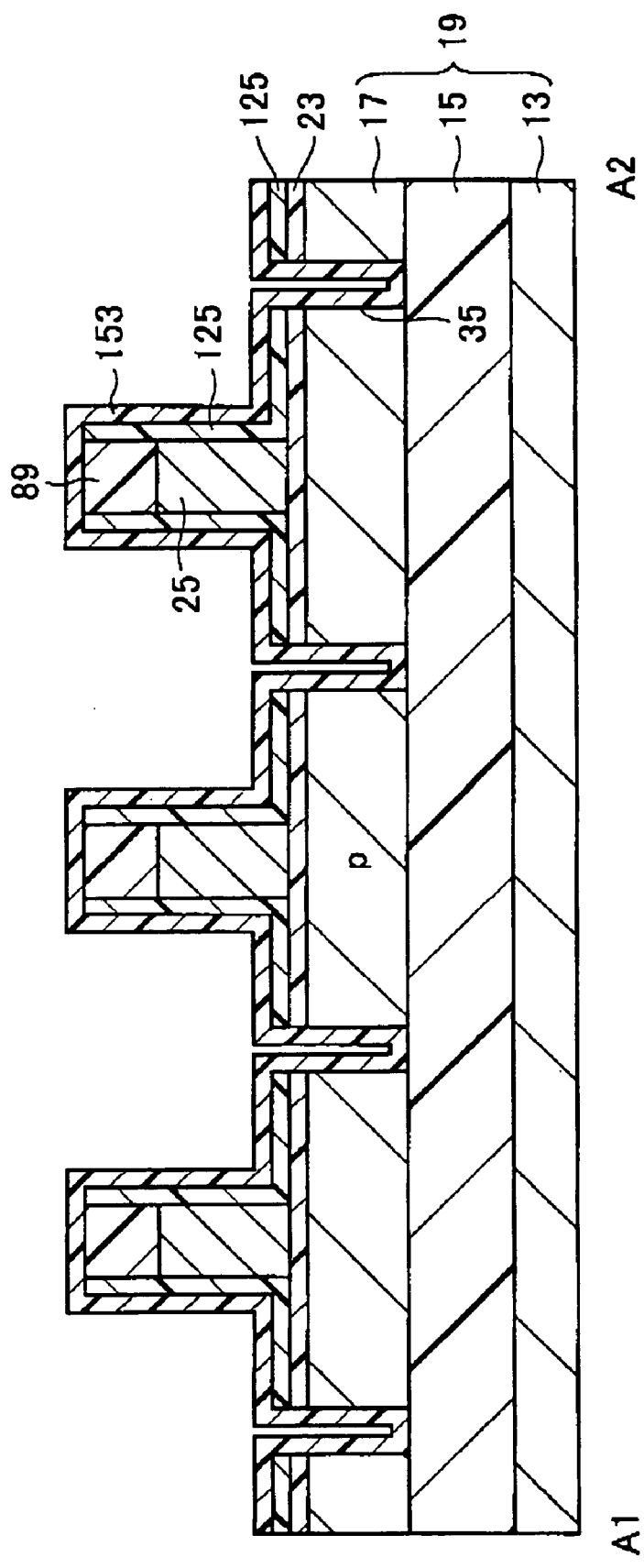
FIG. 55 is a process diagram of a first step in a method of manufacturing the semiconductor memory device according to the fifth embodiment (A1–A2 cross section)
Figure 56:
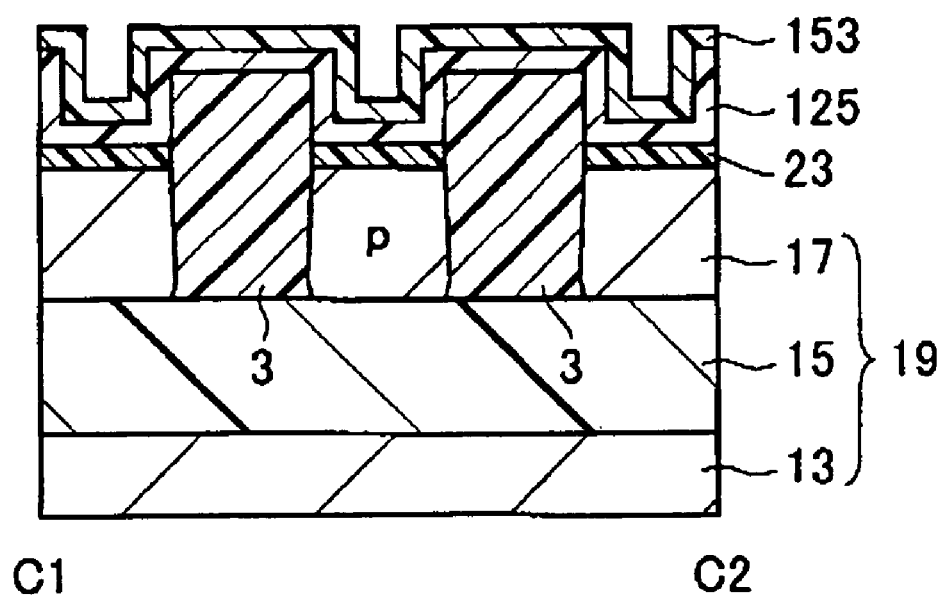
FIG. 56 is a process diagram of the first step in the method (C1–C2 cross section)

As shown in FIG. 55 (A1–A2 cross section) and FIG. 56 (C1–C2 cross section), CVD is applied to form a silicon nitride film 153 with a thickness of 5 nm over the SOI substrate 19. As a result, the silicon nitride film 153 is formed on the side in the trench 35 though the trench 35 is not filled with the silicon nitride film 153 entirely.

Figure 57:
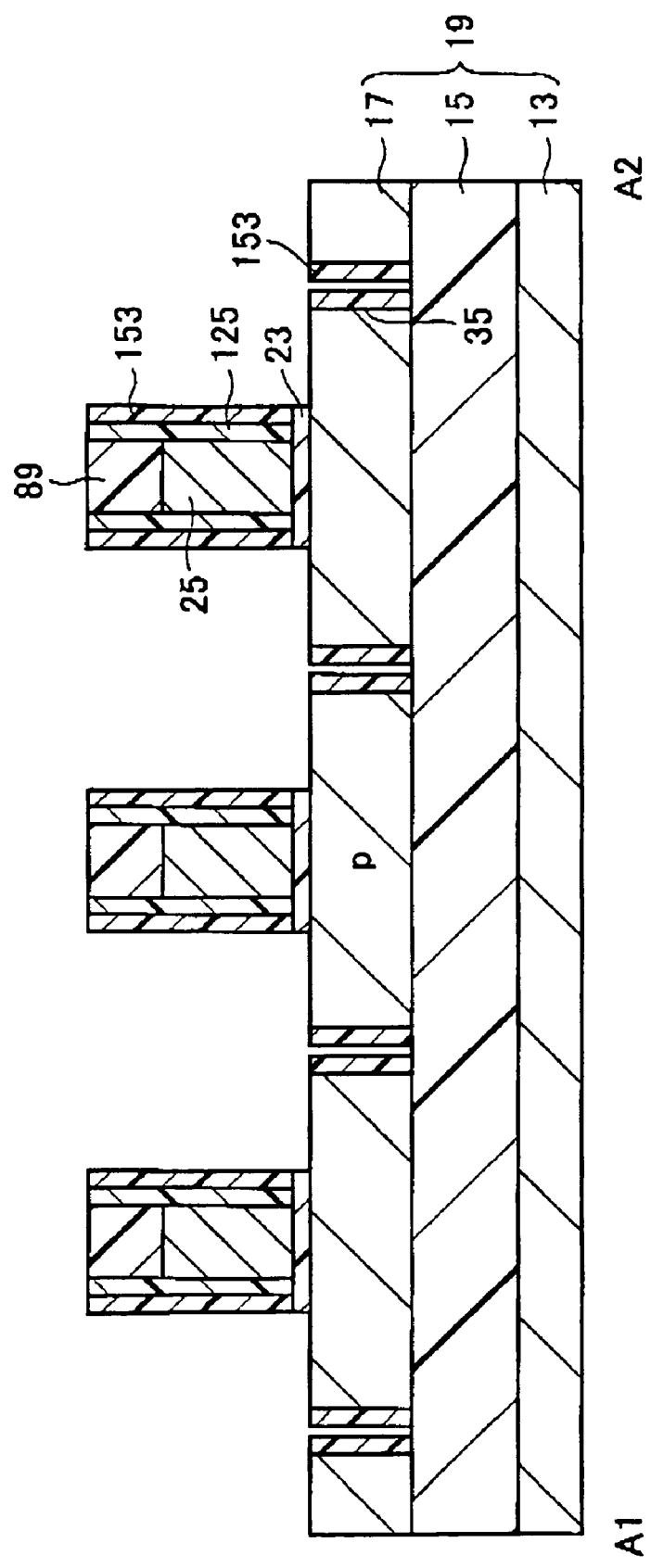
FIG. 57 is a process diagram of a second step in the method (A1–A2 cross section)
Figure 58:
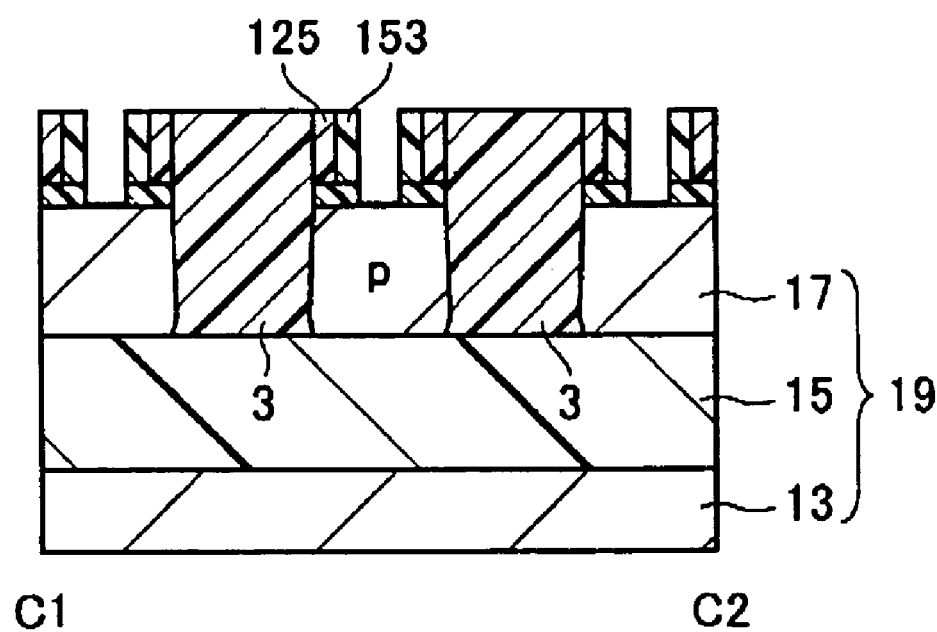
FIG. 58 is a process diagram of the second step in the method (C1–C2 cross section)

As shown in FIG. 57 (A1–A2 cross section) and FIG. 58 (C1–C2 cross section), the silicon nitride films 153 and 125 and the gate insulator film 23 are then subjected to an anisotropic etching. As a result, the silicon nitride films 153 and 125 remain on the sides of the gate electrode 25, the silicon nitride film 153 on the sides in the trench 35, and the silicon nitride films 153 and 125 on the sides of the device isolation region 3.

Figure 59:
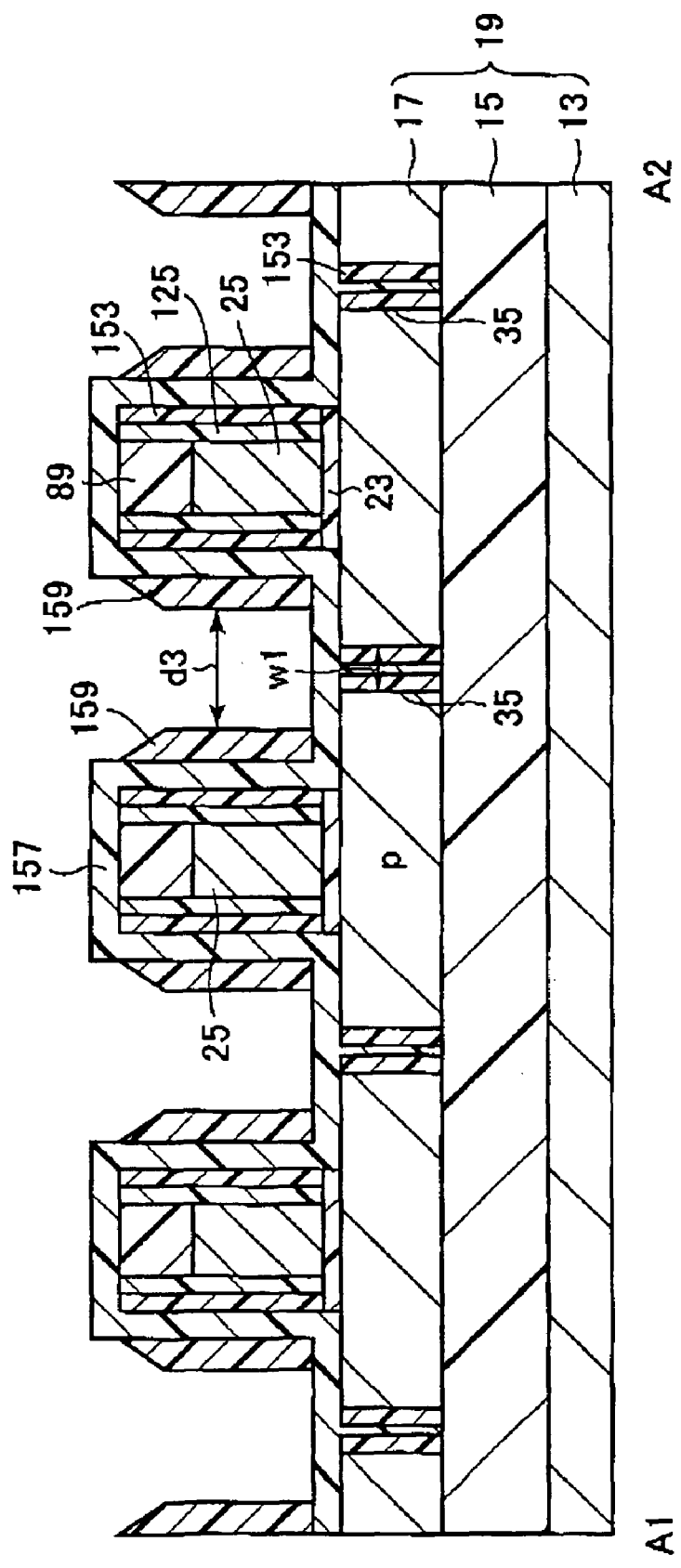
FIG. 59 is a process diagram of a third step in the method (A1–A2 cross section)
Figure 60:
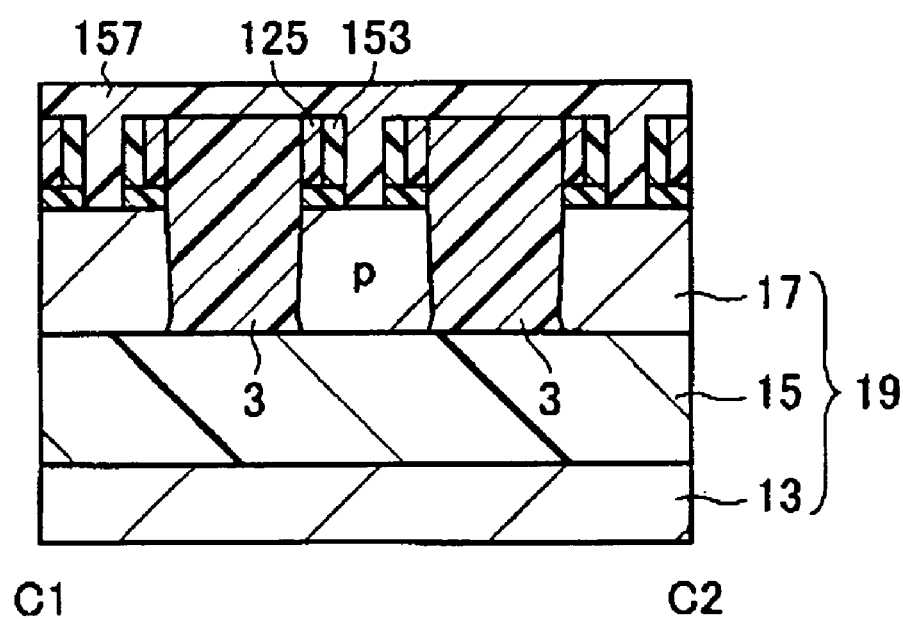
FIG. 60 is a process diagram of the third step in the method (C1–C2 cross section)

As shown in FIG. 59 (A1–A2 cross section) and FIG. 60 (C1–C2 cross section), CVD is applied to the structure after the silicon nitride films 125 and 153 (an example of the first insulator film) are formed on the sides of the gate electrode 25. As a result, a TEOS film 157 (an example of the second insulator film) with a thickness of 30 nm is formed over the silicon layer 17 to cover the gate electrodes 25. Then, CVD is applied to form a silicon nitride film with a thickness of 50 nm, which Is to be turned into a sidewall 159, on the TEOS film 157. The silicon nitride film is subjected to an anisotropic etching to form the sidewall 159 on the TEOS film 157. The sidewall 159 faces the side of the gate electrode 25 interposing the silicon nitride films 125 and 153 and the TEOS film 157 therebetween. In this case, the distance d3 between the sidewalls 159 (an example of the second sidewall) located between the gate electrodes 25 is controlled larger than the width of the trench 35 (the width w1 of the impurity region isolation region).

Figure 61:
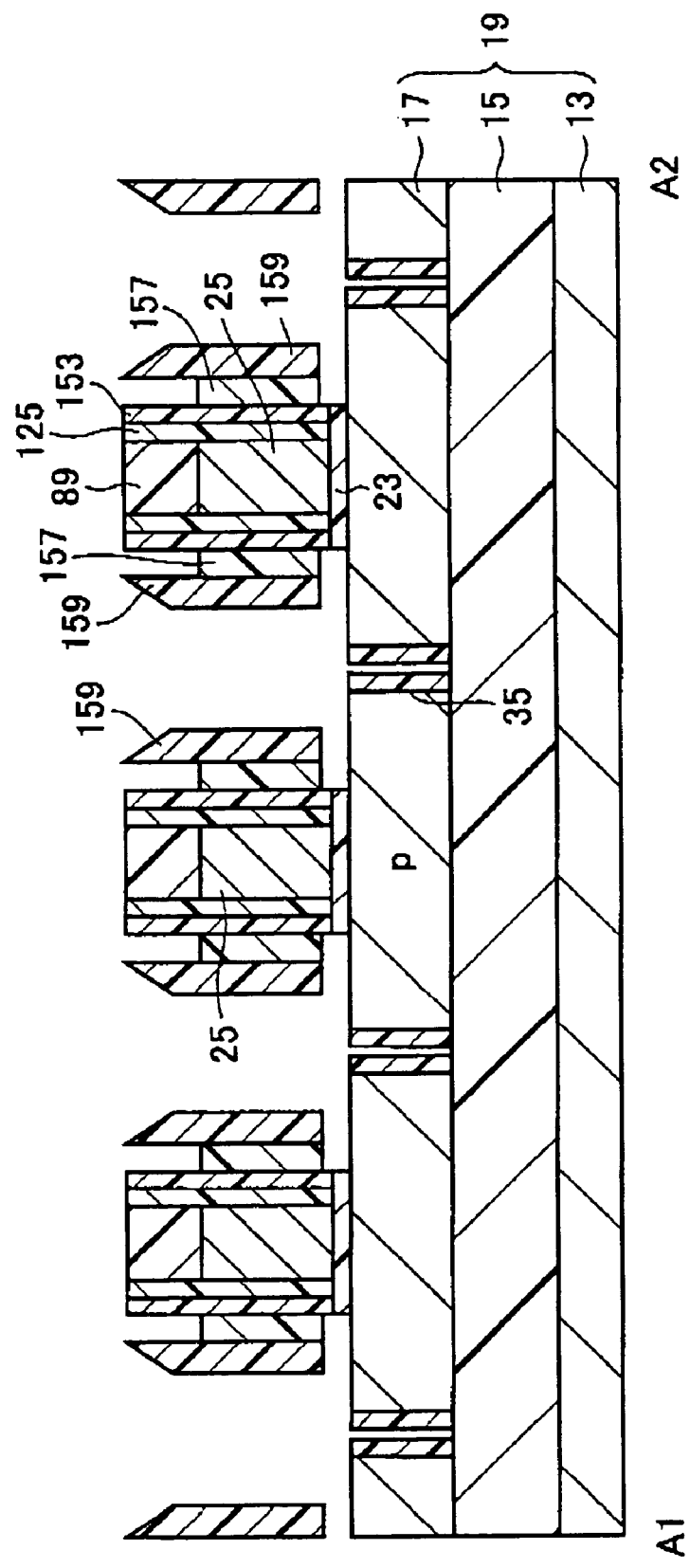
FIG. 61 is a process diagram of a fourth step in the method (A1–A2 cross section)
Figure 62:
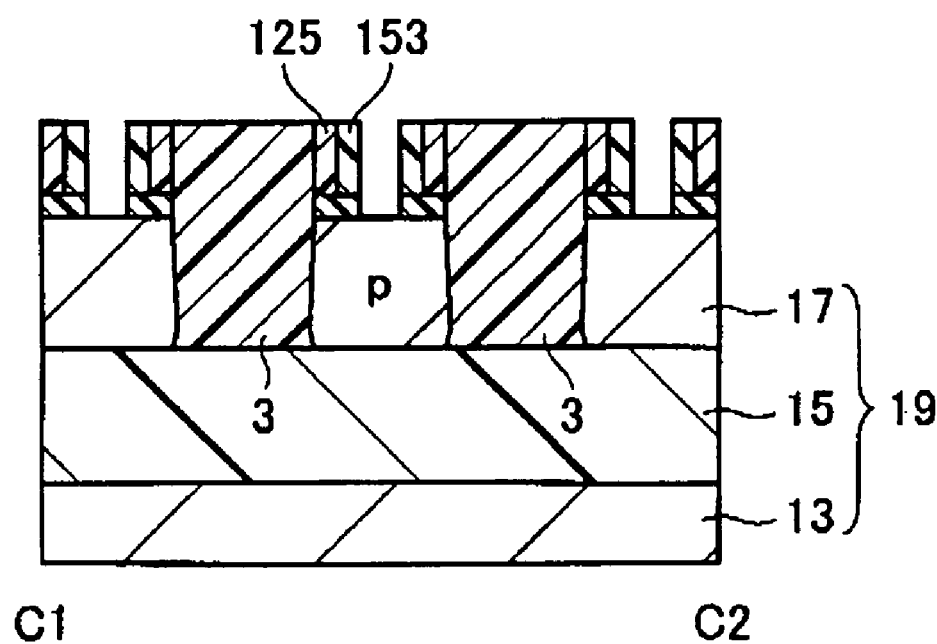
FIG. 62 is a process diagram of the fourth step in the method (C1–C2 cross section)

As shown in FIG. 61 (A1–A2 cross section) and FIG. 62 (C1–C2 cross section), a hydrofluoric acid is employed to etch off the TEOS film 157 to be left around the silicon nitride film 153 at the lower portion of the gate electrode 25.

As a result, the TEOS film 157 below the sidewall 159 is removed therefrom. The use of the hydrofluoric acid allows a larger etching rate to the TEOS film compared to a thermally oxidized film. This is effective to remove the TEOS film 157 while leaving the thermally oxidized gate insulator film 23.

This etching removes the TEOS film 157 in the trench 35 therefrom because it is also immersed into the hydrofluoric acid. When the etching of the TEOS film 157 reaches the silicon nitride film 153 at the lower portion of the gate electrode 25, the etching is terminated. Therefore, the TEOS film 157 located between the silicon nitride film 153 and the sidewall 159 remains in part.

Figure 63:
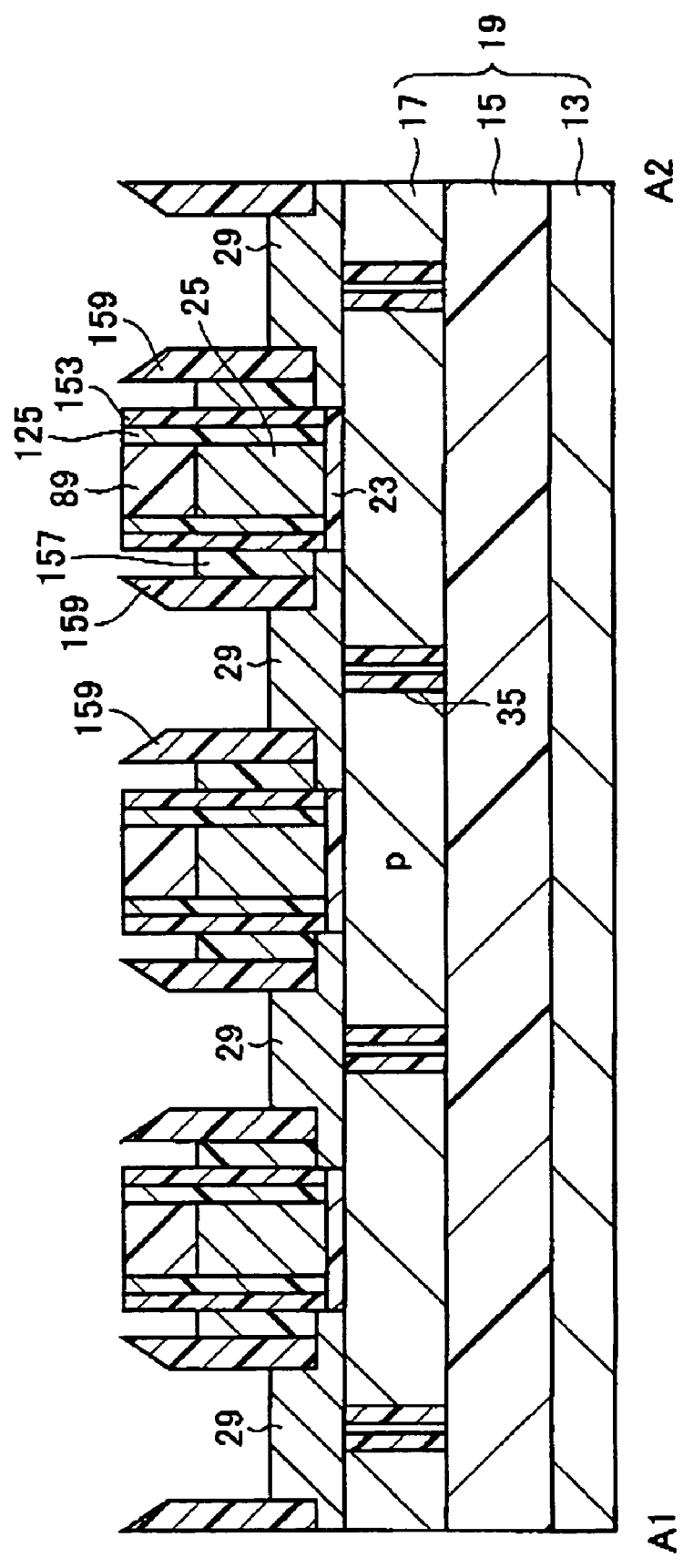
FIG. 63 is a process diagram of a fifth step in the method (A1–A2 cross section)
Figure 64:
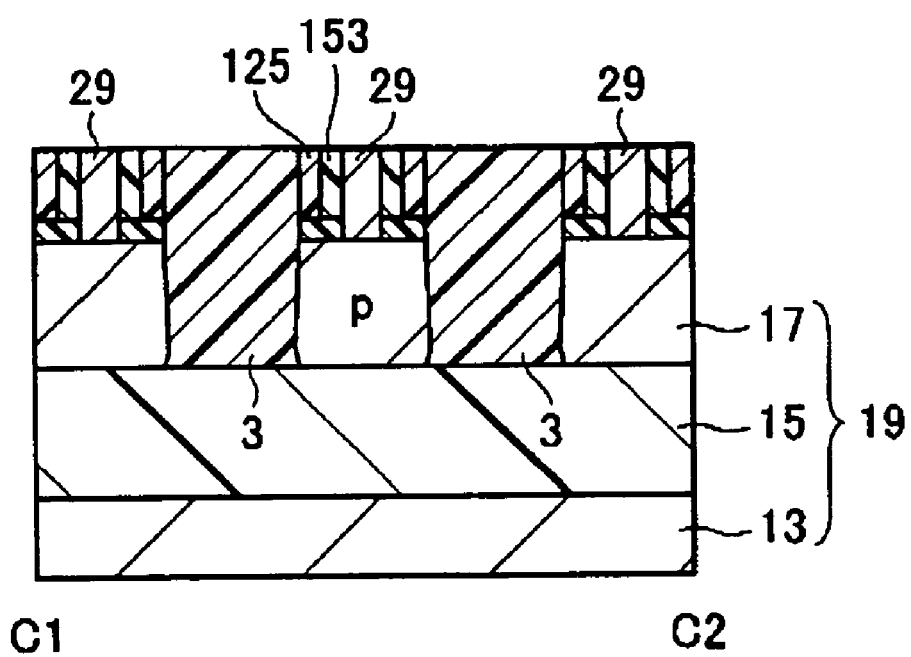
FIG. 64 is a process diagram of the fifth step in the method (C1–C2 cross section).

As shown in FIG. 63 (A1–A2 cross-section) and FIG. 64 (C1–C2 cross section), the selective epitaxial growth previously described in the first embodiment is applied to form the selective epitaxial layer 29 on the silicon layer 17 between the sidewalls 159. As a gap is formed between the sidewall 159 and TEOS film 157 and the silicon layer 17, the selective epitaxial layer 29 is also formed on the silicon layer 17 beneath the sidewall 159 and TEOS film 157.

As shown in FIG. 64, a thin sidewall of silicon nitride (silicon nitride films 125 and 153) stays on the side of the device isolation region 3. Therefore, it is possible to grow silicon along (in contact with) the sidewall of silicon nitride during the selective epitaxial step to form the selective epitaxial layer 29 having the flat top. As a result, a contact area between the selective epitaxial layer 29 and the silicide in the upper layer can be increased to lower the resistance therein.

After the formation of the selective epitaxial layer 29, the sidewalls 159, the TEOS film 157 and the silicon nitride films 89, 125 and 153 are removed like the step of FIG. 39 in the second embodiment. Subsequent steps are same as those shown in FIG. 39 and following figures in the second embodiment.

As described above, in the manufacturing method according to the fifth embodiment, the selective epitaxial layer 29 having a portion located between the sidewalls 39 and a portion located below the sidewall 39 (the end 151) as shown in FIG. 54 can be formed through a single process of selective epitaxial growth. This is effective to reduce the production cost.

If no impurity region isolation region 11 is formed, after the formation of the gate as shown in FIG. 14, the process may jump to the step of forming the silicon nitride film 153 of FIG. 55.

Thus, one aspect of the present invention provides a semiconductor memory device and method of manufacturing the same capable of down-sizing and preventing occurrences of data destruction. Another aspect of the present invention provides a semiconductor memory device and method of manufacturing the same capable of reducing parasitic resistances and variations thereof and elongating a data holding time.

What is claimed is:

1. A semiconductor memory device, comprising:
 a substrate;
 a first semiconductor layer of a first conduction type having a single crystalline structure isolated from said substrate by an insulator layer;
 a plurality of memory transistors, each having
  a gate electrode connected to a word line,
  a pair of impurity regions of a second conduction type serving as a drain region and a source region formed in said first semiconductor layer, and
  a channel body of said first conduction type formed in said first semiconductor layer between said impurity regions, said memory transistors being operative to store data as a state of majority carriers accumulated in said channel body:
 a plurality of device isolation regions formed to isolate memory transistors having gate electrodes commonly connected to the same word line from each other among said plurality of memory transistors; and
 a plurality of impurity region isolation regions formed to isolate adjacent drain regions from each other and adjacent source regions from each other, said impurity region isolation region having a smaller width than that of said device isolation region.

2. The semiconductor memory device according to claim 1, further comprising:
 a plurality of sidewalls each formed on a side of said gate electrode;
 a silicide formed on said impurity region and extended to the location of said sidewall; and
 a plurality of drain plugs each consisting only of a metallic material and connected to said drain region.

3. The semiconductor memory device according to claim 2, wherein said drain plug spans and commonly connects to adjacent drain regions.

4. The semiconductor memory device according to claim 1, further comprising:
 a plurality of sidewalls each formed on a side of said gate electrode; and
 a second semiconductor layer of said second conduction type formed in contact with and extended on said impurity region to the location of said sidewall.

5. The semiconductor memory device according to claim 4, therein said second semiconductor layer has a higher impurity concentration of said second conduction type than that of said impurity region.

6. The semiconductor memory device according to claim 1, further comprising:
 a plurality of sidewalls each formed on a side of said gate electrode;
 a second semiconductor layer of said second conduction type formed in contact with and extended on said impurity region to the location of said sidewall;
 a silicide formed on said second semiconductor layer; and
 a plurality of drain plugs each consisting only of a metallic material and connected to said silicide.

7. The semiconductor memory device according to claim 6, wherein on adjacent drain regions portions of said second semiconductor layer are continuous and portions of said silicide are continuous, and on adjacent source regions portions of said second semiconductor layer are continuous and portions of said silicide are continuous.

8. A semiconductor memory device, comprising:
 a substrate;
 a first semiconductor layer of a first conduction type having a single crystalline structure isolated from said substrate by an insulator layer;
 a plurality of memory transistors, each having
  a gate electrode connected to a word line,
  a pair of impurity regions of a second conduction type serving as a drain region and a source region formed in said first semiconductor layer, and
  a channel body of said first conduction type formed in said first semiconductor layer between said impurity regions, said memory transistors being operative to store data as a state of majority carriers accumulated in said channel body;

a plurality of sidewalls each formed on a side of said gate electrode; and a second semiconductor layer of said second conduction type formed in contact with and extended on said impurity region to the location of said sidewall.

9. The semiconductor memory device according to claim 8, further comprising a plurality of device isolation regions formed to isolate memory transistors having gate electrodes commonly connected to the same word line from each other among said plurality of memory transistors, wherein said device isolation region adjacent to said pair of impurity regions of said second conduction type has a larger height than that of said pair of impurity regions of said second conduction type.

10. The semiconductor memory device according to claim 8, further comprising a silicide formed on said second semiconductor layer.

11. The semiconductor memory device according to claim 8, further comprising:

a plurality of device isolation regions formed to isolate memory transistors having gate electrodes commonly connected to the same word line from each other among said plurality of memory transistors; and a silicide formed on and in contact with said second semiconductor layer and extended on said device isolation region.

12. The semiconductor memory device according to claim 8, further comprising:

a plurality of device isolation regions formed to isolate memory transistors having gate electrodes commonly connected to the same word line from each other among said plurality of memory transistors; and a silicide formed on said second semiconductor layer, wherein said second semiconductor layer extends on said device isolation region.

13. The semiconductor memory device according to claim 8, wherein said sidewall has a structure consisting of films of silicon nitride, silicon oxide and silicon nitride sandwiched between said second semiconductor layer and said gate electrode.

14. The semiconductor memory device according to claim 8, wherein said second semiconductor layer has an end extending to beneath said sidewall.

15. A method of manufacturing a semiconductor memory device including a plurality of memory transistors each for storing data as a state of majority carriers accumulated in a channel body sandwiched between a drain region and a source region, said method comprising:

forming a plurality of device isolation regions separately from each other in a first semiconductor layer of a first conduction type having a single crystalline structure isolated from a substrate by an insulator layer, said first semiconductor layer including said drain region, said source region and said channel body formed therein;

forming a gate insulator film in a region on said first semiconductor layer defined by said plurality of device isolation regions;

forming a plurality of word lines containing gate electrodes separately from each other on said gate insulator film as crossing said plurality of device isolation regions to arrange said plurality of memory transistors in matrix;

forming sidewalls on sides of said gate electrodes such that a distance between sidewalls located between said gate electrodes has a dimension smaller than a width of said device isolation region;

forming trenches each having a smaller width than said width of said device isolation region in said first semiconductor layer by self-alignment using said sidewall as a mask to selectively remove said first semiconductor layer such that one and the other region to be adjacent drain regions are isolated each other, and that one and the other region to be adjacent source regions are isolated each other; and forming bit lines connected to said drain regions formed in said first semiconductor layer and source lines connected to said source regions.

16. The method according to claim 15, instead of the step of forming sidewalls and the step of forming trenches, comprising:

forming first sidewalls on sides of said gate electrodes;

forming a second semiconductor layer on said first semiconductor layer between said gate electrodes by selective epitaxial growth after formation of said first sidewalls;

forming second sidewalls on said second semiconductor layer adjacent to said first sidewalls such that a distance between second sidewalls located between said gate electrodes has a dimension smaller than a width of said device isolation region; and forming trenches each having a smaller width than said width of said device isolation region in said second semiconductor layer and said first semiconductor layer by self-alignment using said second sidewall as a mask to selectively remove said second semiconductor layer and said first semiconductor layer such that one and the other region to be adjacent drain regions are isolated each other, and that one and the other region to be adjacent source regions are isolated each other.

17. The method according to claim 15, instead of the step of forming sidewalls and the step of forming trenches, comprising:

forming first sidewalls on sides of said gate electrodes such that a distance between first sidewalls located between said gate electrodes has a dimension smaller than a width of said device isolation region;

forming trenches each having a smaller width than said width of said device isolation region in said first semiconductor layer by self-alignment using said first sidewall as a mask to selectively remove said first semiconductor layer such that one and the other region to be adjacent drain regions are isolated each other, and that one and the other region to be adjacent source regions are isolated each other;

forming second sidewalls on sides of said gate electrodes such that a distance between second sidewalls located between said gate electrodes has a dimension larger than a width of said trench; and forming a second semiconductor layer on said first semiconductor layer between said gate electrodes by selective epitaxial growth after formation of said second sidewalls.

18. The method according to claim 17, wherein the step of forming said second semiconductor layer is provided after said trenches are filled with a silicon nitride.

19. A method of manufacturing a semiconductor memory device including a plurality of memory transistors each for storing data as a state of majority carriers accumulated in a channel body sandwiched between a drain region and a source region, said method comprising:

forming a plurality of device isolation regions separately from each other in a first semiconductor layer of a first conduction type having a single crystalline structure isolated from a substrate by an insulator layer, said first semiconductor layer including said drain region, said source region and said channel body formed therein;

forming a gate insulator film in a region on said first semiconductor layer defined by said plurality of device isolation regions;

forming a plurality of word lines containing gate electrodes separately from each other on said gate insulator film as crossing said plurality of device isolation regions to arrange said plurality of memory transistors in matrix;

forming sidewalls on sides of said gate electrodes;

forming a second semiconductor layer on said first semiconductor layer between said gate electrodes by selective epitaxial growth after formation of said sidewalls; and forming bit lines connected via said second semiconductor layer to said drain regions formed in said first semiconductor layer and source lines connected via said second semiconductor layer to said source regions formed in said first semiconductor layer.

20. The method according to claim 19, wherein the step of forming sidewalls includes:

forming a second insulator film over said first semiconductor layer to cover said gate electrode, said second insulator film composed of a different material from a first insulator film formed on a side of said gate electrode;

forming, on said second insulator film, said sidewall facing a side of said gate electrode via said first and second insulator films; and removing said second insulator from beneath said sidewalls, wherein the step of forming a second semiconductor layer is provided for forming said second semiconductor layer on said first semiconductor layer between said sidewalls and below said sidewalls by selective epitaxial growth.

* * * * *